United States Patent [19]
Distinti

[11] Patent Number: 5,519,396
[45] Date of Patent: May 21, 1996

[54] NETWORK SWAPPERS AND CIRCUITS CONSTRUCTED FROM SAME

[75] Inventor: Robert J. Distinti, Fairfield, Conn.

[73] Assignee: Intellectual Property Development Associates of Connecticut, Inc., Trumbull, Conn.

[21] Appl. No.: 353,913

[22] Filed: Dec. 12, 1994

Related U.S. Application Data

[63] Continuation of Ser. No. 45,815, Apr. 8, 1993, Pat. No. 5,404,143, which is a continuation-in-part of Ser. No. 714,246, Jun. 12, 1991, Pat. No. 5,202,687.

[51] Int. Cl.⁶ ................................................. H03M 1/72
[52] U.S. Cl. ............................................. 341/153; 341/146
[58] Field of Search ....................................... 341/144, 145, 341/153, 146

[56] References Cited

U.S. PATENT DOCUMENTS

| | | | |
|---|---|---|---|
| 3,161,868 | 12/1964 | Waldhauer | 341/127 |
| 3,183,342 | 5/1965 | Wortzman | 341/153 |
| 3,187,325 | 6/1965 | Waldhauer | 341/162 |
| 3,403,393 | 9/1968 | Skrenes | 341/127 |
| 3,508,249 | 4/1970 | Gordon | 341/127 |
| 3,577,139 | 5/1971 | Forester | 341/162 |
| 3,705,359 | 12/1972 | Kappes | 341/153 |
| 3,968,486 | 7/1976 | Gerdes | 341/161 |
| 4,072,938 | 2/1978 | Buchanan | 341/172 |
| 4,275,386 | 6/1981 | Michel et al. | 341/159 |
| 4,325,054 | 4/1982 | van de Plassche | 327/132 |
| 4,375,059 | 2/1983 | Schlig | 341/162 |
| 4,599,602 | 7/1986 | Matzuzawa et al. | 341/161 |
| 4,611,196 | 9/1986 | Fernandez | 341/158 |
| 4,684,924 | 8/1987 | Wood | 341/122 |
| 4,745,394 | 5/1988 | Cornett | 341/118 |
| 4,769,628 | 9/1988 | Hellerman | 341/162 |
| 4,833,472 | 5/1989 | Hannappel et al. | 341/142 |
| 4,888,589 | 12/1989 | Bowers | 341/153 |
| 4,978,959 | 12/1990 | Chong et al. | 341/161 |
| 4,994,808 | 2/1991 | Wichelman | 341/161 |
| 5,061,927 | 10/1991 | Linnenbrink et al. | 341/138 |
| 5,107,146 | 4/1992 | El-Ayat | 307/465 |
| 5,159,342 | 10/1992 | Yotsuyanagi | 341/161 |
| 5,202,687 | 4/1993 | Distinti | 341/158 |
| 5,307,065 | 4/1994 | Tokuhiro | 341/153 |
| 5,404,143 | 4/1995 | Distinti | 341/158 |

FOREIGN PATENT DOCUMENTS

| | | |
|---|---|---|
| 0042350 | 12/1981 | European Pat. Off. . |
| 0208437A3 | 1/1987 | European Pat. Off. . |

OTHER PUBLICATIONS

Dallas Semiconductor Product Brochure—DS1267, pp. 10-102–10-109 (1991/1992).
Dallas Semiconductor Product Brochure—DS1666, DS1666S, pp. 10-168–172 (1991/1992).
Dallas Semiconductor Product Brochure—DS1667, pp. 10-173–10-182 (1991/1992).
Dallas Semiconductor Product Brochure—DS1668, DS1669, DS1669S, pp. 10-183–10-190 (1991/1992).
Analog Devices, Inc., "Analog–Digital Conversion Handbook" (Analog Devices, Inc., Norwood, Mass., 1986), p. 199.

*Primary Examiner*—Marc S. Hoff

[57] ABSTRACT

An n-bit analog processing circuit constructed with network swappers has n stages and an input port for inputting an analog signal to be processed. Each of the n stages includes first and second reference input ports, at least one swappable network having first and second terminals, and a switching element that is responsive to a digital input signal for varying a connectivity of the first and second terminals with respect to the first and second reference input ports. Each of the n networks has a primary electrical characteristic that is binarily weighted with respect to others of the networks. The primary electrical characteristic may be resistance, capacitance, capacitive reactance, inductance, inductive reactance, voltage potential, gain, transconductance, superconductance, time delay, permeability, electrical or optical conductor length, and/or winding turns. A characteristic of an analog signal appearing at an output port is a function of an analog signal applied between the first and second reference input ports of a most significant stage, and is also a function of an n-bit digital signal (binary or Gray code) that is applied to the n-stages.

4 Claims, 34 Drawing Sheets

$R_T$ IS A TERMINATING RESISTOR

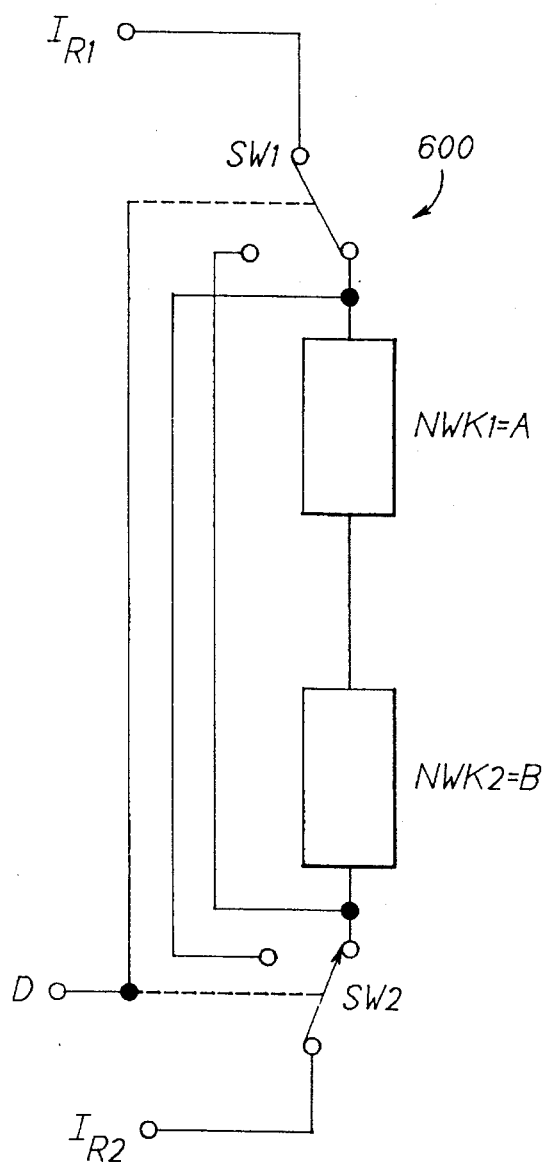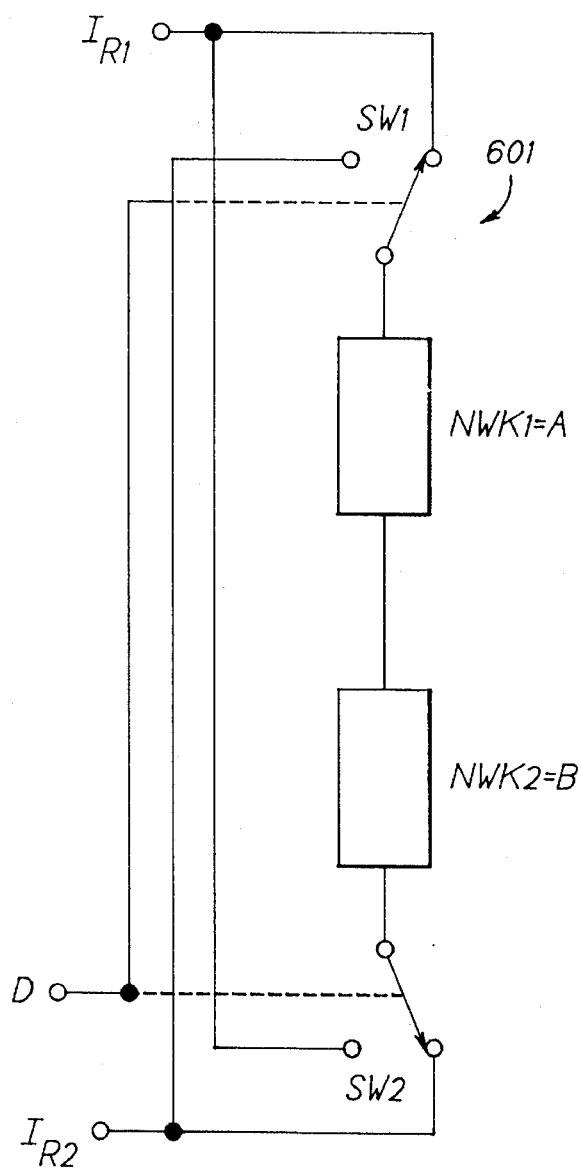

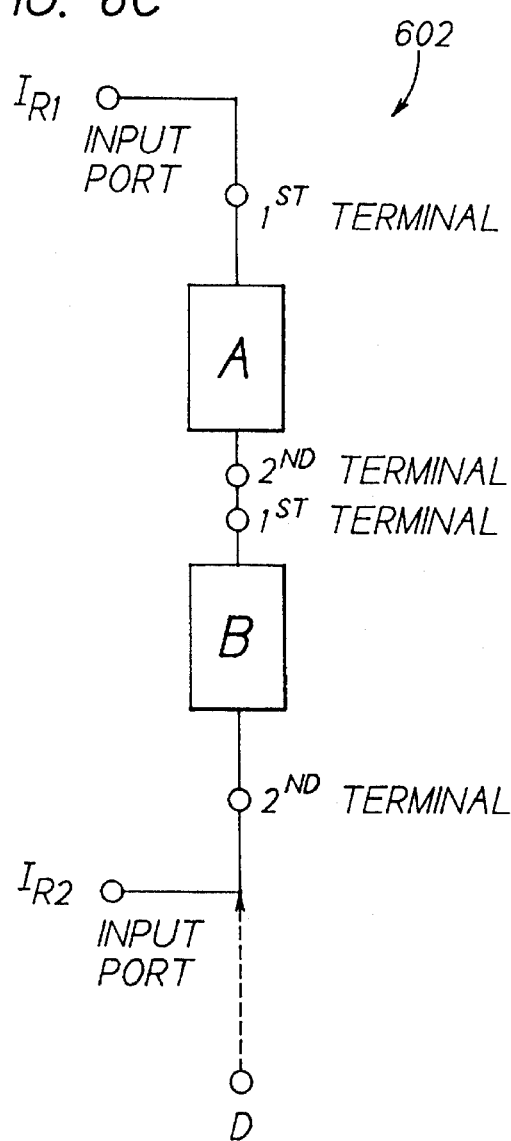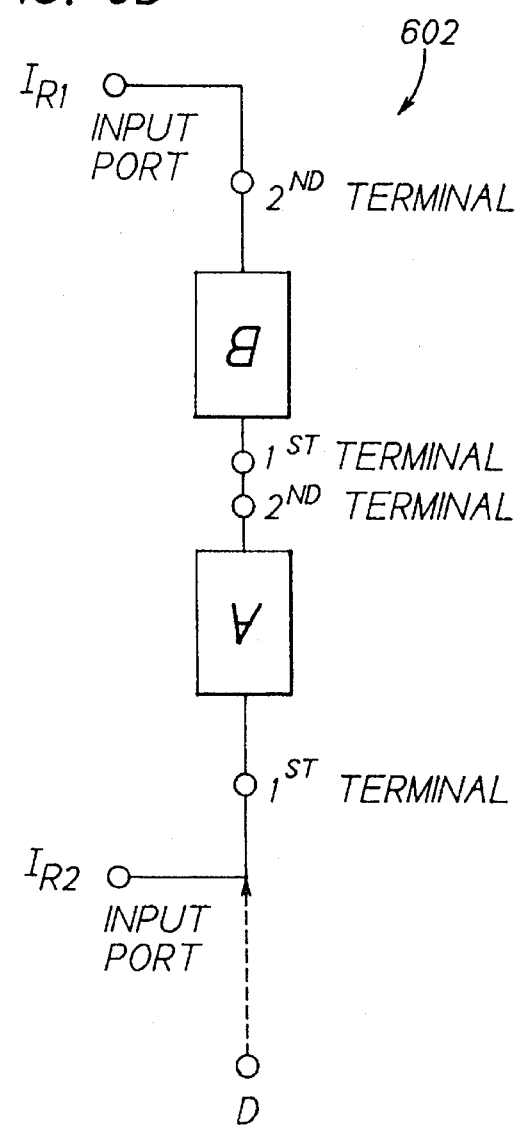

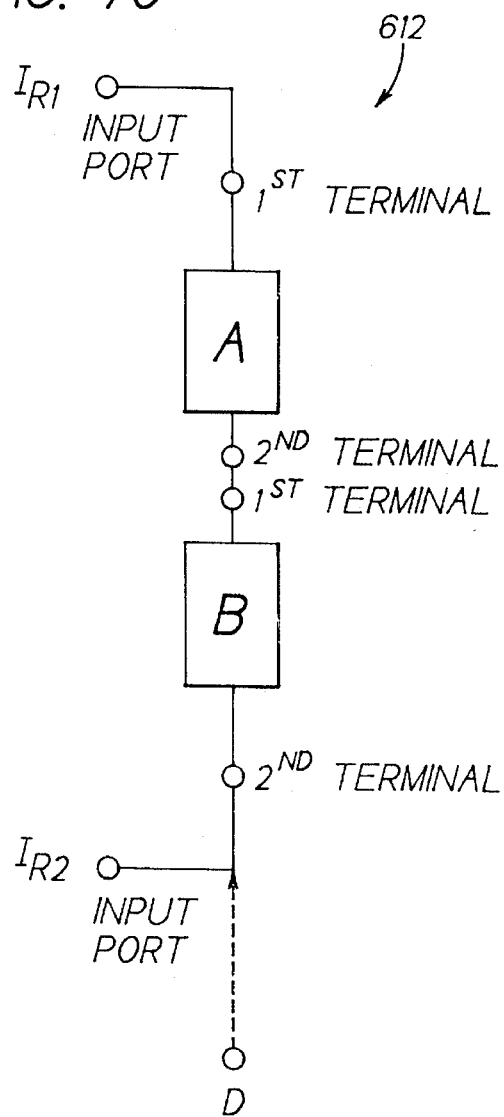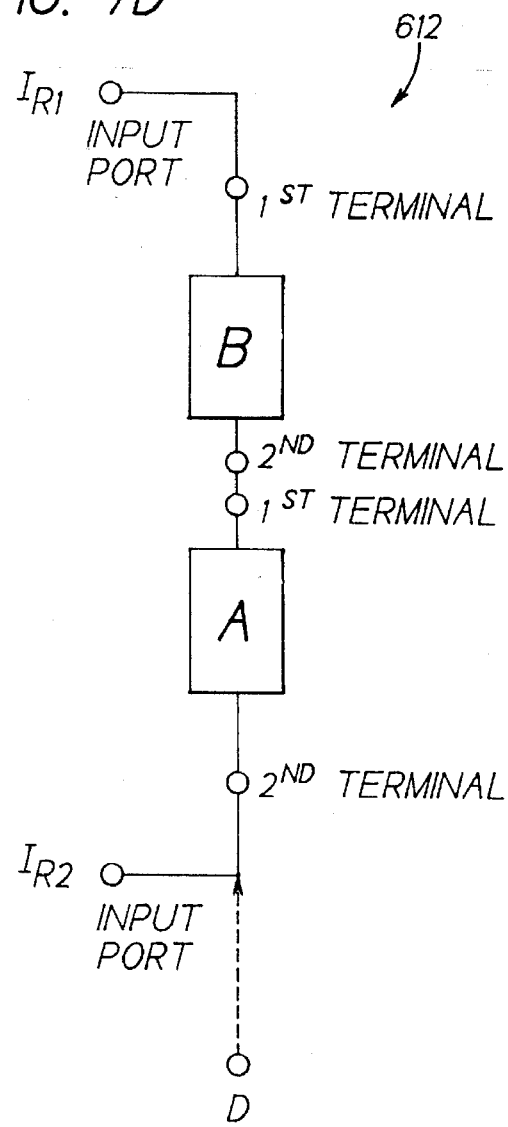

$0000_{GRAY} = 0_{DECIMAL}$ $1000_{GRAY} = 15_{DECIMAL}$ $1111_{GRAY} = 10_{DECIMAL}$

FIG. 10D
3-BIT GRAY DAC
| DECIMAL | GRAY MSB LSB |
|---------|--------------|
| 0 | 000 |
| 1 | 001 |
| 2 | 011 |
| 3 | 010 |
| 4 | 110 |
| 5 | 111 |
| 6 | 101 |
| 7 | 100 |
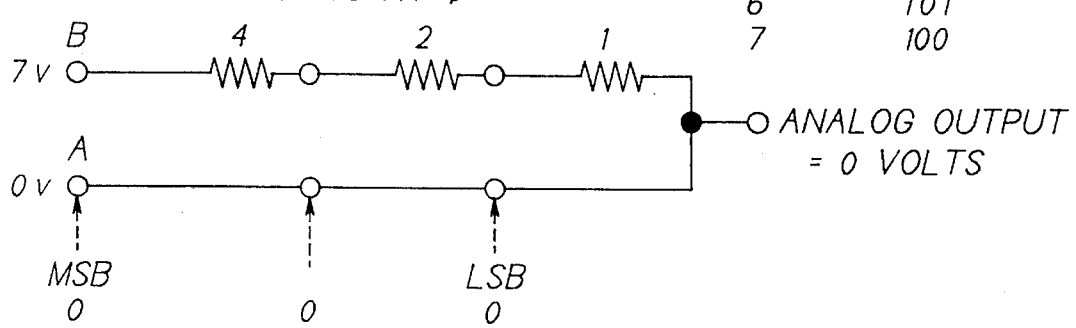
ALL DIGITAL INPUTS AT 0
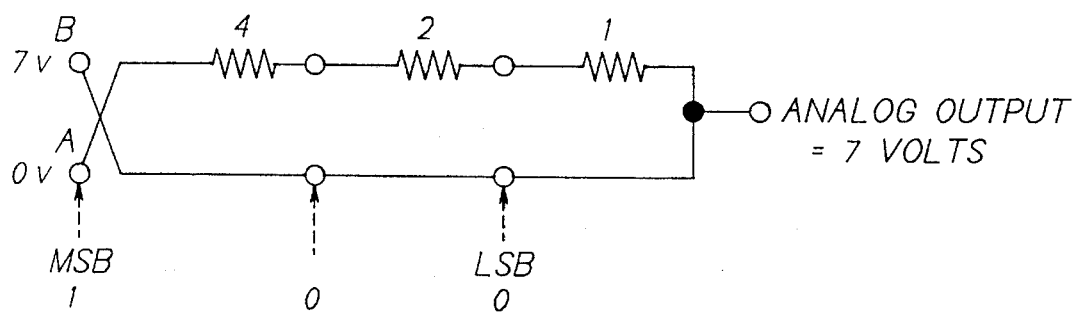
DIGITAL INPUTS AT GRAY 7
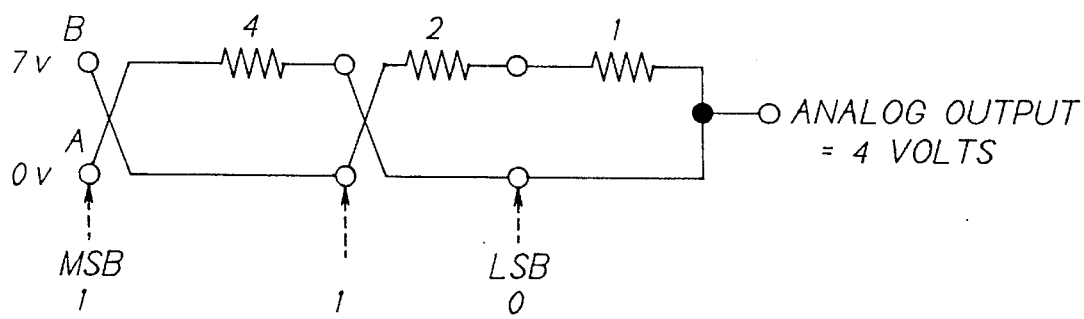
DIGITAL INPUTS AT GRAY 4
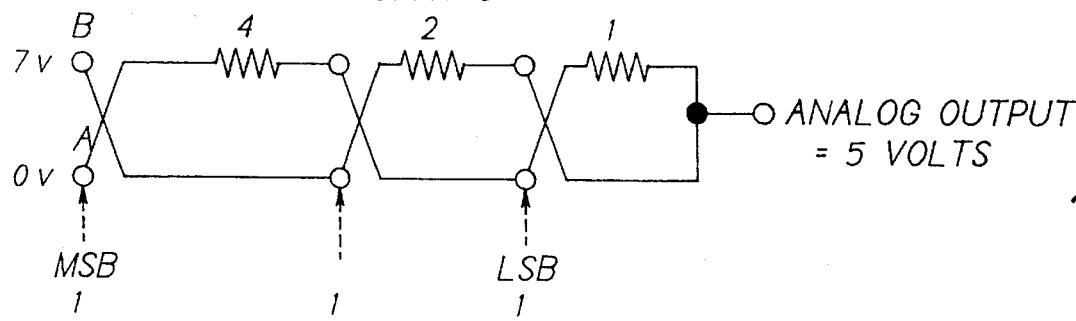
DIGITAL INPUTS AT GRAY 5

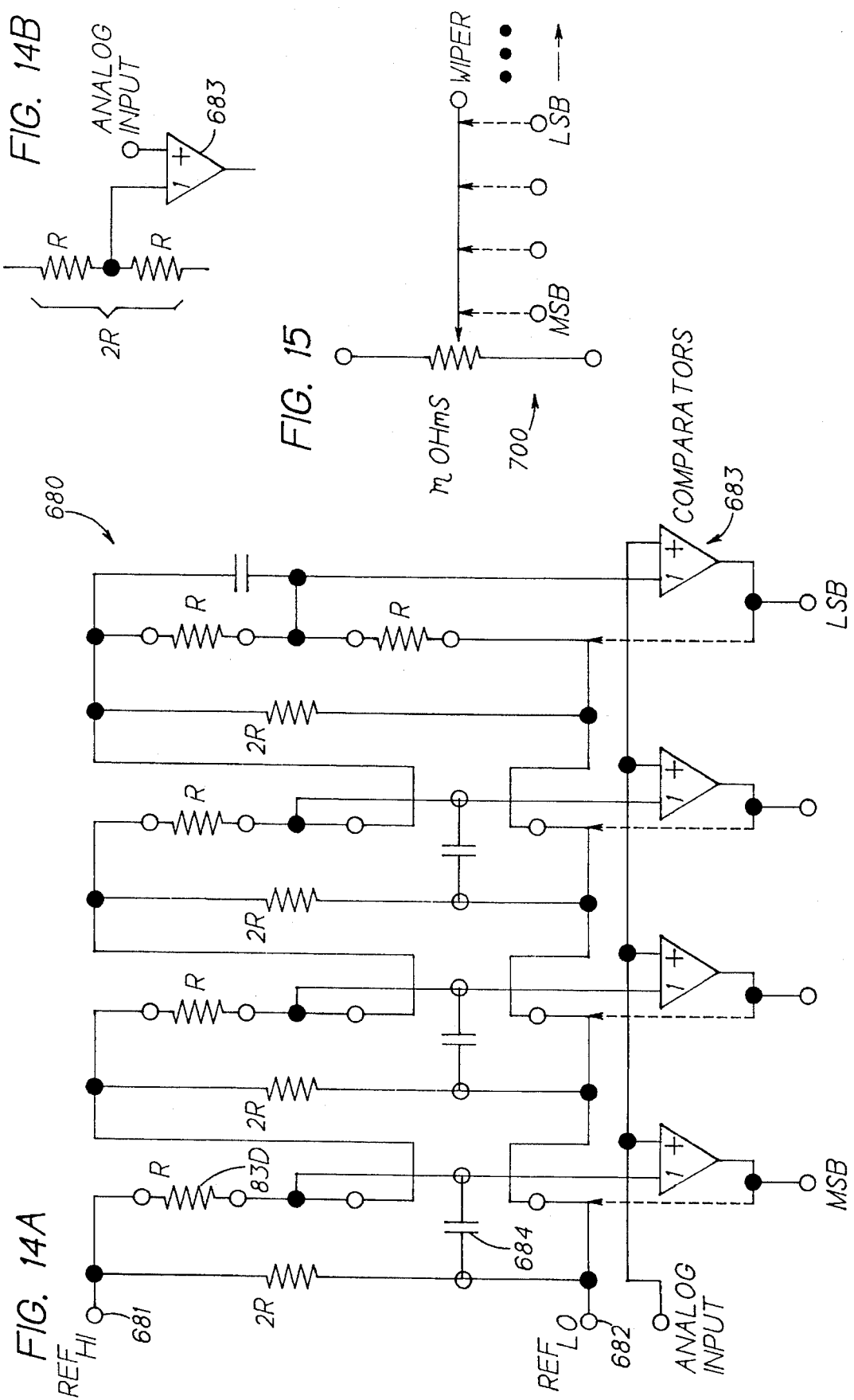

NETWORK SWAPPERS AND CIRCUITS CONSTRUCTED FROM SAME

CROSS-REFERENCE TO A RELATED PATENT APPLICATION

This is a continuation of application Ser. No. 08/045,815 filed on Apr. 8, 1993, now U.S. Pat. No. 5,404,143, which is a continuation-in-part of U.S. patent application Ser. No. 07/714,246, filed Jun. 12, 1991, now U.S. Pat. No. 5,202,687, issued Apr. 13, 1993.

This patent application is a continuation-in-part of U.S. patent application Ser. No.: 07/714,246, filed Jun. 12, 1991, entitled "Analog to Digital Converter" by Robert J. Distinti, now U.S. Pat. No. 5,202,687, issued Apr. 13, 1993, the disclosure of which is incorporated by reference herein in its entirety.

FIELD OF THE INVENTION

This invention relates generally to analog processing circuitry and, in particular, to analog processing circuitry that is digitally controllable.

BACKGROUND OF THE INVENTION

An asynchronous successive approximation analog to digital converter is shown in U.S. Pat. No. 4,769,628. This analog to digital converter uses a switched voltage divider to generate a reference voltage. The reference voltage generated by the voltage divider is first buffered by an opamp before being passed to a subsequent stage or a comparator. However, this technique can present several problems.

First, when the switches are switching, the input to the opamp will float. A floating input to an opamp causes the output to drive toward saturation. Thus, a delay is required after the switches settle to allow the opamp to recover. After the opamp has settled, time must also be allowed for the comparator to settle, afterwhich the switches of a subsequent stage will take time to react to the comparator. A second problem is presented by the errors introduced by the opamps in that the input offsets of the opamps will cumulate down to the last bit. These input offsets are further aggravated by temperature instabilities associated with opamps. Thirdly, noise existing in the opamp power supplies is coupled into the reference voltages. This noise problem is compounded by the fact that an opamp that drives toward saturation and then subsequently recovers will generate transients at its power supply terminals. These transients can couple to other opamps connected to the same power supply terminals.

In U.S. Pat. No. 4,769,628 the floating opamp problem, and the resulting transient problem, are addressed by employing the embodiment shown in FIG. 3. However, this solution addresses these problems at the expense of accuracy, speed, cost and space.

SUMMARY OF THE INVENTION

It is an object of this invention to provide an improved analog to digital converter that overcomes the problems found in the prior art.

It is another object of this invention to define the technology and symbology of network swapping.

It is another object of this invention to provide circuits to achieve network swapping.

It is another object of this invention to provide an improved digitally controlled potentiometer.

It is another object of this invention to provide an improved digitally controlled attenuator.

It is another object of this invention to provide a capacitance reactometer that is constructed with swapped networks.

It is another object of this invention to provide an inductance reactometer that is constructed with swapped networks.

It is another object of this invention to provide a digitally controlled analog delay that is constructed with swapped networks.

It is a further object of this invention to provide a transformer having a digitally controllable center tap that is constructed with swapped networks.

The foregoing problems are overcome and the objects of the invention are realized by embodiments of network swappers that are employed to construct a number of useful circuits.

One embodiment of this invention provides an n-bit analog processing circuit having n stages and an input port for inputting an analog signal to be processed. Each of the n stages includes a first reference input port, a second reference input port, at least one network having first and second terminals, and a switching element that is responsive to a digital input signal for varying a connectivity of the first and second terminals with respect to the first and second reference input ports. Each of the n networks has a primary electrical characteristic that is binarily weighted with respect to the primary electrical characteristic of others of the networks. Also, the first and second reference input ports of each of the n stages, other than a most significant stage, are coupled to a preceding stage.

For a number of embodiments of this invention a least significant stage has an output port coupled thereto, and the primary electrical characteristic may be resistance, capacitance, capacitive reactance, inductance, inductive reactance, voltage potential, gain, transconductance, time delay, superconductance, electrical or optical conductor length, winding turns, permeability, and combinations of these electrical characteristics. A characteristic of an analog signal appearing at the output port is a function of an analog signal applied between the first and second reference input ports of a most significant stage, and is also a function of an n-bit digital signal that is applied to the n-stages.

In an analog to digital converter embodiment of the invention each of said n stages further includes an analog comparator having a first input coupled to the analog signal input port, a second input coupled to the network, and an output coupled to the switching element. The output of the comparator manifests a logic one signal or a logic zero signal in response to signals appearing at the first and second inputs. In the analog to digital converter embodiment the primary electrical characteristic may be resistance, and a value of the resistance of the network of the least significant stage can be selected so as to set the noise immunity for all of the n-stages.

This invention also teaches embodiments of network swappers, specifically binary swappers and Gray code swappers, that are suitable for implementing a number of analog signal processing circuits of low cost and complexity, and which are furthermore amenable to fabricating upon a monolithic substrate as a programmable analog signal converter array.

This invention further teaches an edge triggered sample and hold circuit that is useful in constructing synchronous analog to digital converters and digital to analog converters. The invention also teaches a voltage programmable analog multiplier, a digitally programmable analog multiplier, and embodiments thereof for constructing neural networks and other circuitry, such as discrete multipliers. Further embodiments of the invention disclose logarithmic digital to analog converters.

BRIEF DESCRIPTION OF THE DRAWINGS

The above set forth and other features of the invention will be made more apparent in the ensuing Detailed Description of the Invention when read in conjunction with the attached drawings, wherein:

FIGS. 6A and 6B are each an embodiment of a Gray code network swapper;

FIGS. 6C and 6D each illustrate a simplified schematic symbol of the Gray code network swappers of FIGS. 6A and 6B;

FIGS. 7C and 7D each illustrate a simplified schematic symbol of the Binary code network swappers of FIGS. 7A and 7B;

FIG. 10D illustrates the effect of a 3-bit Gray code applied to a three-bit potentiometer constructed in accordance with FIGS. 6A–6D;

FIG. 14A illustrates a four-bit analog to digital converter constructed with R2R binary network swappers;

FIG. 14B depicts a modification of the embodiment of FIG. 14A that avoids a floating condition at the inputs to the comparators;

FIG. 15 is a schematic representation of an n-bit digitally controlled potentiometer in accordance with FIGS. 8 and 11;

DETAILED DESCRIPTION OF THE INVENTION

Figure 1A:
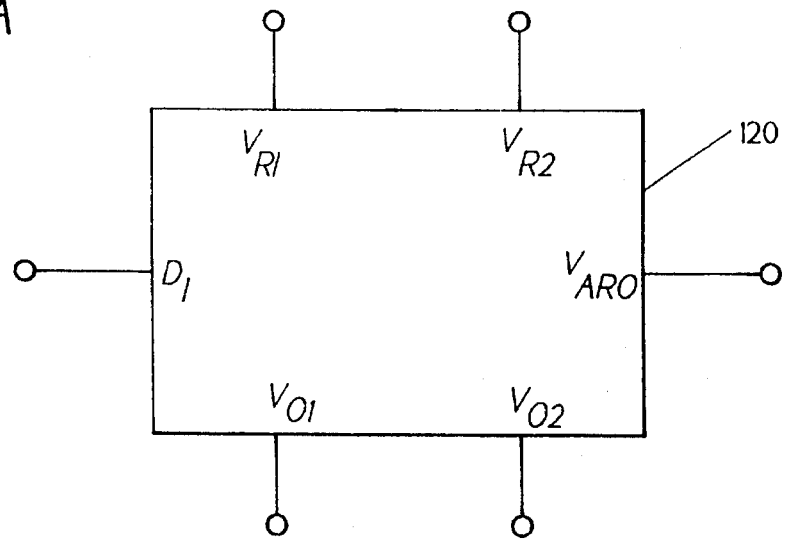
FIG. 1A is a block diagram of a switched resistor SYMAD converter cell.
Figure 1B:
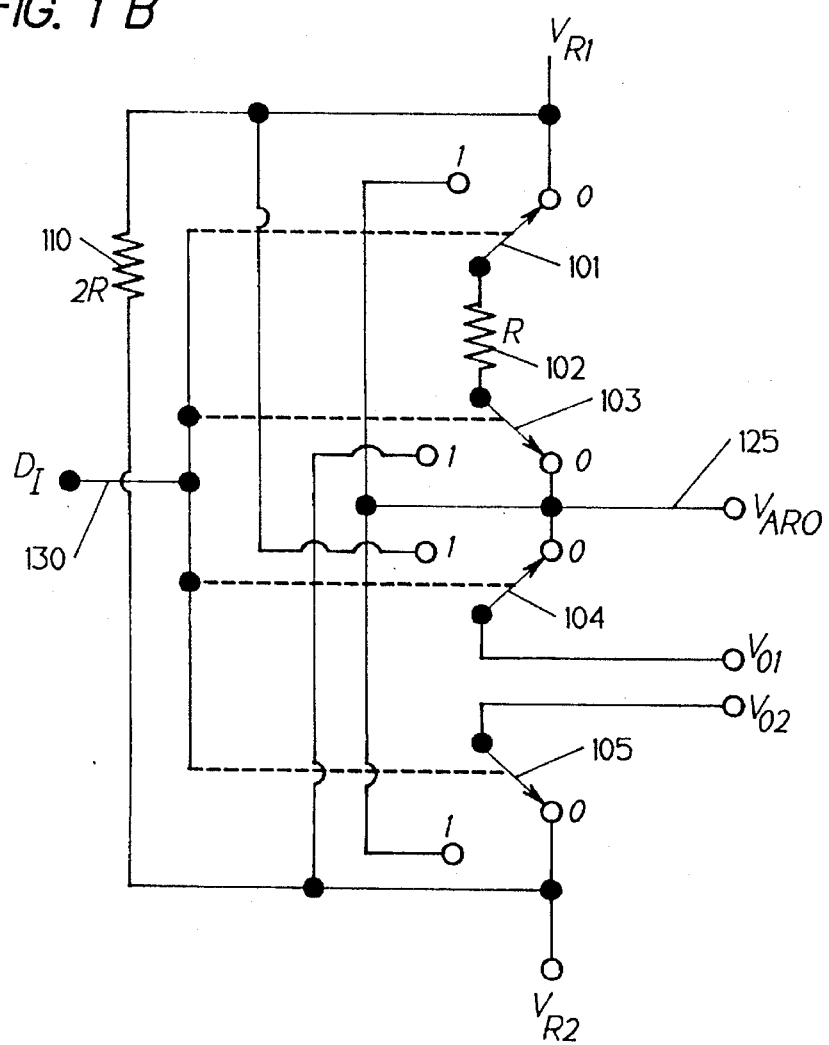
FIG. 1B is a detailed schematic of a switched resistor SYMAD converter cell.
Figure 1:
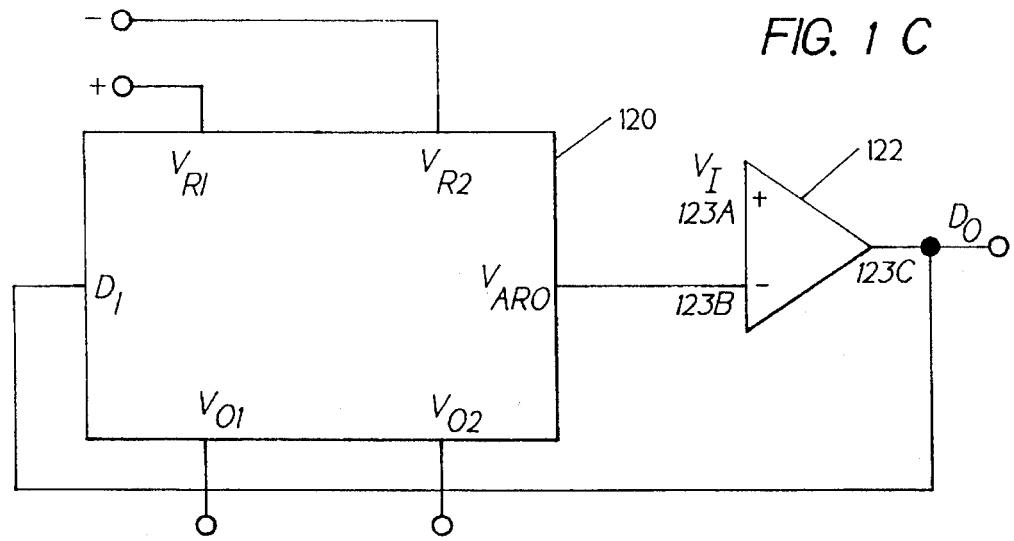
FIG. 1C illustrates the use of a switched resistor SYMAD converter cell in realizing an ADC cell.
FIG. 1D illustrates the switched resistor SYMAD converter cell configuration with a logic one applied at the $D_I$ terminal.
FIG. 1E illustrates the switched resistor SYMAD converter cell configuration with a logic zero applied at the $D_I$ terminal.
FIG. 1F is a detailed schematic of a switched resistor SYMAD cell with capacitors to reduce output switching spikes.
FIG. 1G shows a detailed schematic of an alternate version of a switched resistor network.
Figure 1:
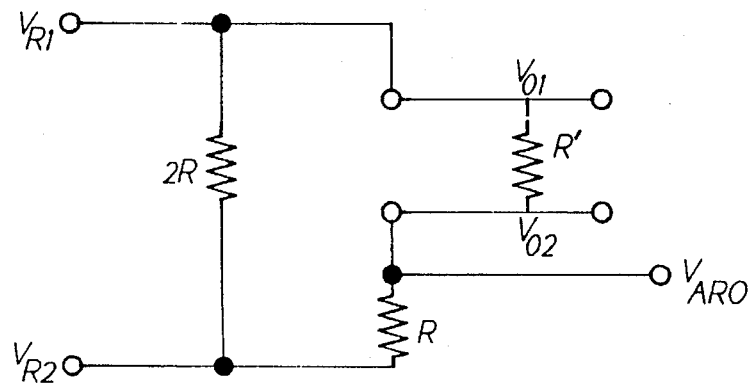
Figure 1:
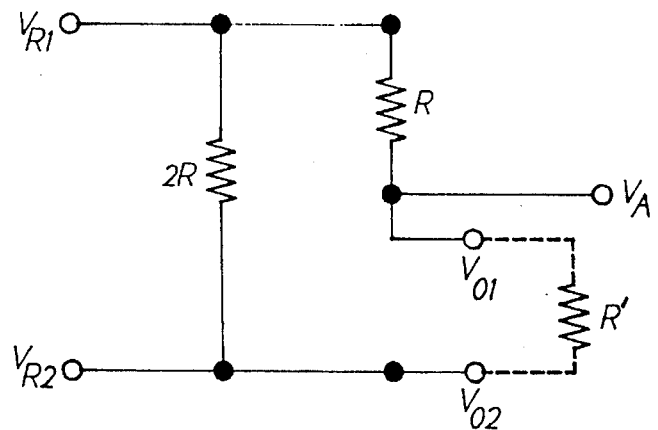

A switched resistor (SR) embodiment of a Symmetrical Analog to Digital (SYMAD) converter cell, referred to herein as a SRSYMAD cell, is shown in FIGS. 1A and 1B. This embodiment, as well as the embodiments depicted in FIGS. 1C–1G, 2A–2C, 3A, 3B, 4, and 5A–5C, are disclosed in U.S. Pat. No. 5,202,687 which has been incorporated by reference herein in its entirety.

In this embodiment a resistor network is used in performing either an ADC function or a DAC function. Other applications of this embodiment include, but are not limited to, a digitally controlled analog attenuator and a digitally controlled potentiometer.

The following chart defines the SRSYMAD cell input and output signals.

| SIGNAL NAME | DESCRIPTION | INPUT/OUTPUT |
|---|---|---|
| VR1 | Positive Reference | Input |
| VR2 | Negative Reference | Input |
| $D_I$ | Digital Signal | Input |
| Vo1 | Positive Reference | Output |
| Vo2 | Negative Reference | Output |
| $V_{ARO}$ | Analog Reference | Output |

Referring now to FIG. 1C, an ADC function is realized by connecting a comparator 122 in such a way that the $V_{ARO}$ signal is coupled to the inverting terminal (−) 123b of comparator 122, and the analog input signal is coupled to the non-inverting terminal (+) 123a of comparator 122.

When the analog input signal $V_I$ is greater than the analog reference signal $V_{ARO}$, the comparator 122 outputs a logic one. If the analog input signal $V_I$ is less than the analog reference $V_{ARO}$, the comparator 122 outputs logic zero.

The comparator 122 output 123c is coupled to the $D_I$ terminal of the switched resistor cell, as shown in FIG. 1C. When a logic one signal is received at the $D_I$ terminal, the switches are activated such that the cell configures itself as shown in FIG. 1D. R' is the resistance looking into the $V_{R1}$, $V_{R2}$ terminals of the next switched resistor SYMAD cell. The analog switches operate to swap resistor R and the output terminals Vo1 and Vo2, while maintaining their polarity. When the reference output terminals are terminated with R ohms, the resistance between the input terminals is R ohms. This is true whether the digital input signal $D_I$ is a logic zero or a logic one.

Therefore, the output of one cell may be terminated by the input resistance of the next cell, and the final cell is terminated by a resistor having a value of R. The input resistance to a cell (looking into the $V_{R1}$ and $V_{R2}$ terminals) is expressed as $$R_{VR1,VR2}=((R'+R)(2R))/(2R+R+R').$$

Since R'=R, the expression is reduced to $$R_{VR1,VR2}=4R^2/4R=R$$

where $R_{VR1,VR2}$ is the input resistance looking into the $V_{R1}$ and $V_{R2}$ terminals of the switched resistor SYMAD cell.

The magnitudes of reference voltages $V_{R1}$ and $V_{R2}$ are selected by the user, however the selection must take into consideration the magnitude range of the analog input signal. For example, and assuming that an analog input signal has a range of zero to three volts, to maximize the resolution of the data output the user may select $V_{R2}$=0 and $V_{R1}$=3V.

Figure 2A:
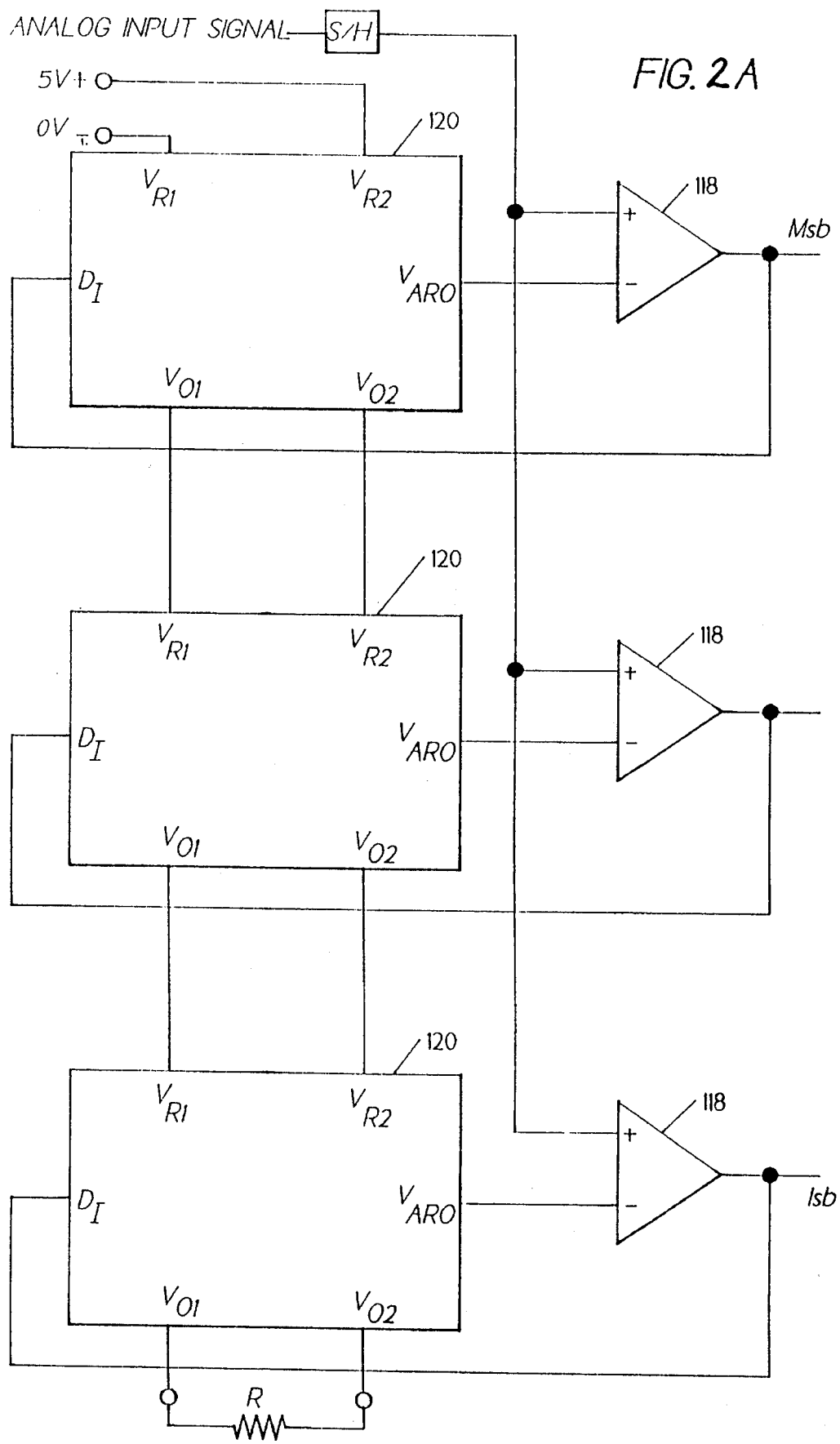
FIG. 2A is a block diagram of a three bit analog to digital converter (ADC) utilizing switched resistor SYMAD converter cells.
Figure 2B:
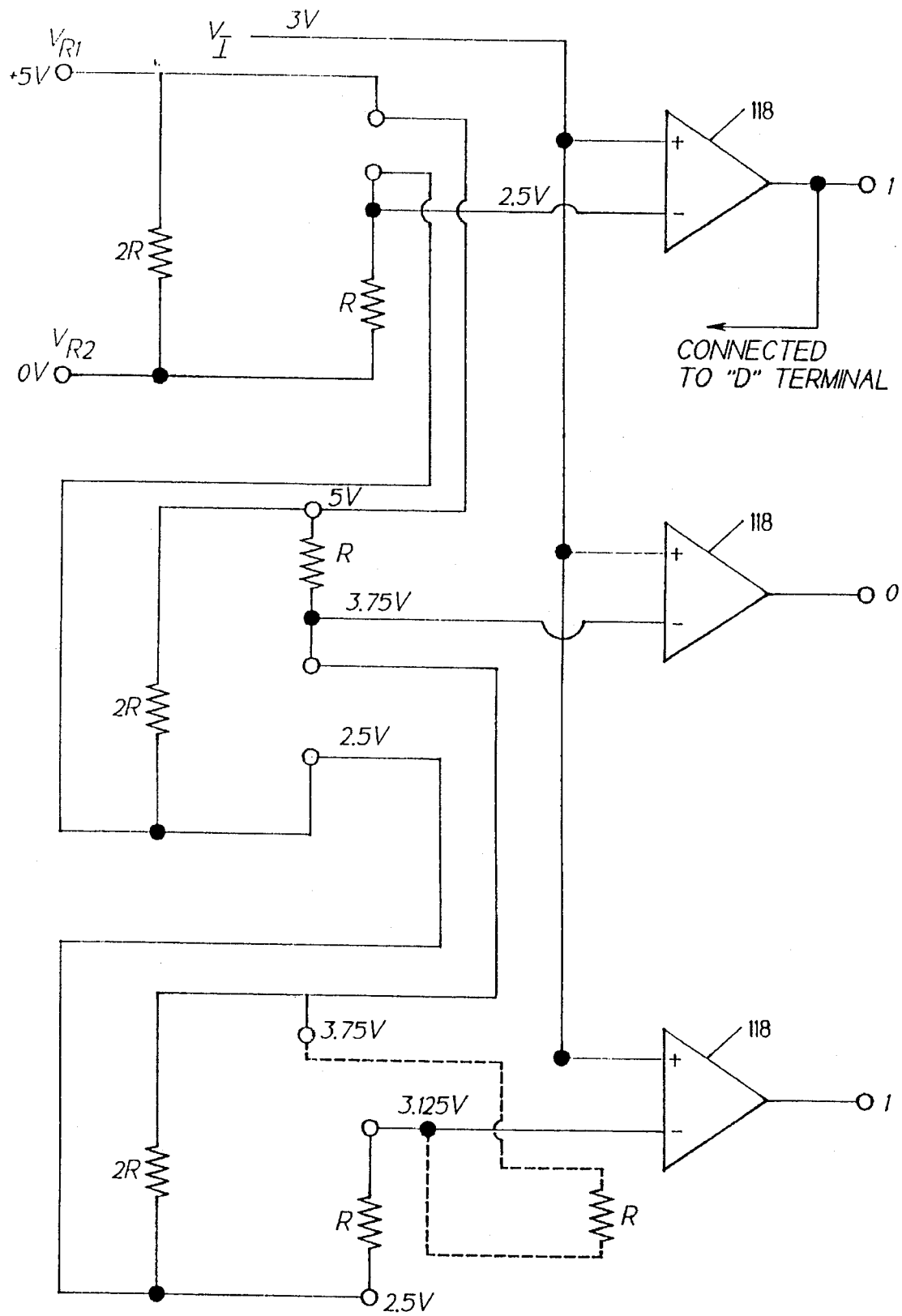
FIG. 2B illustrates the operation of a three bit analog to digital converter utilizing the switched resistor SYMAD cells.

FIGS. 2A and 2B illustrate this configuration. The comparator output of each stage sets up the configuration for that cell. This configuration determines the references voltages $V_{R1}$ and $V_{R2}$ for the next cell.

Figure 2C:
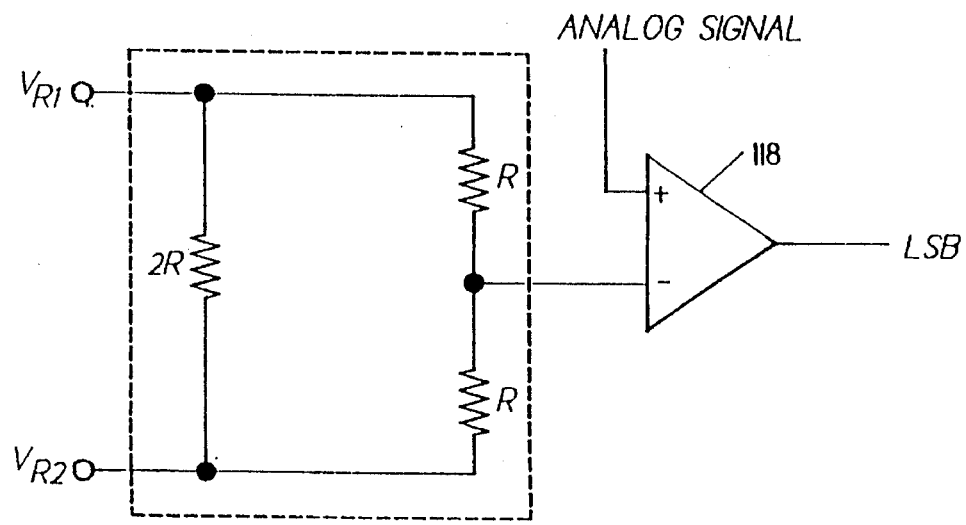
FIG. 2C is a schematic diagram showing a resistor network that may be employed in place of a LSB switching resistor SYMAD converter cell.

This pattern is repeated for N bits. It should be noted that the last cell is terminated with R. It is also within the scope of the invention to construct the last cell with a resistor network as shown in FIG. 2C.

Figure 3A:
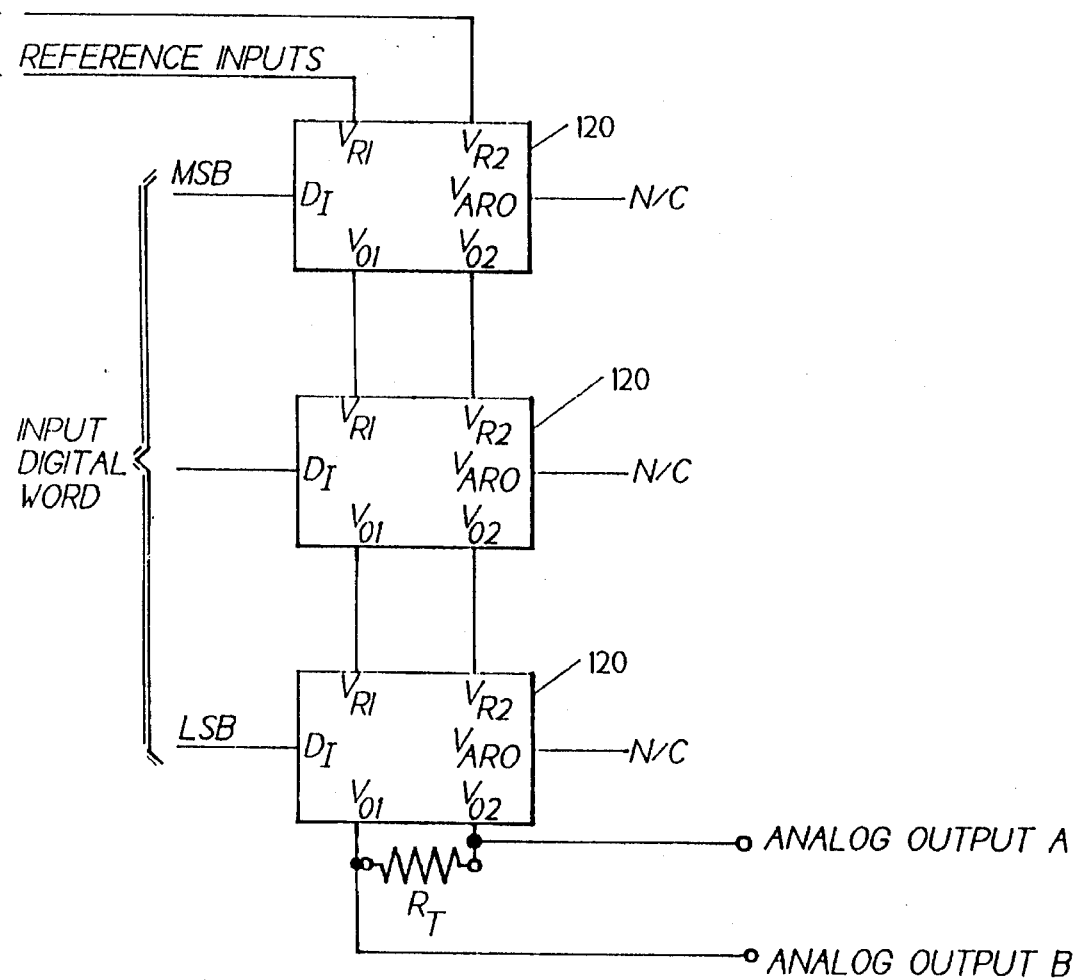
FIG. 3A is a block diagram of a DAC utilizing switching resistor SYMAD cells.

One significant advantage of the switched resistor SYMAD cell is that it can also be used to construct a digital to analog (DAC) converter. The comparator circuitry is not needed for the DAC function. FIG. 3A shows a three bit DAC utilizing three switched resistor SYMAD cells operated in the DAC mode.

The values of $V_{R1}$ and $V_{R2}$ are dependent upon the desired range of the analog output. For example, and assuming that a user desires an output voltage range from 0–1 v with 3-bits of resolution, $V_{R2}$ is set to zero and $V_{R1}$ is set to 1 volt. The output voltage per binary input is shown in the following table.

| | ANALOG OUTPUT (VOLTS) | |
|---|---|---|
| BINARY NUMBER | A | B |
| 000 | 0.000 | 0.125 |
| 001 | 0.125 | 0.250 |
| 010 | 0.250 | 0.375 |
| 011 | 0.375 | 0.500 |
| 100 | 0.500 | 0.625 |
| 101 | 0.625 | 0.750 |
| 110 | 0.750 | 0.875 |
| 111 | 0.875 | 1.000 |

Figure 3B:
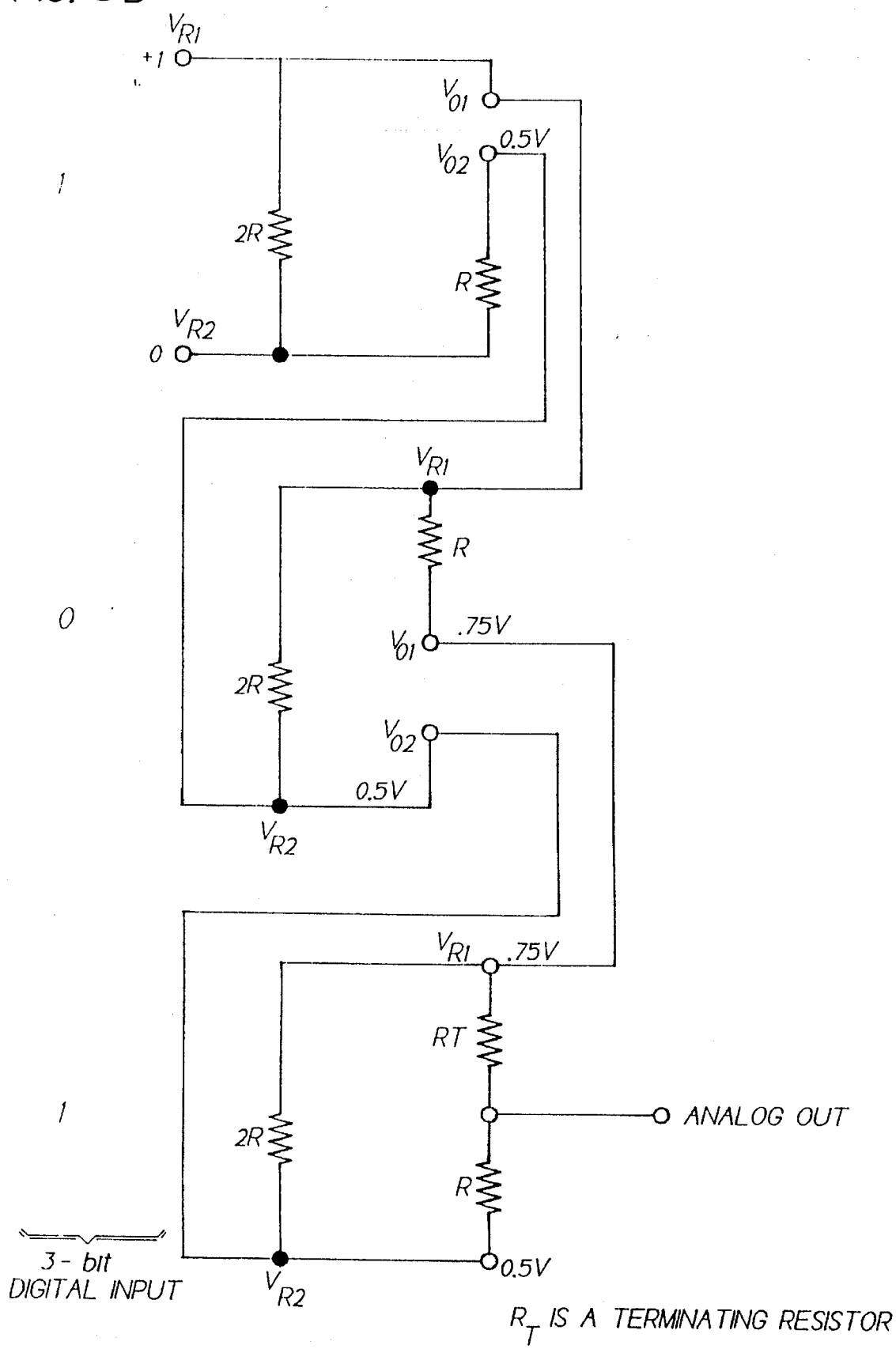
FIG. 3B is an illustration of the operation of a three bit DAC utilizing switched resistor SYMAD cells.

The magnitude range of the analog output signals is from 0.000 volts to 0.875 volts. FIG. 3B illustrates the use of three switched resistor SYMAD cells to convert the 3-bit binary word 101, which represents the decimal number 5, into 0.625 volts.

The maximum output voltage swing is 0.875 volts, or one LSB less than the full scale voltage. The user may select either leg of the terminating resistor for output, or replace $R_T$ with a voltage divider or potentiometer to obtain a desired output.

Since the MSB of the 3-bit binary word input (digital input) is a 1, the first switched resistor SYMAD cell, through the internal switching, is configured as shown in the schematic diagram of FIG. 1D. The second bit of the 3-bit binary word is a 0, therefore the second switched resistor SYMAD cell is configured as shown in the schematic diagram of FIG. 1E. The LSB of the 3-bit binary word is a 1, therefore the last switched resistor SYMAD cell is configured as in the schematic diagram of FIG. 1D.

The first cell's reference outputs, $V_{01}$ and $V_{02}$, determine the second cell's input references, $V_{R1}$ and $V_{R2}$. The second cells reference outputs, $V_{01}$ and $V_{02}$, determine the third cell's input references, $V_{R1}$ and $V_{R2}$. The analog output signal is taken from the bottom leg of $R_T$, the terminating resistor of the LSB switched resistor SYMAD cell.

If the analog output signal is buffered by a high input impedance amplifier, such as a JFET amplifier, then a large value of R can be used in each cell, and the circuit power consumption is reduced accordingly. A large value of R also reduces the noise figure at the output.

In both the ADC and DAC configurations the positive reference output $V_{01}$ is expressed as:

$$V_{01}=(dV_{R1})+(1-d)((V_{R1}+V_{R2})/2).$$

The negative reference output $V_{02}$ is expressed as:

$$V_{02}=(1-d)(V_{R2})+d(V_{R1}+V_{R2})/2,$$

where d=1 when D=logic high, else d=0, and where D is the digital input signal.

When d=1, indicating a logic one, $V_{01}$ and $V_{02}$ are expressed as:

$$V_{01}=V_{R1}, \text{ and}$$

$$V_{02}=(V_{R1}+V_{R2})/2.$$

When d=0, indicating a logic zero, $V_{01}$ and $V_{02}$ are expressed as:

$$V_{01}=(V_{R1}+V_{R2})/2, \text{ and}$$

$$V_{02}=V_{R2}.$$

When the switches within the switched resistor SYMAD cell switch from one position to the other, there is a short period when all three terminals are open. This condition will float the $V_{ARO}$ terminal, which may cause the comparator to toggle.

Figure 1G:
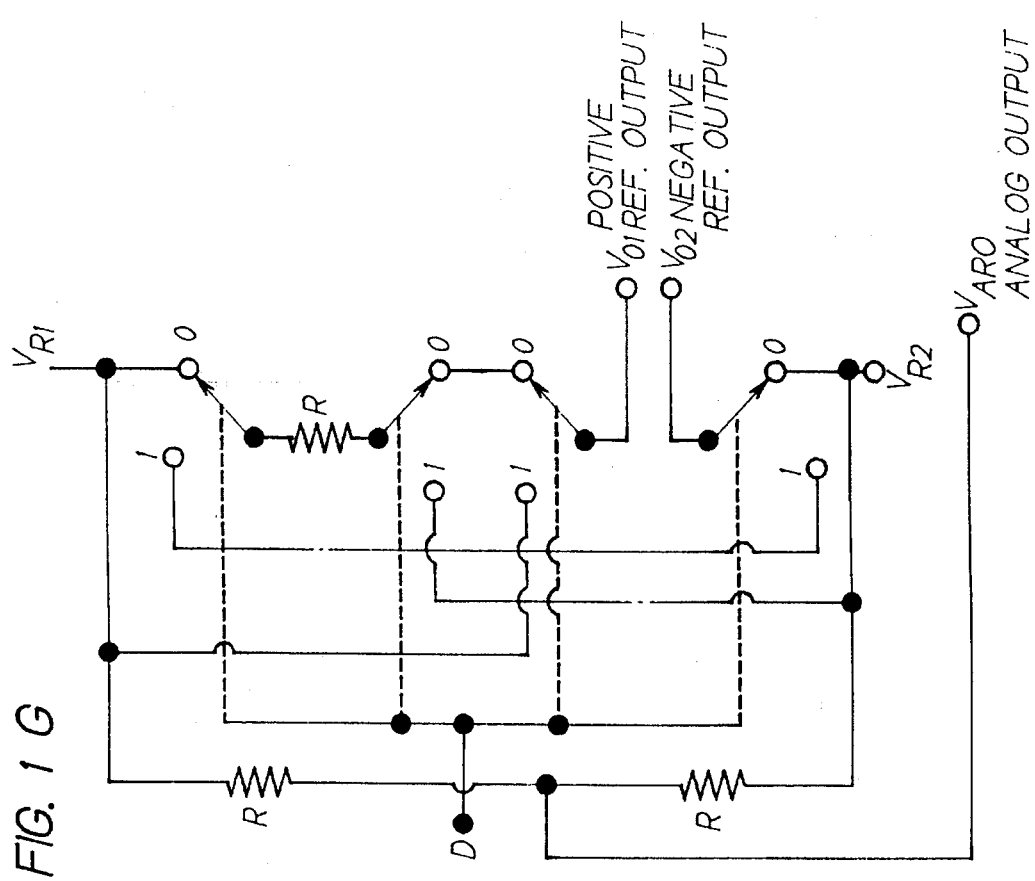
Figure 1F:
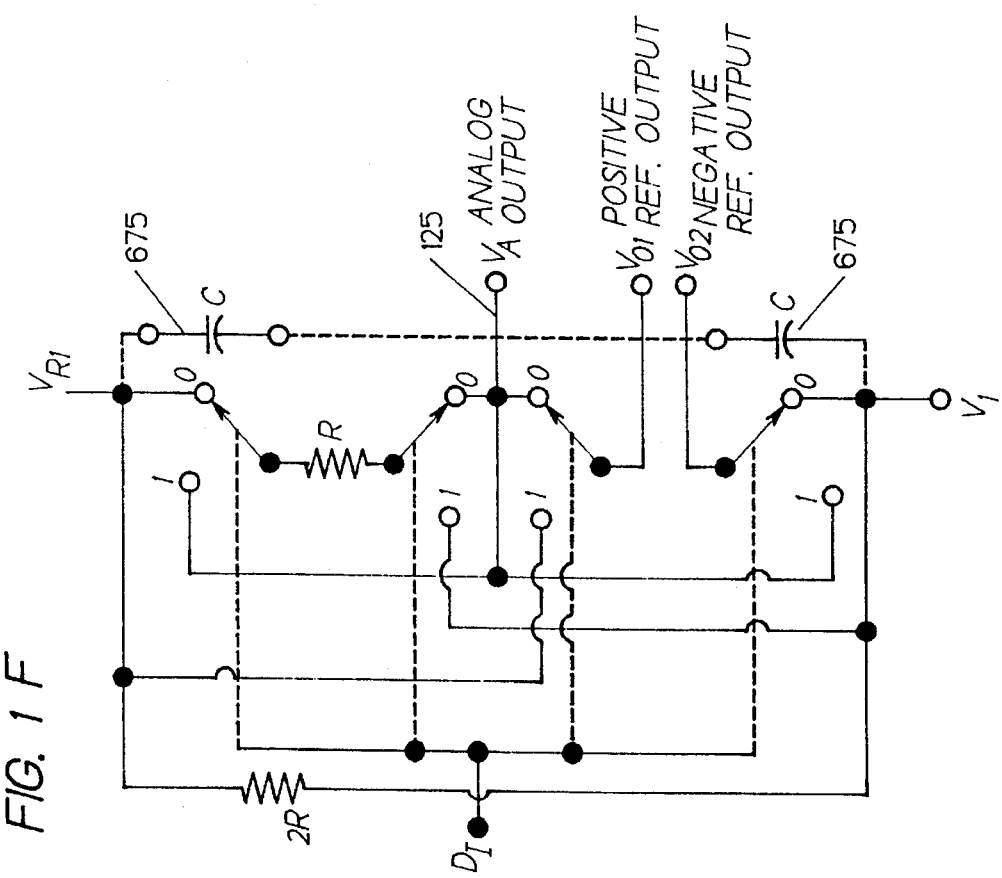

FIGS. 1F shows one of two methods to prevent the toggling of the comparator. Low leakage capacitors 675 are placed across either the center node and $V_{R1}$, or the center node and $V_{R2}$. Ceramic disk-type capacitors are suitable for this purpose.

An alternative is to use the circuit shown in FIG. 1G. In this circuit, the resistor 2R is replaced by two resistors each having a value of R. The $V_{ARO}$ signal is taken at the center point between these two resistors. This center point provides a stable voltage level that is not affected by the switching functions. If, however, the resistor values are not identical, and vary considerably, then $V_{ARO}$ is not exactly one-half $V_{R1}+V_{R2}$. This, however can be remedied by using two potentiometers in place of the two fixed resistors so as to adjust the midpoint potential to a desired value, while also providing for network calibration.

Figure 4:
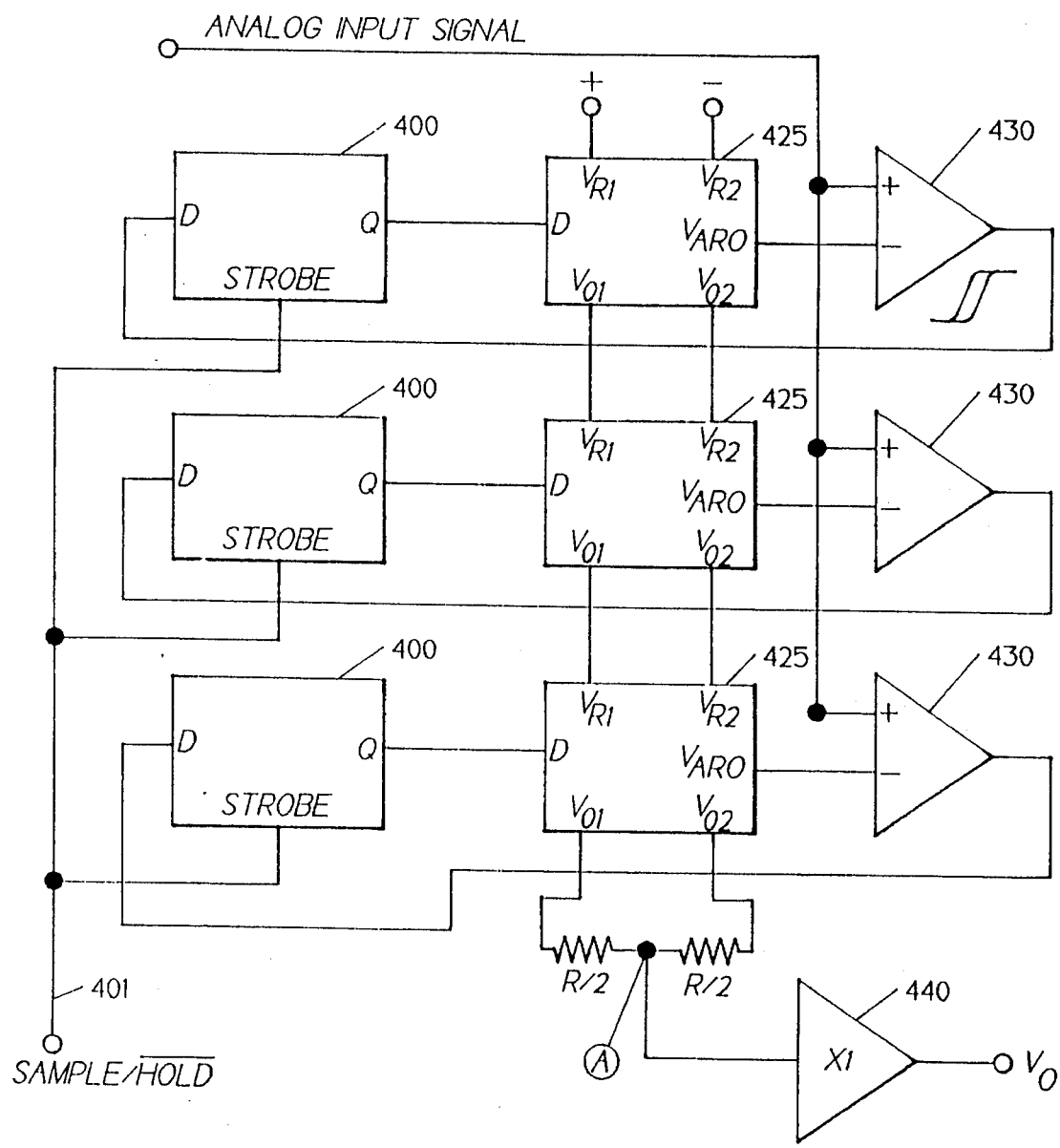
FIG. 4 is a illustration of operation of an analog memory utilizing switched resistor SYMAD converter cells.

FIG. 4 illustrates an embodiment of an analog memory utilizing switched resistor SYMAD converter cells. When the Sample/Hold 401 line shifts to a logic 1 level, the transparent latches 400 pass the input data to the "D" inputs of the switched resistor SYMAD cells. The comparators 430 are configured in such a manner as to exhibit hysteresis. The output of each comparator 430 determines whether the configuration of the switched resistor SYMAD cell is that of FIG. 1D or 1E. The preceding cell determines the reference voltages to be used in the succeeding cell. When the cells have settled, the input voltage is between $V_{01}$ and $V_{02}$ of every cell. However, because the difference between $V_{01}$ and $V_{02}$ of the last stage is the least, they are employed to generate the output signal. To further reduce the error between input voltage and output voltage the potential that exists at the midpoint between $V_{01}$ and $V_{02}$ of the final stage is used. This is accomplished with a terminating "divide-by-two" network shown in FIG. 4. This produces at node A a voltage that is half way between $V_{01}$ and $V_{02}$ of the final stage. This voltage is buffered by an amplifier to maintain signal integrity, if required.

This selection of the midpoint voltage at A ensures that the worst case error, the difference between input voltage and output voltage, is no greater than $(V_{01}-V_{02})/2$, where $V_{01}$ and $V_{02}$ are of the final stage. This can further be expressed as a worst case % error:

$$\pm(\tfrac{1}{2}^{n+1})\times 100,$$

where n=number of bits used.

For optimum results, a stable analog input signal is maintained during the sampling period.

The buffer amplifier 440 is preferably a JFET op-amp, exhibiting high input resistance and low offset current and voltages. A suitable op-amp is the National Semiconductor LF411. A suitable transparent latch 400 is the 74LS373. This analog memory may be used for such applications as storing error signals or offset voltages.

Figure 5A:
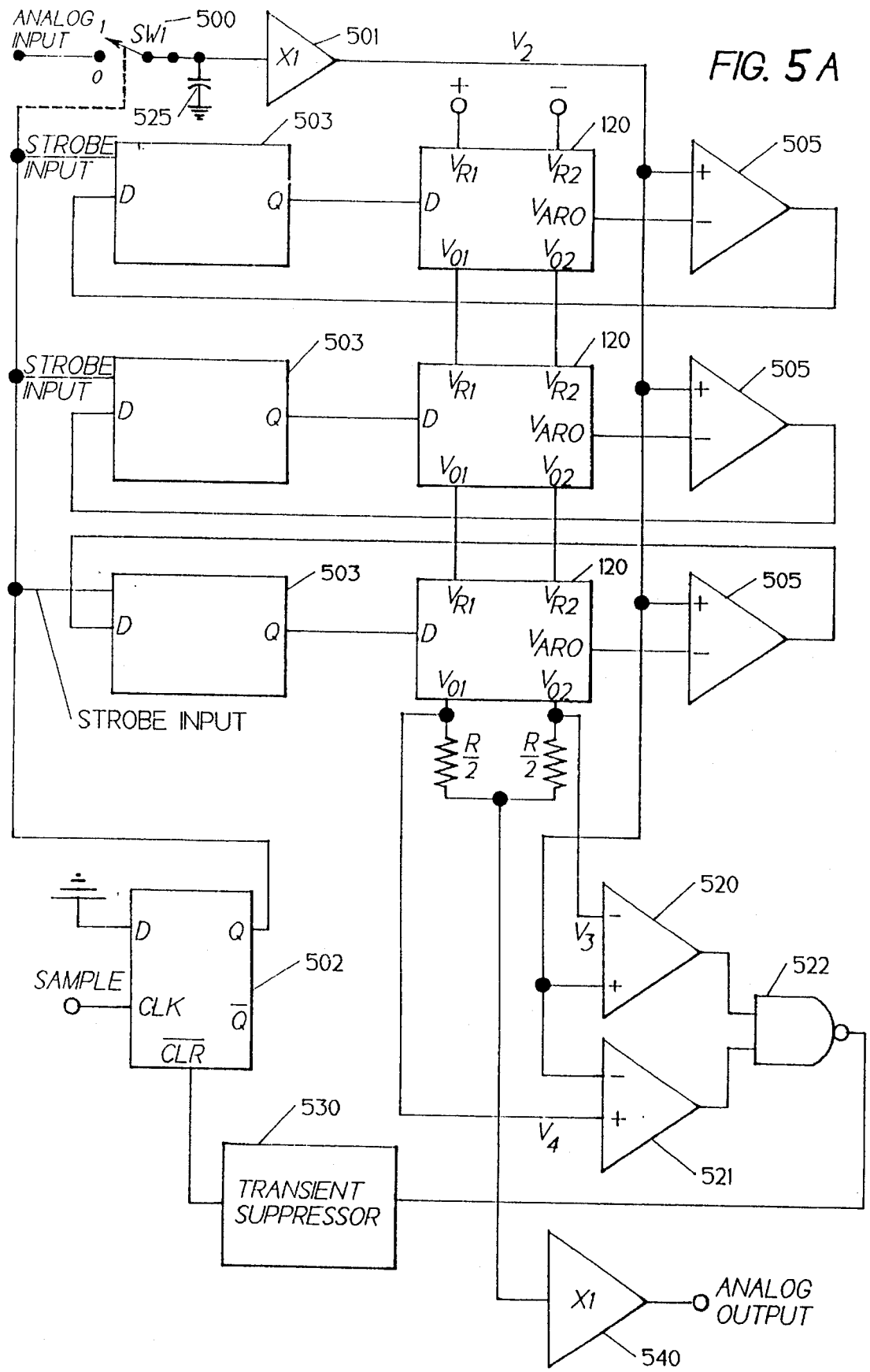
FIG. 5A is a schematic diagram of an edge triggered sample and hold circuit utilizing switching resistor SYMAD converter cells.

FIG. 5A shows the use of switched resistor SYMAD converter cells in realizing an edge triggered sample and hold. Switch 500 is normally closed. When the Q output of flip-flop 502 switches to a logic one, on a rising clock edge, switch 500 opens and the transparent latches 503 become transparent. Capacitor 525 and buffer amplifier 501 hold the signal for a time sufficient for the converter to stabilize. When the conversion is complete (the replica of the analog input signal is produced), the input signal $V_2$ is between $V_3$ ($Vo_2$) and $V_4$ ($Vo_1$). The window comparator is comprised of a comparator 520 to determine when the input signal (to the window comparator) is below a threshold ($V_4$), and a comparator 521, to determine when the input signal (to the window comparator) is above a threshold ($V_3$). The outputs of comparators 520 and 521 are coupled to the inputs of a NAND gate 522, which produces a DONE signal. When asserted, a logic zero, the DONE signal signifies that the conversion is complete, and clears flip-flop 502.

Figure 5C:
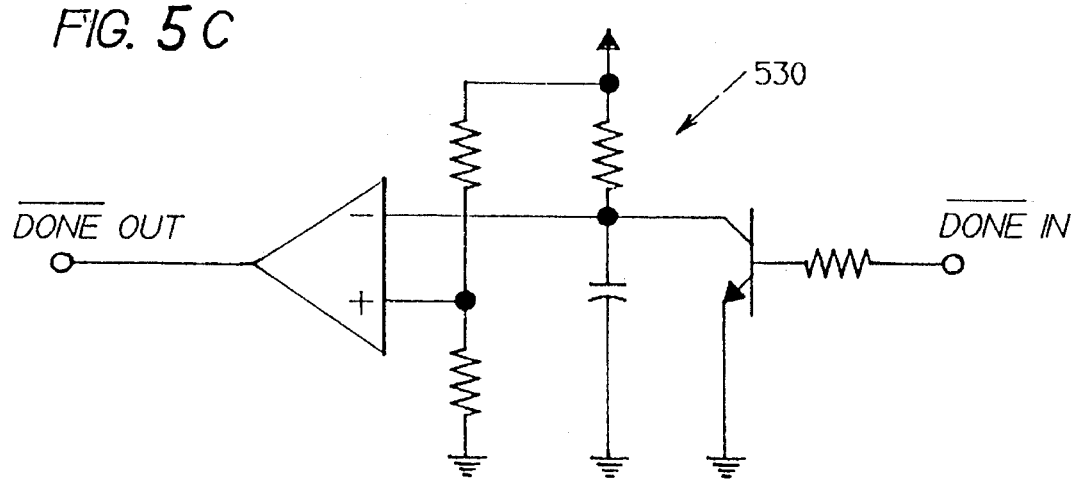
FIG. 5C is a schematic diagram of a presently preferred transient suppressor.
Figure 5B:
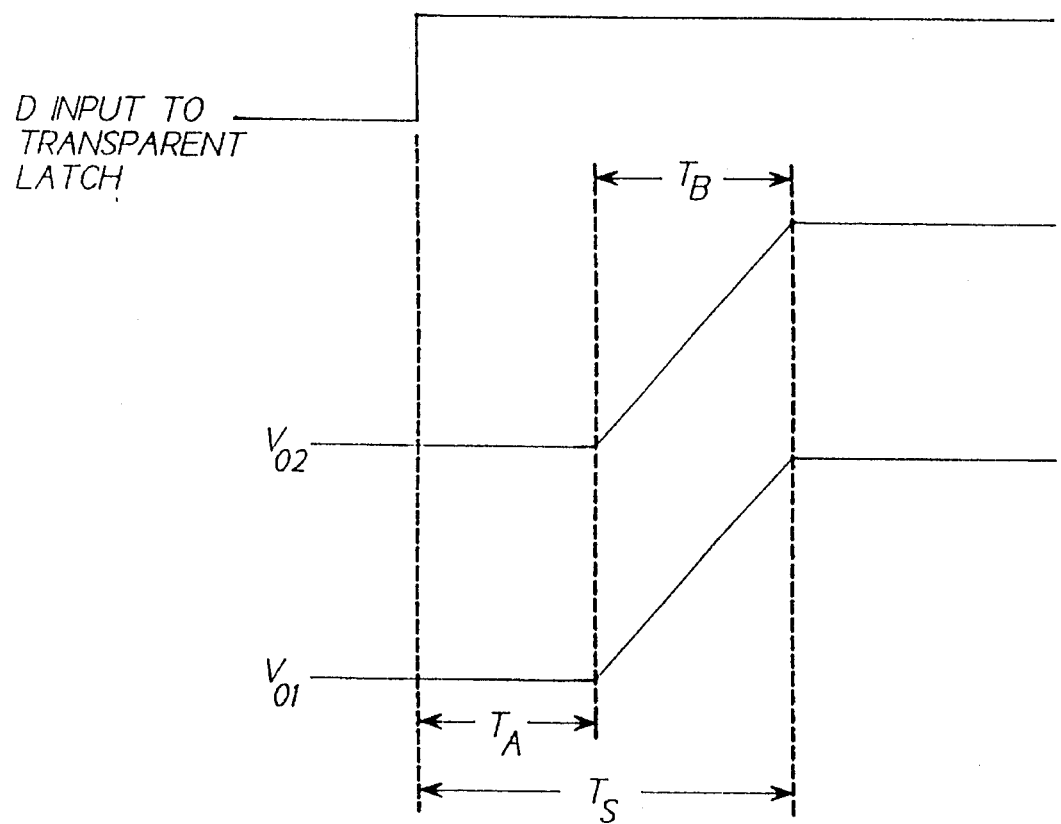
FIG. 5B illustrates the settling time of the switching resistor SYMAD cell.

In order to prevent the reception of false DONE signals while the converter is switching, a transient suppressor 530 may be employed, as depicted in FIG. 5C. The transient suppressor 530 passes a DONE signal only if it is stable for more than $T_S$ seconds; $T_S$ being the time required for the switched resistor SYMAD converter cell to switch and stabilize. $T_S$ is comprised of two components, $T_A$ and $T_B$, $T_A$ being the propagation delay from the time the data enters the cell from the transparent latches until the switches within the cell toggle, and $T_B$ is the time for the reference voltages to rise or fall to $(100/2^n)$ percent of the full scale voltage $V_{FS}$ (n is the number of bits). The analog output signal is expressed as $$V_0 = (V_{o1} + V_{o2})/2.$$

In FIG. 5A, $V_{o1} = V_4$ and $V_{o2} = V_{o3}$, therefore $$V_0 = (V_3 + V_4)/2.$$

Capacitor 525 is preferably of the low leakage mylar type. The buffer amplifiers 501 and 540 are preferably of the JFET type with high input resistance and low offset current and voltages. A suitable rising edge triggered flip-flop 502 is the 74LS74.

The embodiments of the invention described above employ switches of the field-effect-transistor (FET) variety, however, any suitable switch may be used, such as an electro-mechanical relay.

These embodiments of the invention also employ a comparator having hysteresis input characteristics and a TTL-compatible output, however, an ECL-type comparator may also be used. The hysteresis is preferably no larger than ½ the LSB voltage.

Having described in detail a network swapper that employs resistors having an R2R configuration, the ensuing description is directed to further embodiments of the invention.

That is, the following description describes further embodiments of network swappers for implementing analog systems with characteristics that are digitally controllable. Swapping, as employed in this invention, is intended to mean the mechanical or electrical interchange of two networks in response to an input signal. A network can include any type of electrical, electromagnetic, or electromechanical circuit. The network can include passive and/or active electrical components and can be as simple as a resistor or a length of electrical or fiber optic cable, or as complex as, by example, a transistor array or an amplifier.

FIG. 6A shows a swapper circuit 600 constructed with a pair of digitally controllable single pole, double throw switches SW1 and SW2. SW1 and SW2 can each be a single pole, double throw relay or, by example, CMOS switches similar to the CD4053. Swapper circuit 600 inputs include a first and a second reference input, IR1 and IR2, respectively, and a digital control input D. First and second networks, NWK1 (A) and NWK2 (B), respectively, are coupled to SW1 and SW2 as illustrated.

FIG. 6B illustrates a network swapper 601 that is considered to be electrically identical to the embodiment of FIG. 6A. Both of these embodiments are referred to as a "GRAY" swapper 602 hereinafter, for reasons that will become apparent in the following description.

FIGS. 6C and 6D each illustrate a simplified schematic symbol of the GRAY swapper 602, and show the two input ports and the first and second terminals that are associated with each network. FIG. 6C shows the GRAY swapper 602 with a logic low at the digital "D" input. FIG. 6D show the GRAY swapper 602 with a logic one at the digital input. It is noted that networks "A" and "B" are swapped between the two drawings. Also note that the polarities are inverted as well. The polarity inversion may or may not be desirable, depending on the device to be synthesized.

Figure 7A:
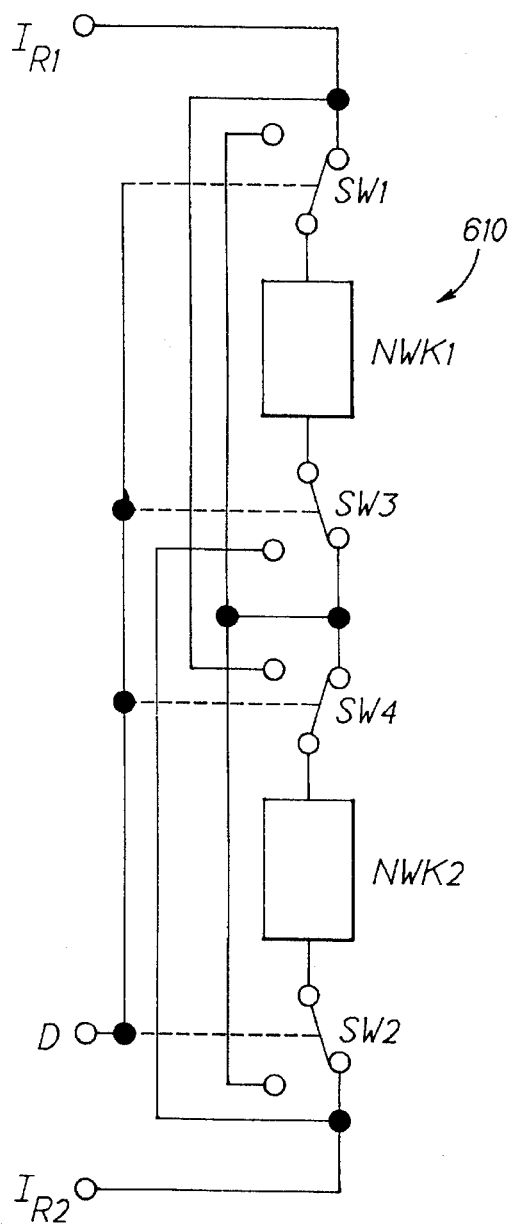
FIGS. 7A and 7B are each an embodiment of a Binary code network swapper.
Figure 7B:
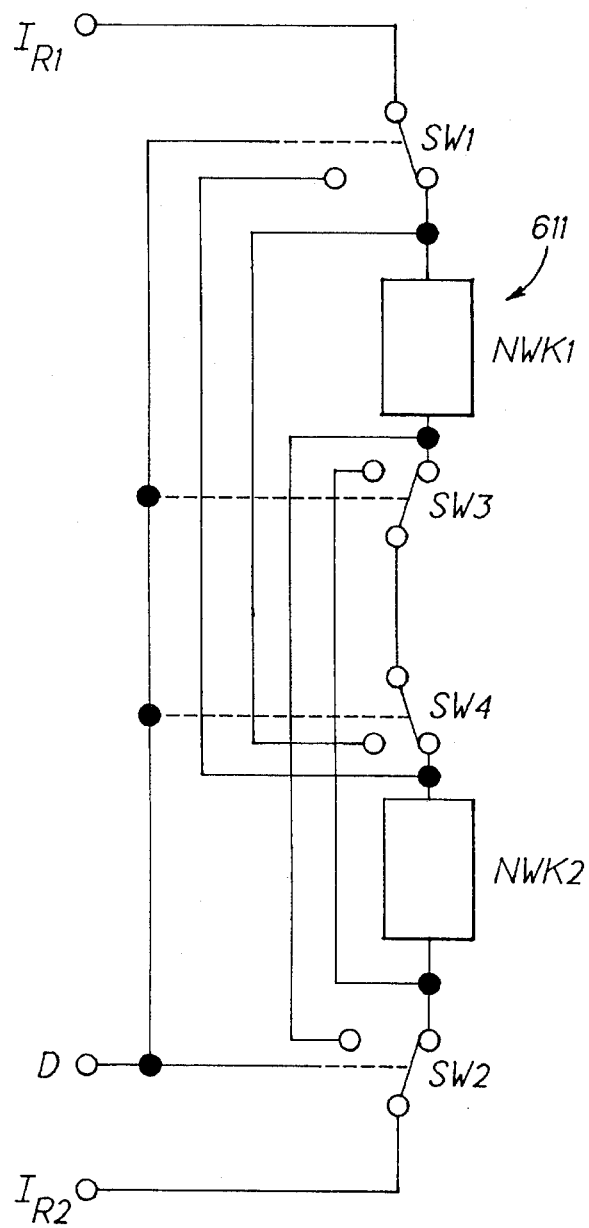

FIGS. 7A and 7B illustrate two embodiments of a network swapper 610 and 611, respectively, that swap networks while preserving the network polarity. FIGS. 7A and 7B are considered to be electrically identical, and are referred to hereinafter as a "BINARY" swapper 612.

FIGS. 7C and 7D each illustrate a simplified schematic representation of the BINARY swapper 612 and demonstrate the BINARY swapper 612 in both logic states. It is noted that the use of additional switches SW3 and SW4 enables the networks A and B to be swapped without polarity inversion.

FIG. 15 is a generalized schematic symbol for an n-bit digitally controlled potentiometer that represents either the GRAY network swapper of FIGS. 6A–6D or the BINARY network swapper of FIGS. 7A–7D.

An important aspect of this invention substitutes a network of a swapper with a swapper. The interconnection technique is shown clearly in FIG. 9A, wherein input reference terminals of a subsequent stage are connected as a network of swappers. Although this diagram is shown with BINARY swappers 612, it should be noted that GRAY swappers 602 can be used as well. However, a consideration when using the GRAY swappers 602 is that the networks that will not be damaged, or cause damage, as a result of the inherent polarity inversion.

The use of the swappers 602 and 612 can be employed to advantage to create digitally controllable analog circuits while replacing digitally synthesized circuits with less cost, less noise, and increased isolation and linearity.

Figure 8:
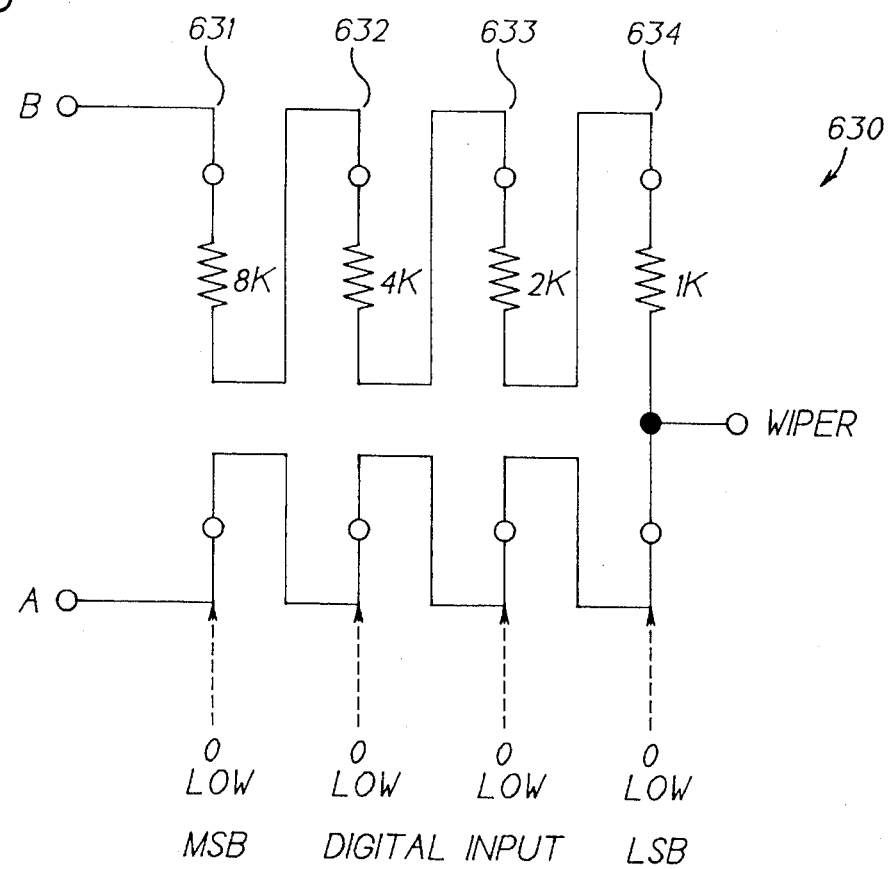
FIG. 8 illustrates a four-bit potentiometer constructed with Gray code network swappers.
Figure 10A:
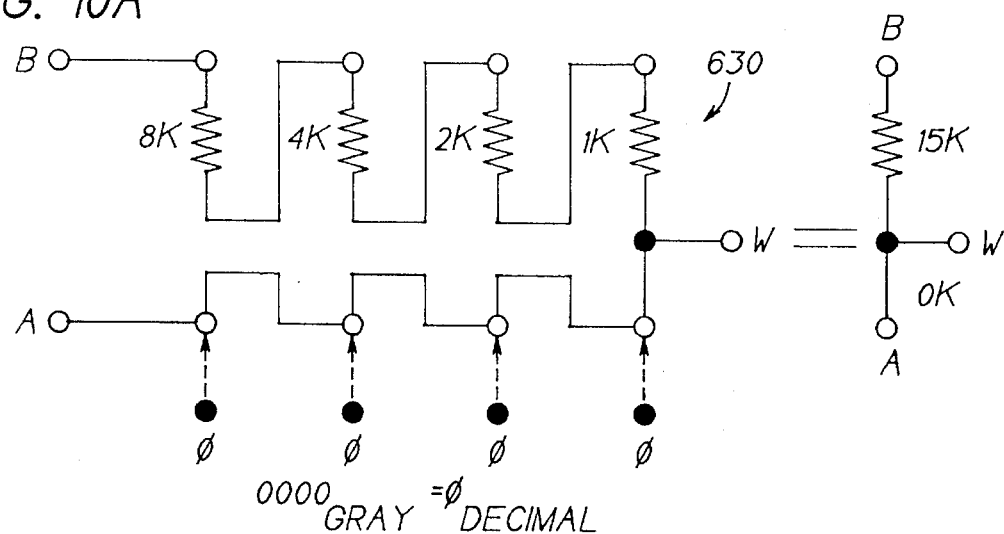
FIGS. 10A–10C illustrate the effect of three different Gray code inputs to the four-bit potentiometer of FIG. 8.
Figure 10B:
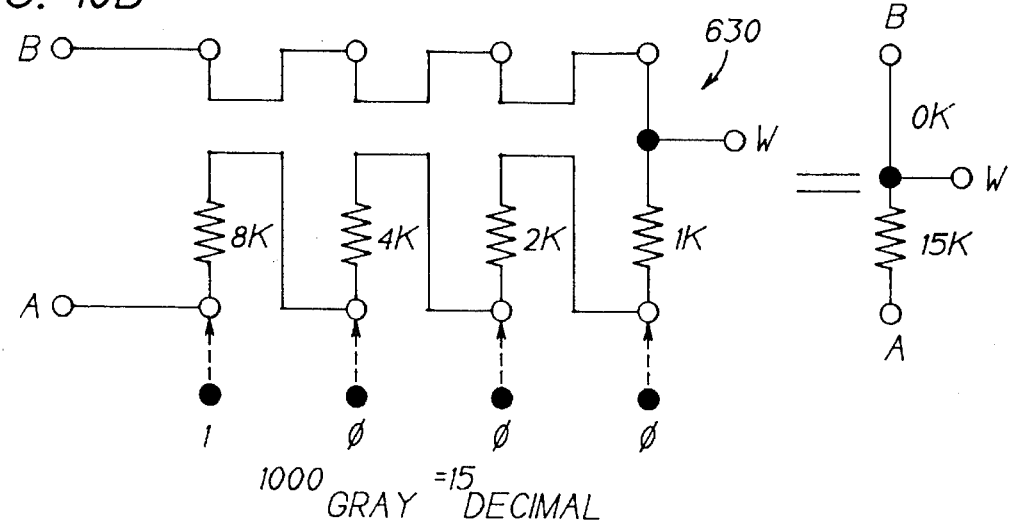
Figure 10C:
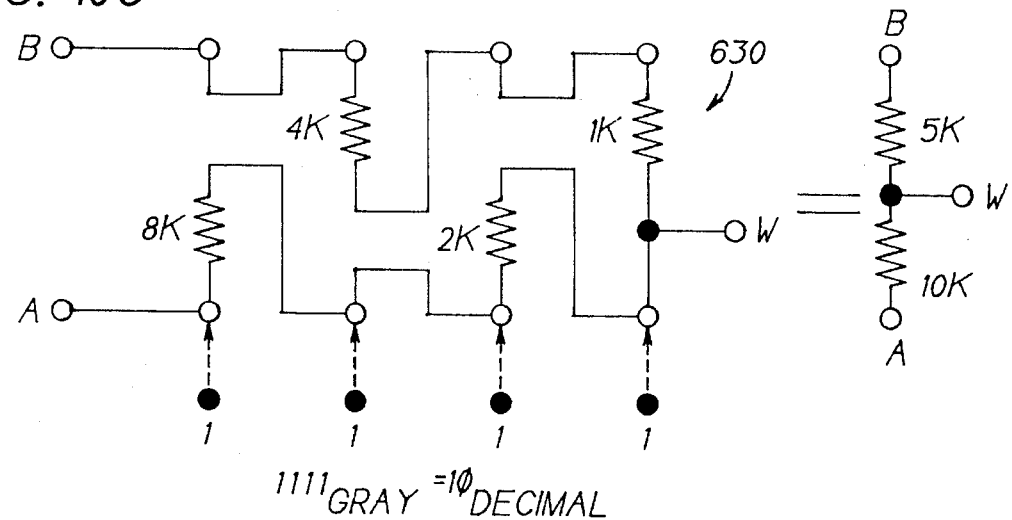

FIG. 8 shows a 15k ohm, 4-bit potentiometer 630 constructed with the GRAY swappers 602. The circuit is constructed with one swapper element per bit of resolution (as are all circuits henceforth). The swapper designated as 631 corresponds to the most significant bit (MSB), and the swapper designated 634 corresponds to the least significant bit (LSB). The circuit is shown with all swappers in their first state, which occurs when a swapper has a logic low applied to the digital (D) input. Each stage has as its first network a resistor having a resistance value that is weighted by the binary value of the stage. The second network of each stage, except for the last, is the reference input terminal to the next stage. The second network of the last stage is a short circuit and comprises the wiper terminal (WIPER) of the potentiometer 630. The resistance between terminal "A" and the WIPER is determined by the GRAY code that is applied to the digital control inputs of the swappers 631–634. A GRAY value of 0000 (decimal 0) yields zero ohms between terminal A and the WIPER, as shown in FIG. 10A. A GRAY value of 0001 (decimal 1) yields 1k ohms between terminal A and the WIPER. A GRAY value of 0100 (decimal 7) yields 7k ohms between terminal A and the WIPER. FIGS. 10B and 10C illustrate the GRAY potentiometer 630 of FIG. 8 as configured by two other GRAY code input values.

Figure 9A:
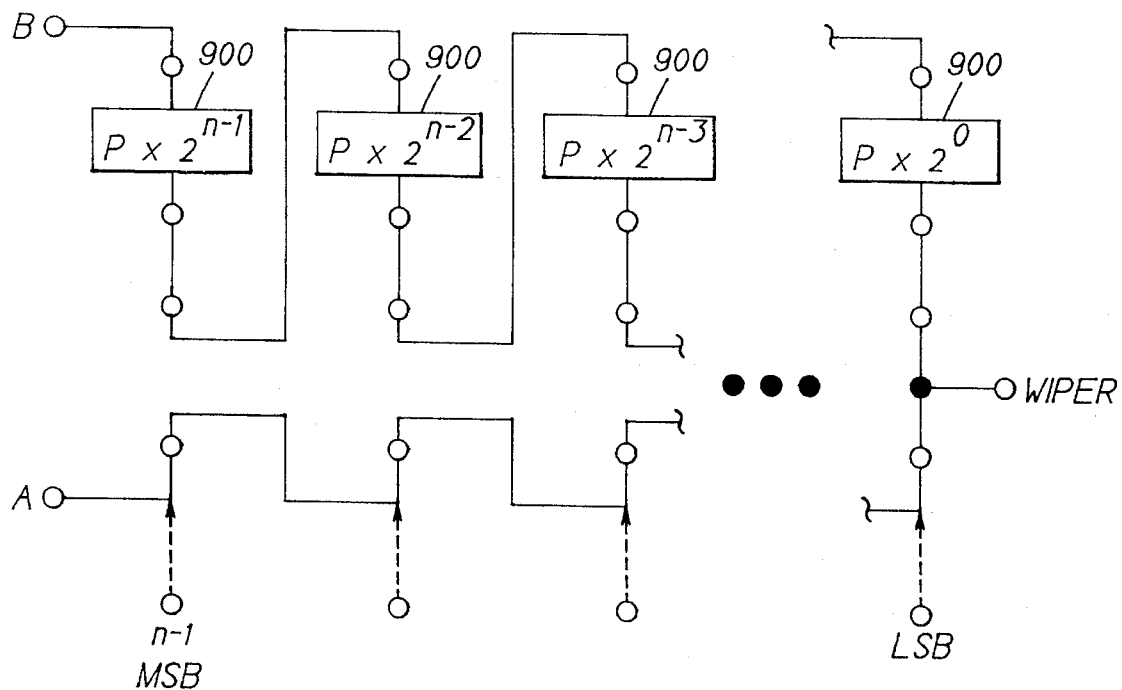
FIG. 9A depicts a generalized network of swappers.

The operation of potentiometer circuit 630 is similar to the operation of a mechanical potentiometer, except that the "position" of the WIPER is digitally controlled. This circuit can be used as a D/A convertor by applying a reference voltage between terminals A and B, and taking the analog voltage output from the WIPER terminal. This circuit can be expanded to any number of bits or size of resistance by following the symmetry depicted in FIG. 8. FIG. 9A illustrates the general circuit, and shows in greater detail the symmetry of the various stages.

FIG. 10D is an example of a three-bit GRAY code potentiometer, and shows the swapping of the binarily weighted resistor networks for four different GRAY code input values. In this example, seven volts is applied between the A–B input terminals, and the resulting wiper output voltage is shown to reflect the input GRAY code value.

Figure 11:
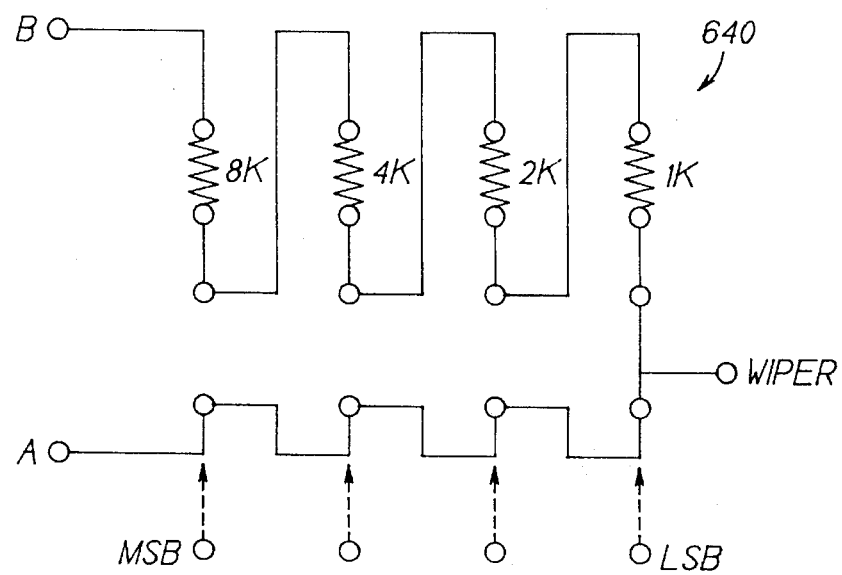
FIG. 11 depicts a four-bit potentiometer that is synthesized with binary network swappers.

FIG. 11 depicts a 15k ohm, 4-bit potentiometer 640 constructed with the BINARY swappers 612. The operation of this circuit is similar to the GRAY potentiometer 630 except that the resistance between the A terminal and the WIPER terminal is a direct binary reflection of the digital input. That is: a digital input of 1000 results in 8k ohms between the A terminal and the wiper, etc. This circuit can also be expanded to any number of bits or any size of resistance by maintaining the symmetry illustrated.

The similarity between the GRAY potentiometer 630 and the BINARY potentiometer 640 demonstrates that a circuit synthesized with the GRAY swapper 602 can also be synthesized with the BINARY swapper 612. As such, the remaining description will be made in the context of the BINARY swapper 612, it being realized that the GRAY swapper 602 can be substituted if the networks used are not polarity sensitive.

Figure 12:
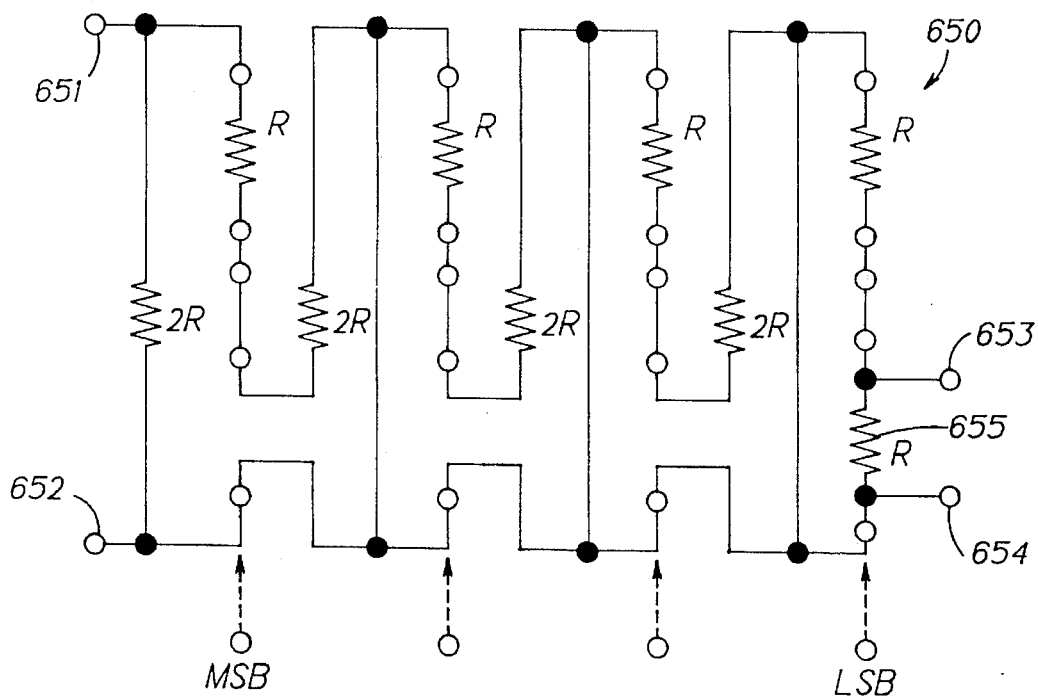
FIG. 12 illustrates a four-bit R2R network swapper embodiment that implements a digital to analog converter.

FIG. 12 illustrates a circuit 650, similar to that shown in FIGS. 1F and 1G, that is well suited for achieving digital to analog conversion. Although the circuit 650 is not as simple as the potentiometer embodiments 630 and 640 for digital to analog conversion, it provides other benefits. A first benefit is the use of the same resistance values for each stage, thereby reducing or eliminating temperature instability if all resistances are made of the same resistive material. That is, if all resistances are constructed of the same material, as is typical in an integrated circuit where all resistances may be comprised of polysilicon, then all of the resistances will drift proportionately to each other as the ambient temperature varies. Thus, any change in the value of R does not affect the output voltage.

Another benefit of this circuit is the inherent symmetry. By example, if the circuit 650, less resistor 655, is mass produced in IC form, then a user is enabled to make a 4, 8, 12, or 16 bit digital to analog converter just by ganging the ICs together, and terminating the last stage with a resistor of value R. All of the stages can also be fabricated on a common substrate, and then interconnected as desired by fuseable link or other IC programming techniques.

To use the circuit 650 as a digital to analog converter, the first reference input 651 is biased to the upper-most range of the desired output voltage, and the second reference input 652 is biased to the minimum desired output voltage. Reference output 654 is the most desirable for typical applications, as its output voltage varies from the minimum voltage to 1 LSB less than the maximum voltage at reference input 651. An expression that describes the output of node 654 for an "n" bit application is:

$$V(\text{node } 654) = D * \{V(\max) - V(\min)/(2^n)\} + V(\min),$$

where D=decimal equivalent of the digital input; and n=number of bits resolution (number of stages).

The reference output at node 653 is 1 LSB greater than the reference output at node 654. In other words, substituting D+1 for D in the above expression yields the voltage at node 653.

Figure 13:
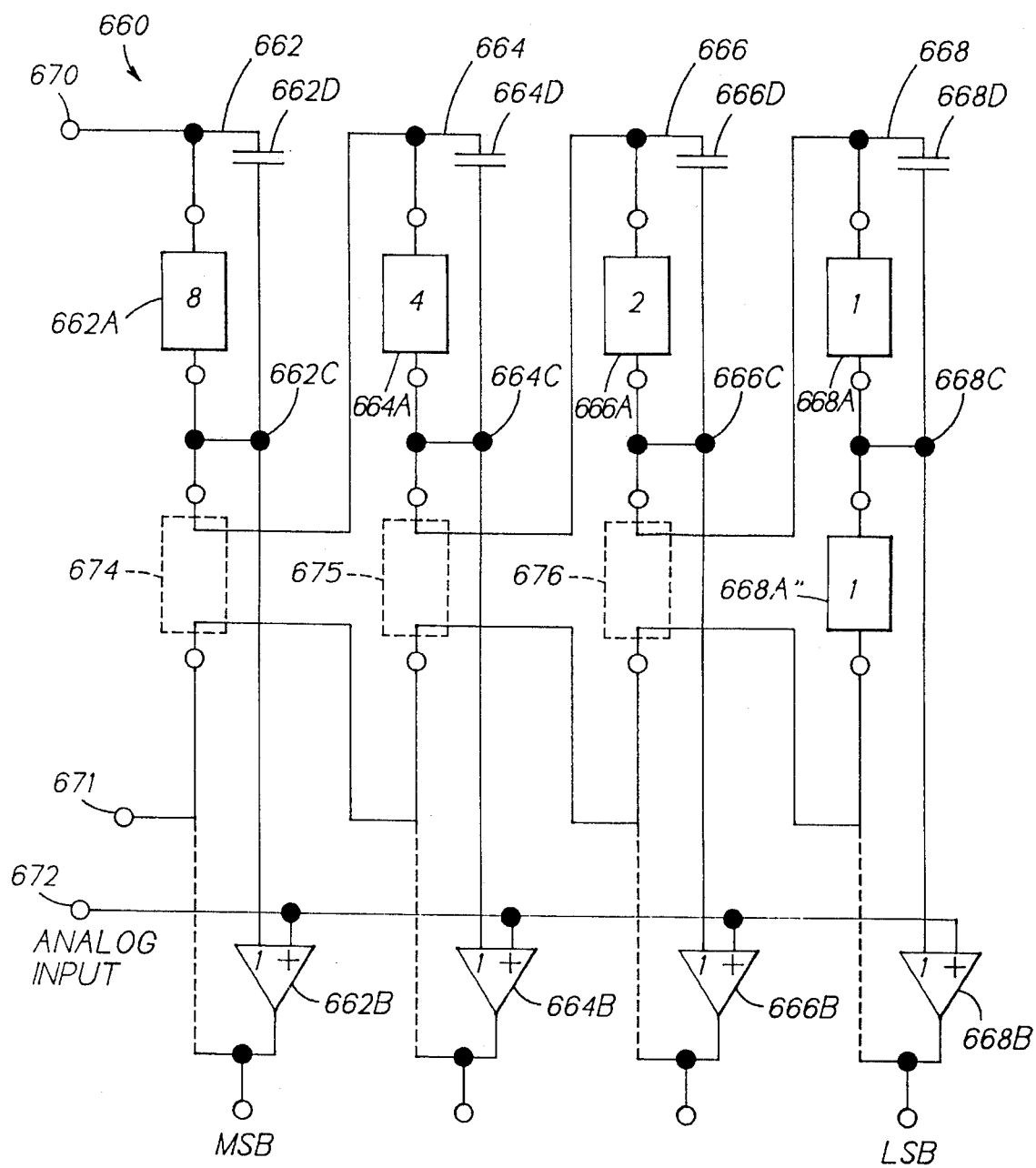
FIG. 13 illustrates a four-bit analog to digital converter constructed with binary network swappers.

FIG. 13 illustrates a 4-bit analog to digital converter 660 that utilizes the BINARY swappers 612. ADC 660 includes four stages designated 662, 664, 666, and 668. The reference inputs 670 and 671 of the first stage 662 set the conversion limits. Networks 662A–668A are arranged such that a first reference input of each stage is toward the higher potential, and the second network of each stage is the subsequent stages' reference input terminals. To each stage a comparator (662B–668B) is added, with the inverting input of each comparator being tied to the center node (662C–668C) of its corresponding swapper network. The first stage swapper receives the conversion limit reference voltages from nodes 670 and 671 and represents the MSB of the digital output.

The LSB stage (668) need include only a divider network (networks 668A and 668A') and the comparator 668B.

The operation of the ADC 660 is as follows. An analog voltage to be converted is presented to the terminal coupled to node 672. The voltage at node 662C is approximately halfway between the lower reference voltage at node 671 and the upper reference voltage at node 670. A capacitance 662D maintains the comparator voltage at node 662C should the associated swapper be switching. If the input voltage at node 672 is larger than the voltage at node 662C, then the output of comparator 662B is a logic one. The logic one is fed back and swaps the network depicted in dashed outline 674 toward node 670; a higher potential. Therefore, the voltage at node 664C will now be between the voltage at node 670 and the voltage at node 662C. Thus, it can be seen that circuit 660 operates to perform automatic successive approximation.

Figure 20:
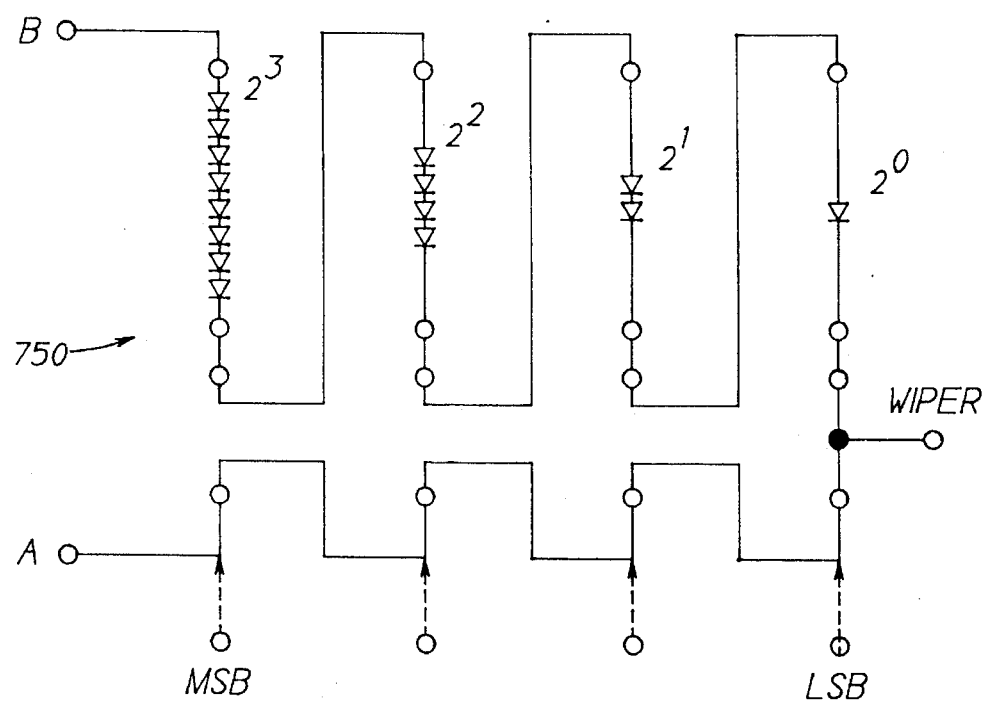
FIG. 20 illustrates a swapped diode digital to analog converter.

It should be noted that the networks 662A–668A are shown as a box having an associated value. This demonstrates that the actual contents of the box is not of paramount concern, so long as the voltage across the box is scaled by the magnitude associated with the box, with respect to the voltage across the LSB box. For example, if the network box 668A contains a 1k ohm resistance, then network box 662A would contain an 8k ohm resistance. Similarly, if network box 668A contains a 1.5 volt battery, then network box 662A would contain a 12 volt battery. In like manner, and as is illustrated in FIG. 20, if network box 668A contains a single diode providing one diode drop, then network box 662A would contain eight diodes in series for providing eight diode drops. Of course, if diodes are used the ADC 660 would be constructed with the BINARY swappers 612 to preserve the polarity.

The capacitors 662D–668D maintain their voltage throughout the operation of this circuit; they (once powered up) are not charged or discharged. As such, these capacitors add no delay to the operation of the ADC 660. In fact, these capacitors behave as speeder caps and improve response times by speeding the charging time of the input capacitance associated with comparators 662B–668B. The capacitors 662D–668D may be omitted if sufficient stray capacitance exists in the circuit to maintain the input potential of the comparators while the associated stage swaps. The effect on subsequent stage swapping is addressed below.

Noise immunity is a problem with asynchronously operating analog to digital converters. Noise in the system becomes a problem when the voltage difference between the inputs of a comparator is less than the peak to peak noise voltage. This will cause the output of the comparator to randomly toggle and, thus, the ADC will not have a definable output.

One solution to this problem is to use comparators that have a hysterisis-type input characteristic. However, this type of comparator is generally more expensive that conventional comparators.

In accordance with this invention a switched network ADC is made immune to noise by replacing the second network of the least significant stage (668A') with a network of value slightly larger than the unity value shown. For example, if the unity network is 1k ohm, then a 4-bit network will have 16k ohms of resistance (8k+4k+2k+1k+1k).

If it is assumed, for this example, that the reference voltage at node 671 is zero volts and the reference voltage at node 670 is 12 volts, and furthermore that the worst case noise in the system is 10 mV, then network 668A' should have a resistance that will generate an additional 5 mV of voltage drop. The reason for selecting the additional drop to be only one half of the expected noise is that when network 668A' is swapped to the bottom, the threshold voltage at node 668C will be 5 mV above midpoint, and when network 668A' is swapped to the top, the threshold voltage at node 668C will be 5 mV below the midpoint voltage. As a result, a total of 10 mV of hysterisis is provided.

In accordance with this example,

E=IR=>5 mV=Ir: where r=change in network 668A';

I=12/(16k+r): where I=current through system: 5 mV/r= 12/(16k+r);

and solving for r yields:

$$r=16k/(12/5 \text{ mV} -1) \approx 7 \text{ ohms}.$$

Therefore, setting network 668A' to 1007 ohms provides 10 mV of hysterisis for all stages. That is, the noise immunity of the entire ADC 660 is controlled by one component. This can be demonstrated by the following example.

If network 668A' drops X more volts than network 668A, then the swapper stage 668 will have a drop of 2+X volts. Therefore, network 668A will have X volts more drop than network 666A, which will have X volts more drop than network 664A, etc.

This technique can also be used to reduce the effect of resistor mismatches due to tolerances. For example, the ADC 660 can be fabricated within a silicon integrated circuit without requiring a subsequent laser trim or some other technique for adjusting component values. The manufacturer need only design the second network of the least significant stage to offset predicted worst case manufacturing variances. The above technique applies where the as-manufactured, untrimmed tolerances are less than ½ LSB.

It might be assumed that the switching of subsequent swapper stages would affect the voltage at the center node of one of the ADC swapper stages. This assumption is correct because the subsequent stage will be effectively open while switching, and the voltage drop across the subsequent stage will increase. However, this phenomenon is desirable since stability in the system is achieved by increasing the voltage drop across the subsequent stage, as was just described.

Furthermore, the switched network type analog to digital converter 660 of this invention overcomes the problems noted above with respect to U.S. Pat. No. 4,769,628. The switched network can be completely isolated from all other components to include its own comparators, therefore the noise in the reference voltages to the comparators can be controlled to a high degree. Also, because the switched network draws the same amount of current regardless of its configuration, there are virtually no current transients at the reference inputs. What small transients do exist occur during switching and add to the stability of the system, as described before. Furthermore, because no opamps are required in the switched network analog to digital converter 660, there are no input offsets to degrade accuracy, or settling times to degrade speed. Although the comparators 662B–668B do exhibit an input offset, the offset is not cumulative as in the case of the opamp embodiment of the prior art successive approximation ADC. Instead, the accuracy of the analog to digital converter 660 will experience a conversion voltage error that is equal only to the largest input offset voltage of one of the comparators 662B–668B.

FIG. 14A shows a swapped network, 4-bit analog to digital converter 680 utilizing an R2 R symmetry. The operation of ADC 680 is identical to the converter 660 of FIG. 13. This embodiment utilizes resistors (R) as the swapped networks, and a resistor of double magnitude (2R) in parallel with the network swapper. The parallel resistor makes the resistance, looking into the reference input terminals 681 and 682, equal to R for each stage. Thus, each stage can be constructed with the same resistance values as the preceding stage. Also, because of the symmetry, the ADC 680 is tolerant to temperature-related effects.

Another feature of ADC 680 is the reduced need for capacitors to maintain the center node voltages while the networks are swapped. This is alleviated, as shown in FIG. 14B, by replacing the 2R resistance by two resistors of value R, connected in series, and attaching the inverting input of the associated comparator 683 to the center node of the series resistances. As a result, the inputs of the comparators 683 do not float when the networks are swapped.

It should be realized that all of the ADC circuits described herein may have speeder/bypass capacitors, such as capacitors 684, connected between either or both reference inputs to their center nodes.

FIG. 9A illustrates a general schematic for the description of the following embodiments of the invention. This schematic diagram shows BINARY network swappers 612, however GRAY network swappers 602 may be substituted as described previously. When all digital inputs are logic zero, the WIPER terminal is shorted to the B terminal and connected to the A terminal through the series connection of all networks. The value P illustrated within each network 900 represents a unit of primary electrical characteristic. That is, P represents a quantity of: volts, Henries, Farads, Ohms, gain, transformer windings, lengths of RF cable, diode drops, or whatever units are of interest. In general, the primary electrical characteristic can be resistance, capacitance, capacitive reactance, inductance, inductive reactance, voltage potential, gain, transconductance, superconductance, time delay, electrical or optical conductor length, winding turns, permeability, and combinations of these primary electrical characteristics. The term "n" represents the number of digital control lines that are used to control the circuit.

It is noted that P represents a primary electrical characteristic, it being realized that secondary electrical characteristics may also be present. For example, the primary electrical characteristic of an inductor is inductance or inductive reactance, although a non-ideal inductor will also have secondary electrical characteristics of resistance and parasitic capacitance or capacitive reactance associated therewith. These secondary electrical characteristics may or may not be a consideration, depending upon the intended application.

Figure 9B:
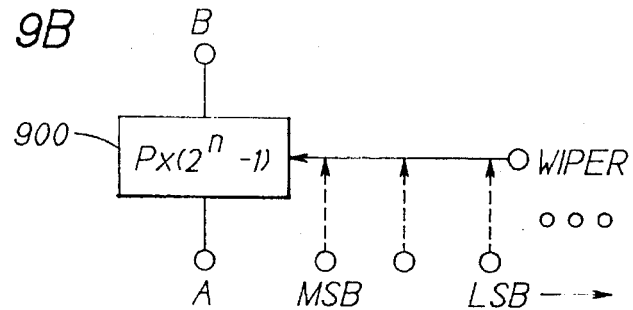
FIG. 9B is a schematic diagram for the general network swapper case of FIG. 9A.

FIG. 9B illustrates a simplified schematic representation of FIG. 9A. It should be noted that the symbol for the network 900 is copied as the controlled body.

For example, to synthesize a 5-bit, 20k ohm potentiometer, then these values are substituted into the equation shown in FIG. 9B, and the unity resistance is found in accordance with:

$$20K=P*(2^n-1),$$

$$P=20k/(2^n-1)=20k/(2^5-1),$$

$$P=20k/31, \text{ or}$$

$$P=645 \text{ ohms}.$$

Substituting this value into the specific network equations in FIG. 9A, and utilizing n=5 network swappers, yields the desired device.

Figure 16A:
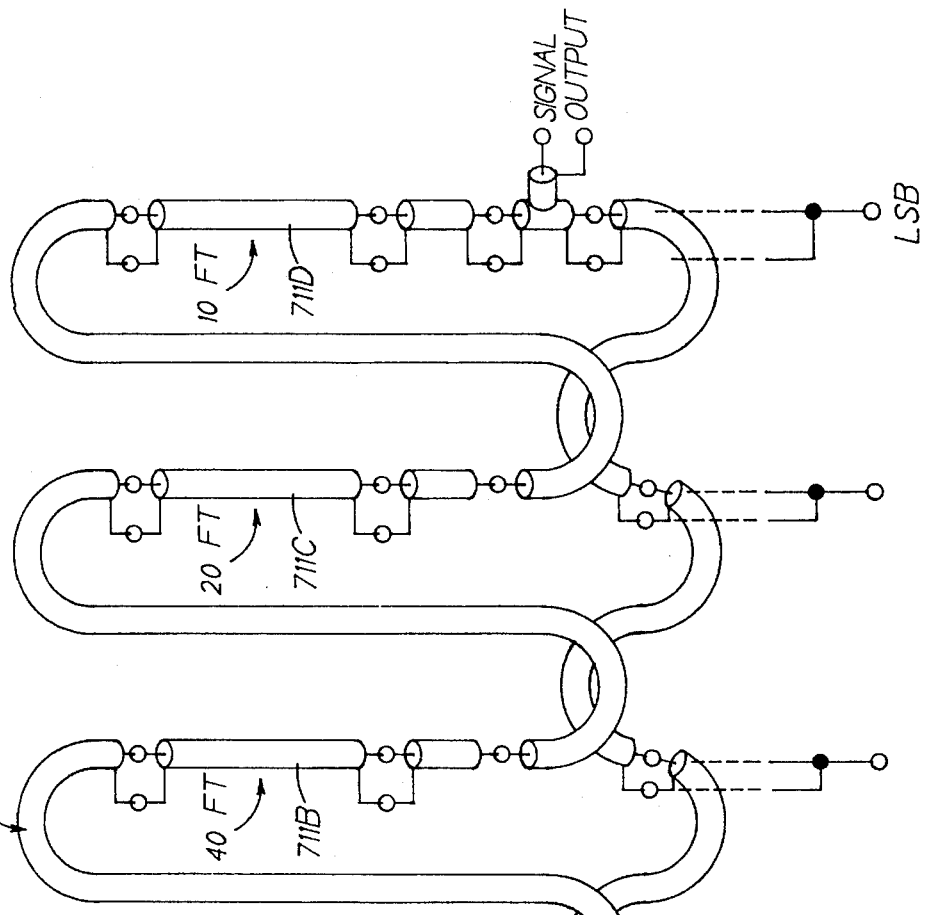
FIG. 16A depicts an n-bit digitally controlled RF delay line.
Figure 16B:
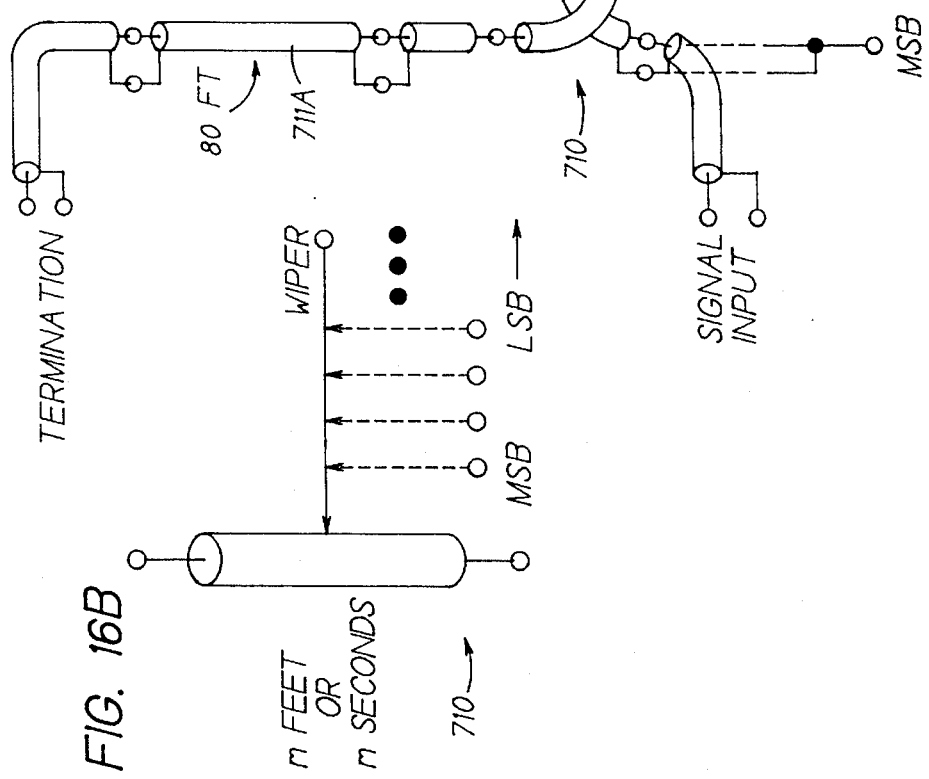
FIG. 16B is a schematic representation of the n-bit digitally controlled RF delay line of FIG. 16A.

FIGS. 16A and 16B illustrate an n-bit digitally controlled RF delay line 710 that is a further embodiment of this invention. This device is constructed with predetermined binarily weighted lengths (P) of shielded cable 711A–711D to provide the delay networks. The total delay from signal input to signal output is a binary function of the value of the digital input. The total delay is controlled by the lengths of the cables 711 and the total number of stages. In the example shown, cable 711A is 80 feet, cable 711B is 40 feet, cable 711C is 20 feet, and cable 711D is 10 feet.

Such a device, which may be referred to as a variable delay network (VDN) or as a delayometer, is useful in constructing a digitally controlled directional antenna system for use in an application wherein directed beam transmissions are desired. The antenna system can be made portable by mounting to a vehicle. A similar antenna can be used for a computer-controlled radio direction finding system. The above antenna systems would include, by example, three whip antennas and three of the variable delay networks 710.

Figure 16C:
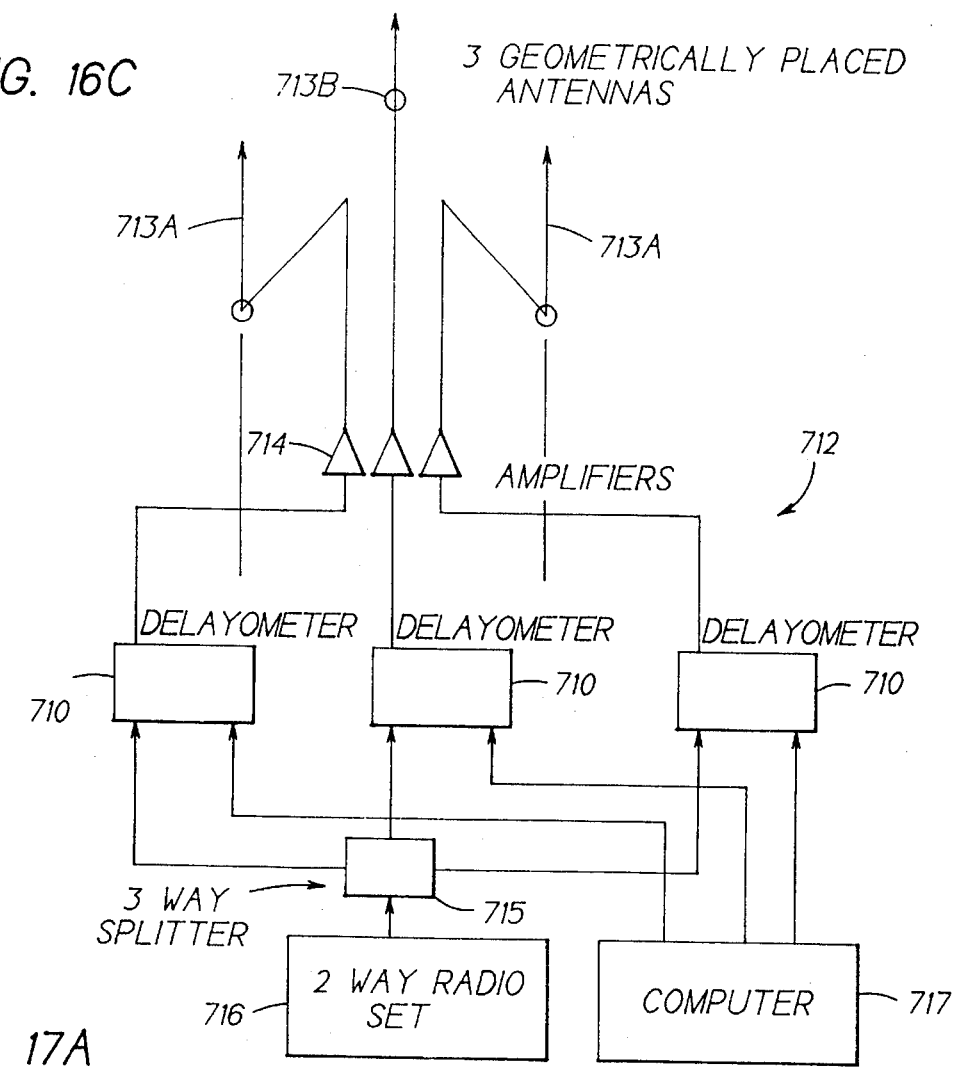
FIG. 16C is a block diagram depicting a computer controlled directional radio set that is constructed with the RF delay lines of FIGS. 16A and 16B.

FIG. 16C depicts a computer controlled directional radio set 712 that includes three of the VDNs 710 of FIGS. 16A and 16B. Three geometrically placed antennas 713A–713C are fed from associated amplifiers 714. Each of the amplifiers 714 is fed from one of the VDNs 710. A three-way splitter 715 receives an input RF signal from a radio set 716 and provides an output to the signal input node of each of the VDNs 710. The digital control input of each VDN 710 is provided from a local controller, such as a data processor 717. In practice, more or less than three antennas and associated VDNs can be employed.

In operation, the data processor 717 controls the VDNs 710 to produce time-delayed versions of the RF signal output by the radio 716. The time-delayed signals are then amplified and transmitted by the geometrically arranged antennas 713A–713C. The specific antenna placement, in conjunction with the time-delayed RF signal, produces radio signal energy that is reinforced in one direction, with respect to the geometric centers of the antennas, and reduced in all other directions. As such, the system functions in a manner analogous to a phased array antenna system. The system includes the advantage that a number of different frequencies can be transmitted. The system may also be employed as a unidirectional receiver.

Figure 17A:
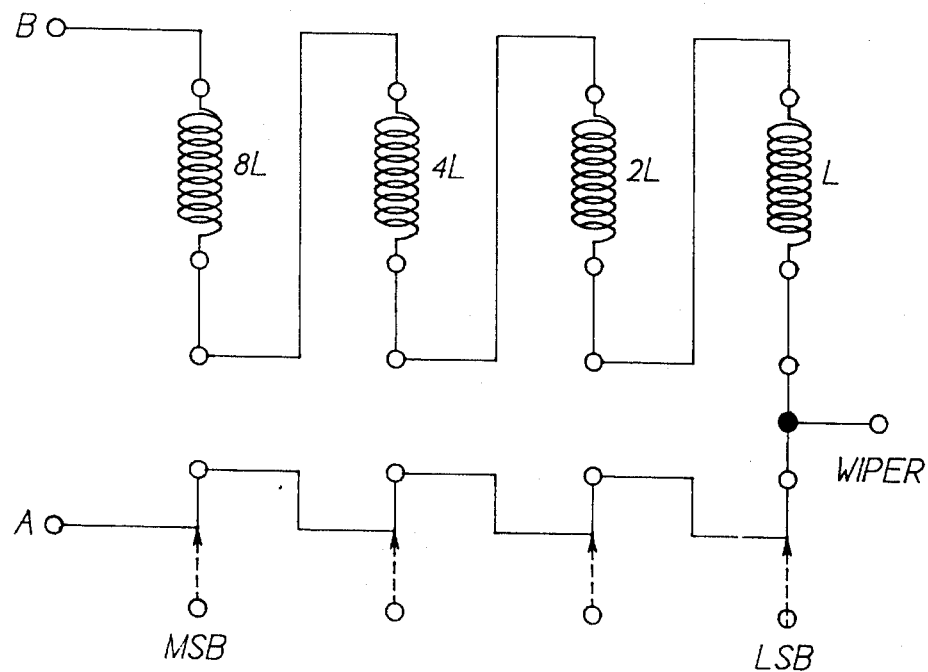
FIG. 17A illustrates an n-bit inductive reactometer.
Figure 17B:
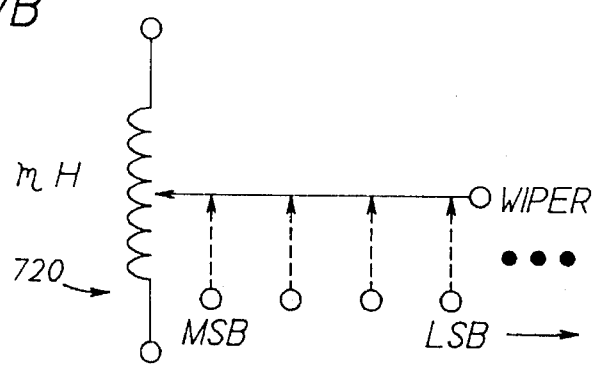
FIG. 17B is a schematic representation of the n-bit inductive reactometer of FIG. 17A.

FIGS. 17A and 17B illustrate a potentiometer constructed with inductance instead of resistance, also referred to herein as an n-bit digitally controlled reactometer 720. The reactometer 720 is also constructed in accordance with the schematic representation of FIG. 9B. For example, to synthesize a 5-bit, 20 mH reactometer, then these values are substituted into the equation shown in FIG. 9B, and the unity inductance is found in accordance with:

$20mH=P*(2^n-1)$, $P=20mH/(2^n-1)=20mH/(2^5-1)$, $P=20mH/31$, or $P=645\mu H$.

Substituting this value into the specific network equations in FIG. 9A, and utilizing n=5 network swappers, yields the digitally controlled reactometer 720.

In FIGS. 17A and 17B the primary electrical unit (P) of interest is Henries. The inductive reactance between the WIPER terminal and the A terminal is binarily weighted with respect to the digital inputs. The inductive reactance between the WIPER terminal and the B terminal is binarily weighted with respect to the compliment of the digital inputs.

Figure 18A:
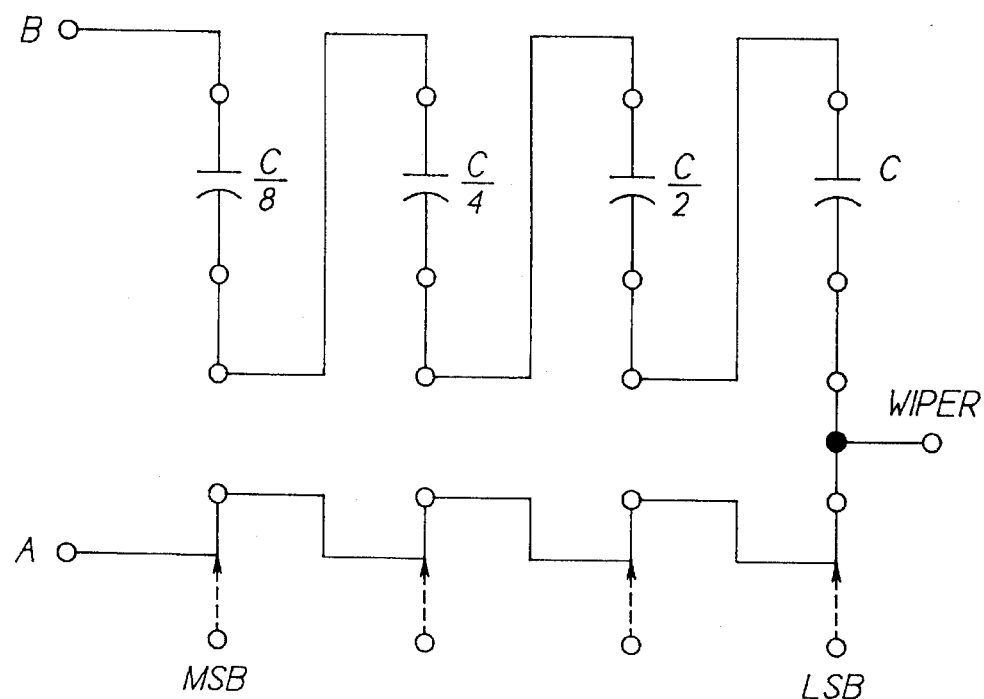
FIG. 18A illustrates an n-bit capacitive reactometer.
Figure 18B:
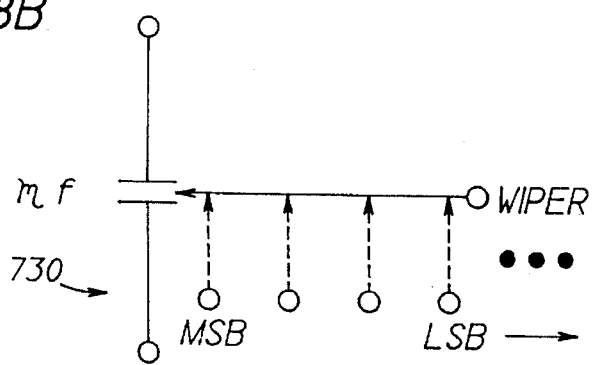
FIG. 18B is a schematic representation of the n-bit capacitive reactometer of FIG. 18A.

FIGS. 18A and 18B illustrate the teaching of this invention when applied to capacitance, thereby providing a capacitive reactometer 730. In FIGS. 18A and 18B the primary electrical unit (P) of interest is capacitive reactance, which is inversly proportional to the electrical units of Farads. The capacitive reactance between the WIPER terminal and the A terminal is binarily weighted with respect to the digital inputs. The capacitive reactance between the WIPER terminal and the B terminal is binarily weighted with respect to the compliment of the digital inputs.

Capacitive reactance=$1/2\pi fc=1/\omega c$

If P (incremented value of capacitive reactance) is set equal to $1/\omega c_P$, where $c_P$ is the capacitance that relates to the incremental value of capacitive reactance, and if the total capacitive reactance is set to $1/\omega c_T$, where $c_T$ is the total effective capacitance of the network, then $P=1/\omega c_T(2^n-1)$.

Total capacitive reactance equals $P*(2^n-1)$ or $1/\omega C_T=(2^n-1)\omega C_P$, and $C_P=C_T(2^n-1)$.

Substituting $C_P$ back into the equation for P yields:

$P=1/C_T(2^n-1)\omega$.

For example, assuming a 5-bit system then $P=1/C_T(2^5-1)\omega=1/C_T(31)\omega$ and $2P=2/C_T(2^5-1)\omega$ $2P=2/C_T(31)\omega$ and $4P=4/C_T(2^5-1)\omega$ $4P=4/C_T(31)\omega$ and $8P=8/C_T(2^5-1)\omega$ $8P=8/C_T(31)\omega$.

Figure 19A:
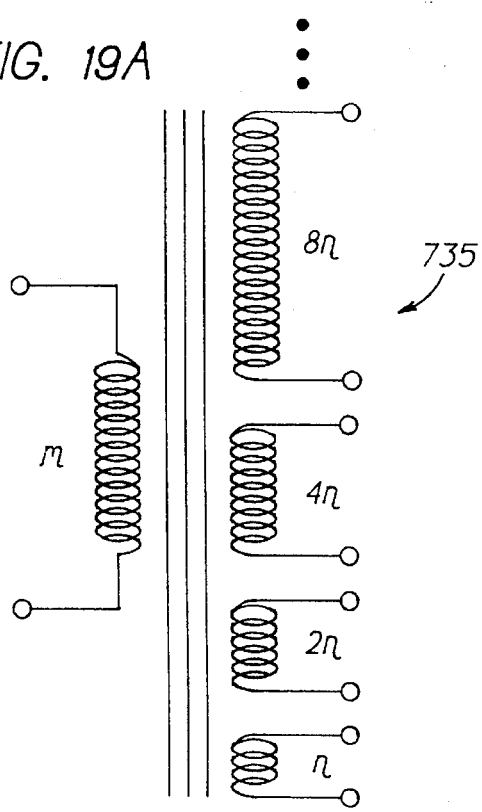
FIG. 19A illustrates an n-bit digitally controlled transformer.
Figure 19B:
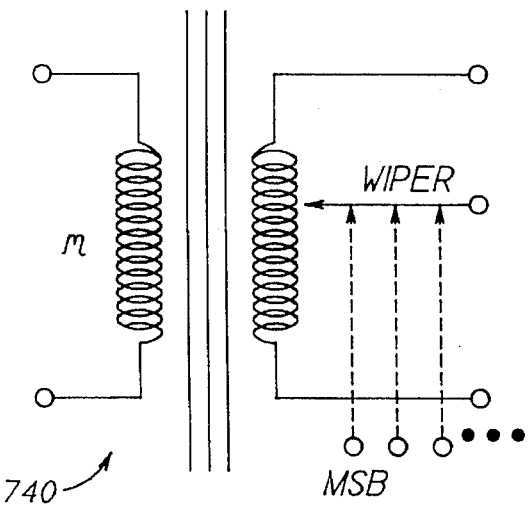
FIG. 19B is a schematic representation of the n-bit digitally controlled transformer of FIG. 19A.

FIG. 19A depicts a transformer 735 having binarily weighted secondary windings. These windings, when employed as the networks shown in FIGS. 9A and 9B, yield a transformer having a secondary with a digitally controllable center tap. The equivalent symbol for such a device is shown in FIG. 19B. The swapped network technique is applicable also to the primary winding, and to transformers having both primary and secondary windings that are constructed with digitally controlled swapped networks. In FIG. 19B the primary electrical characteristic of interest (P) is the number of winding turns (primary and/or secondary).

Such digitally controlled transformers have utility in a wide variety of applications including, but not limited to, RF power matching units and switched power supplies.

FIG. 20 illustrates a variable voltage source 750 that is binarily adjusted in units of diode junction voltage drops. For the illustrated 4-bit configuration, the four swapped networks include 8, 4, 2, and 1 diodes, respectively. In this circuit, the WIPER voltage with respect to the A terminal is measured in diode junction voltage drops. The B terminal is driven by a constant current source while the A terminal is clamped to a voltage source, such as circuit ground. If desired, the circuit can be configured as an ADC by providing comparators and an analog signal input terminal that are connected as shown in FIG. 13.

Figure 21:
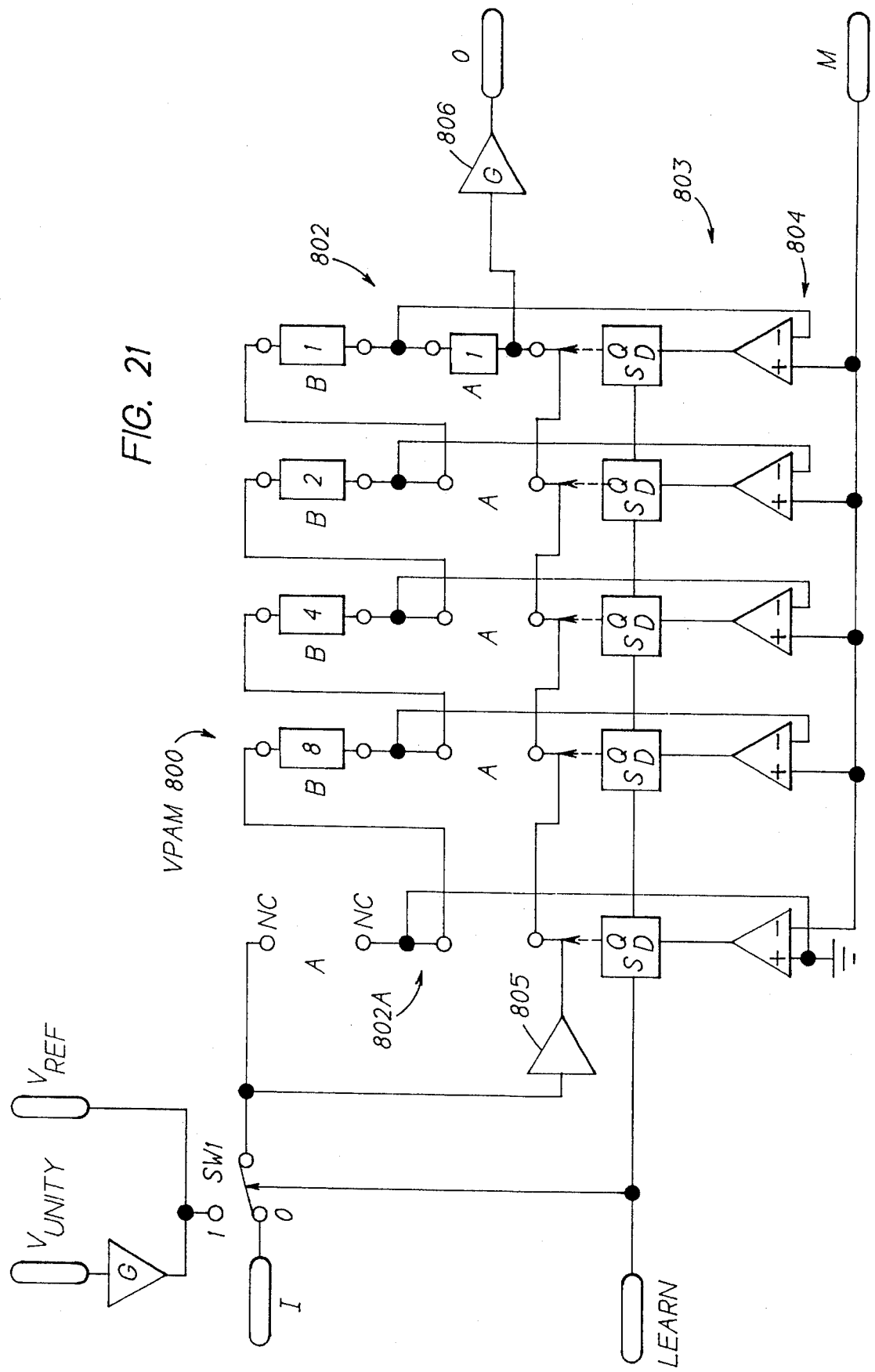
FIG. 21 illustrates a four-bit Voltage Programmable Analog Multiplier (VPAM) constructed with swapped networks.
Figure 22:
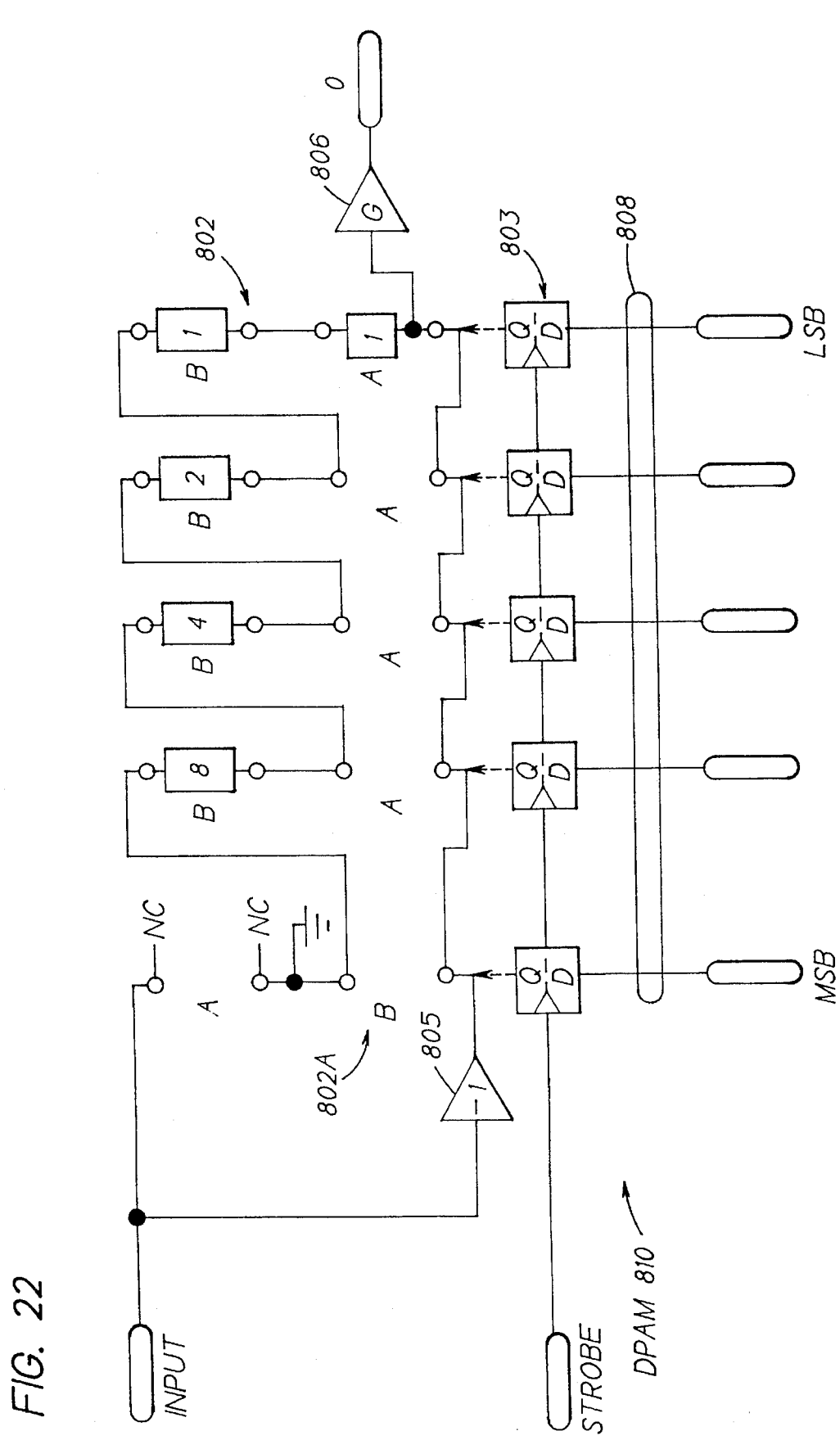
FIG. 22 illustrates a four-bit Digitally Programmable Analog Multiplier (DPAM) constructed with swapped networks.

Reference is now made to FIGS. 21 and 22 for showing a Voltage Programmable Analog Multiplier (VPAM) 800 and a Digitally Programmable Analog Multiplier (DPAM) 810, respectively, both of which employ swapped networks. The VPAM 800 and the DPAM 810 both operate in a similar manner, but differ in the manner that they are programmed. As such, the operation of the VPAM 800 will described in detail, it being realized that the DPAM 810 operates accordingly except for the programming function as described in detail below.

Figure 23:
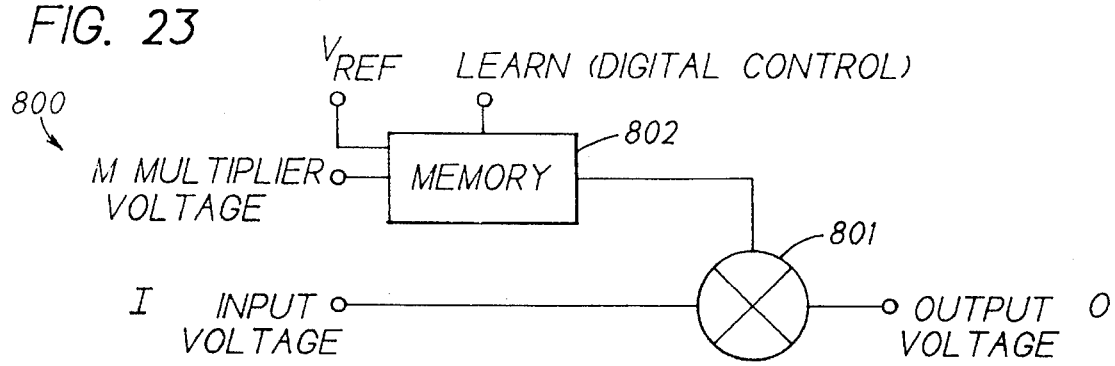
FIG. 23 is a simplified block diagram of the VPAM of FIG. 21.
Figure 24:
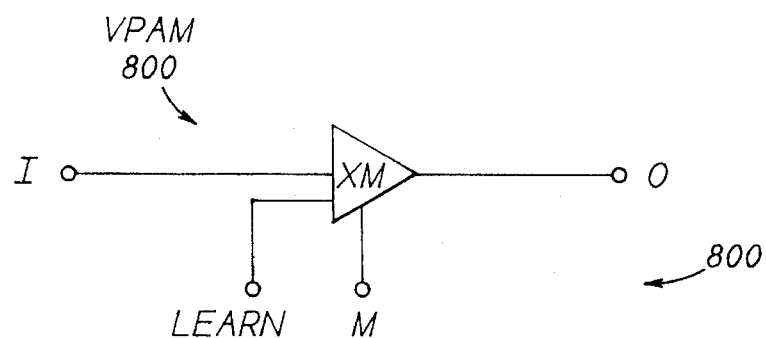
FIG. 24 is a schematic representation of the VPAM.
Figure 25:
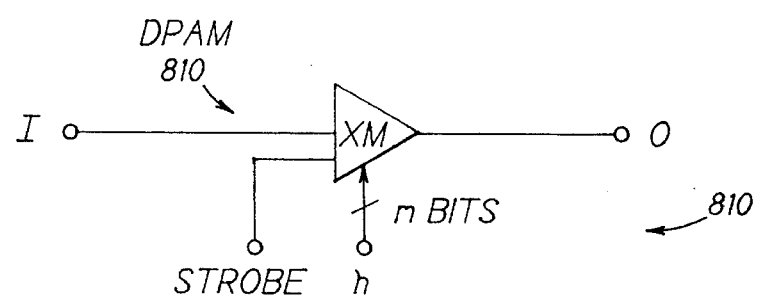
FIG. 25 is a schematic representation of the DPAM.

Referring to FIG. 23, an input voltage I is multiplied by a constant stored within a memory element before being passed to an output O. The multiplier element 801 and the memory element 802 are constructed utilizing the switched network technology of this invention. The memory element also receives a voltage reference and a digital control input designated LEARN. FIG. 24 is a general schematic depiction of the VPAM 800, while FIG. 25 is a general schematic depiction of the DPAM 810.

Referring now to FIG. 21, when the LEARN input goes active, the input is connected via a switch SW1 to $V_{REF}$. This places the switched network array 802 into an ADC mode where the full scale voltage is $V_{REF}$ to $-V_{REF}$, and where $-V_{REF}$ =binary 00000 and $+V_{REF}$=binary 11111. While the LEARN signal is active a plurality of latches 803 that are coupled to the outputs of comparators 804 are in a transparent mode, thereby allowing the ADC conversion process to propagate from stage to stage. The voltage being converted is the voltage appearing at the M input. The swapped network designated 802A (the left-most network shown in FIG. 21) implements a sign function. If the M voltage is less than zero, this will swap the remainder of the swapped networks 802 into the $-V_{REF}$ to zero range. Conversely, if the M voltage is greater than zero then sign stage 802A swaps the remaining stages 802 into the zero to $+V_{REF}$ range. The stages 802 perform the ADC conversion function as described previously.

When the LEARN signal goes inactive, the latches 803 retain the state of the comparator 804 outputs. The input (I) is then applied to the input of the sign stage 802A via SW1. If the sign of the M signal was negative, then the input signal is inverted by inverter 805, else the input signal is passed to the ADC stages where it is attenuated in a manner similar to that described above for the swapped network potentiometers. The output of the network swapper stages 802 is applied to an opamp multiplier 806 which has a gain (G) that adjusts for the attenuation.

Based on the foregoing description, it can be realized that the first swapper stage 802A applies the sign of the multiplier to the input signal. The multiplier is represented in twos compliment. If the multiplier is negative the subsequent swapper stages 802 are connected between ground and the inverted input signal. If the multiplier is positive, then the subsequent stages are coupled to the input signal and ground, respectively. The letters "A" and "B" in FIG. 21 represent the parity of the swapper stages. A represents the side that the subsequent stages will be coupled to if the digital input of the swapper is logic low. Likewise, if the digital input is logic high, then the B side is connected to the subsequent stages.

After passing through the sign swapper stage 802A the input signal is divided by the subsequent stages by an amount proportional to the twos compliment of the digital input. The divided signal is then passed to amplifier 806.

The DPAM 810 of FIG. 22 operates similarly except that the contents of the latches 803 are computed and then programmed via digital signal lines 808, thereby eliminating the requirement for the comparators 804, the L and M inputs, $V_{REF}$, and switch SW1. The DPAM 810 includes an additional STROBE signal for storing the digital input 808 within the latches 803. For the DPAM 810, the digital input is stored by latches 803 of either the edge triggered or level triggered type. The DPAM 810 can be extended to any number of bits by continuing the illustrated pattern. The DPAM 810 can also be constructed with GRAY network swappers of a type depicted in FIGS. 6A and 6B.

Figure 26:
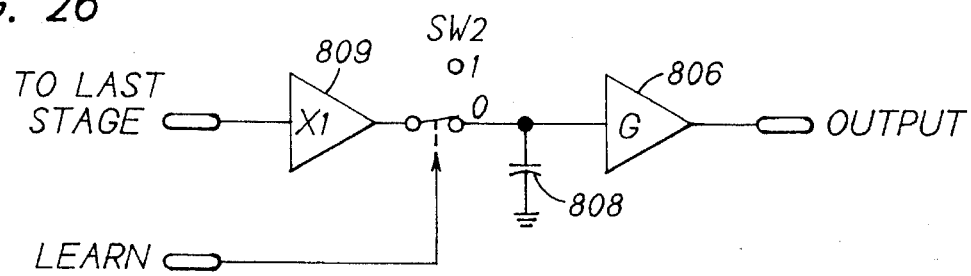
FIG. 26 is a schematic diagram showing an embodiment of an output hold amplifier.
Figure 27:
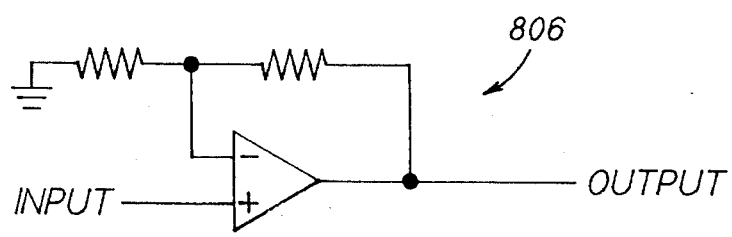
FIG. 27 is a schematic diagram illustrating in greater detail the amplifier G in FIG. 26.

FIG. 26 illustrates an output/hold amplifier for the amplifier 806 of FIG. 21. In this case, the LEARN signal being active uncouples the output of the networks 802, via switch SW2, from the input to the amplifier 806. The input of the amplifier 806 has a storage capacitor 808 connected thereto for maintaining the output (O) at the previous level while the LEARN function is being executed. A buffer amplifier 809 is provided for isolation. FIG. 27 illustrates a suitable embodiment for the amplifier 806 for the embodiments of FIGS. 21, 22, and 26.

It should be noted that if a common clock signal is coupled both to the LEARN input and the output sample and hold output stage of the VPAM 800 then a discreet multiplier is realized, wherein the output O equals MXI delayed by one clock cycle.

The transfer function of an m-bit DPAM 810 with a digital input n is:

$$O=InG/(2^{m-1}).$$

As was described, for the VPAM 800 the digital signal is stored in the transparent latches 803. The VPAM 800 is thus similar in operation to an analog memory. When a new multiplier is required to be learned, the user applies the desired multiplier to the M input, then asserts the LEARN signal. The asserted LEARN signal applies the reference voltage to the input, as well as causing the latches to become transparent. In some implementations it may be desired to have the output voltage stable while the VPAM 800 is learning. In this case, the output buffer amplifier 806 can include a hold function, as described above with respect to FIG. 26. The M voltage is applied to the inputs of the comparators 804. While the latches are transparent, the VPAM 800 functions as an analog to digital converter (ADC), thereby deriving its own digital input through the transparent latches. When the ADC becomes stable, the LEARN input is deasserted, and the analog multiplier becomes operational with a most-recently learned digital input.

The digital value (n) of the VPAM 800 after LEARN has been asserted, where m is the number of bits of the VPAM 800, is given by:

$$n=M2^{(m-1)}/V_{REF} \text{ (where n is two's compliment)}$$

The output (O) for both the VPAM 800 and the DPAM 810 is given by:

$$O=G(In/2^{(m-1)}),$$

where m=number of bits.
Therefore $$O=G(IM2^{(m-1)}/2^{(m-1)})/V_{REF}, \text{ or}$$

$$O=GIM/V_{REF}.$$

To obtain:

$$O=IM,$$

then $VREF/G=V_{UNITY}$, where $V_{REF}=G(V_{UNITY})$.

Thus, $$O = IM/V_{UNITY}$$

$V_{UNITY}$ is the unity reference, and defines what voltage is equivalent to the numeral 1. By example, if $V_{UNITY}$ is equal to 3 volts, and I=2 (UNITY) and M=3 (UNITY), then 6 (UNITY)=(2 (UNITY)) (3 (UNITY))/UNITY.

For most applications, including the neural network applications that are described below with respect to FIG. 28 and FIG. 29, $V_{UNITY}$ can be set equal to 1 volt. This leaves O=I×M.

The magnitude of G is an important consideration. In that the swapped network functions as a dividing element, the maximum gain is 1. The G amplifier 806 thus provides a capability to achieve gains of greater than unity, as well as fractional gains.

The illustrated embodiments of the VPAM 800 and DPAM 810 both have one sign bit and four bits of division. To determine a value of G to allow optimization, we first describe the effect of G in terms of:

maximum swing=$(G2^m/2m-2)=2G$ (peak to peak), and incremental gain=$\pm G(1/(2^{m-1}))$.

To determine the magnitude of G the voltage limits of the outputs should be known, that is, the peak output voltage $P_O$ and the peak input voltage $P_I$. Thus, $G=P_O/P_I$.

To determine $V_{REF}$ the unity voltage, the voltage that equals the number 1, is multiplied by G. That is, $V_{REF}=G(V_{UNITY})$.

To determine the number of bits (m) of resolution required, the largest desired incremental change of the output for the peak input should be determined:

$\Delta O=P_I G/2^{m-1}$, and $2^{m-1}=P_I G/\Delta O \Rightarrow M=\log_2(P_I G/\Delta O)+1$ (rounded-up to nearest whole integer).

As an example of a neural network application, the peak input voltage is 1 v, a desirable peak output voltage is $10_v$, and a desirable incremental output (resolution) ≈1/10 v. Therefore:

$V_{UNITY}=1$ volt $G=10/1=10$ $V_{REF}=G(1)=10$ volts $M=\log_2((1)(10)/1/10)+1$ $=\log_2(100)+1$ $=6.64+1=7.64\approx 8$ bits.

If the output resolution is sufficiently low, then all active components can be constructed without the need to laser tune the circuit.

If CMOS or similar comparators are used, then the network divider elements can be fashioned in units of megaohms. Thus, the above described 8-bit VPAM or DPAM embodiment would have a total of 128 megaohms of resistance.

Figure 28:
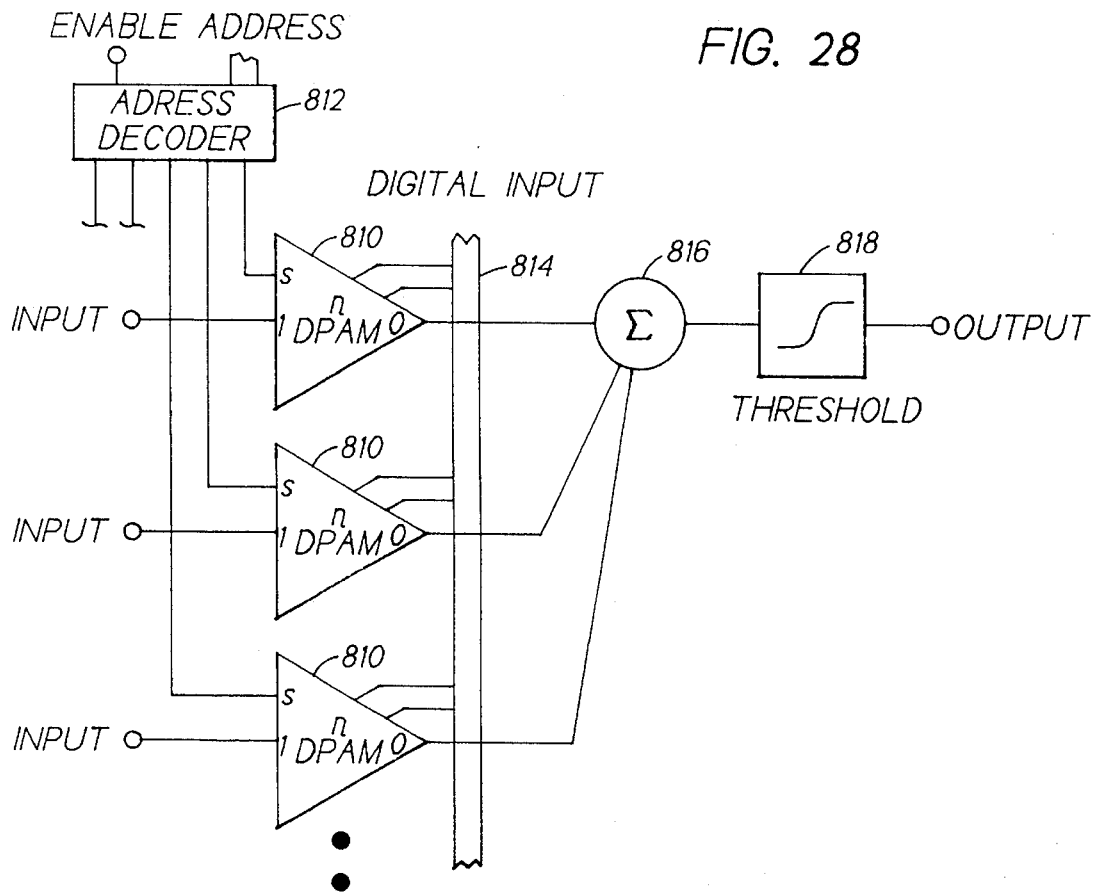
FIG. 28 illustrates one unit of a digitally programmable neural network (DPNN) constructed with DPAMs in accordance with FIG. 25.

FIG. 28 illustrates the use of the DPAM 810 in constructing an artificial neural network. A plurality of DPAMs 810 are selectively strobed by an address decoder 812 so as to store a digital input appearing on a common bus 814. The outputs of the DPAMs 810 are applied to a summation network 816 which has an output coupled to a threshold comparator 818.

Figure 29:
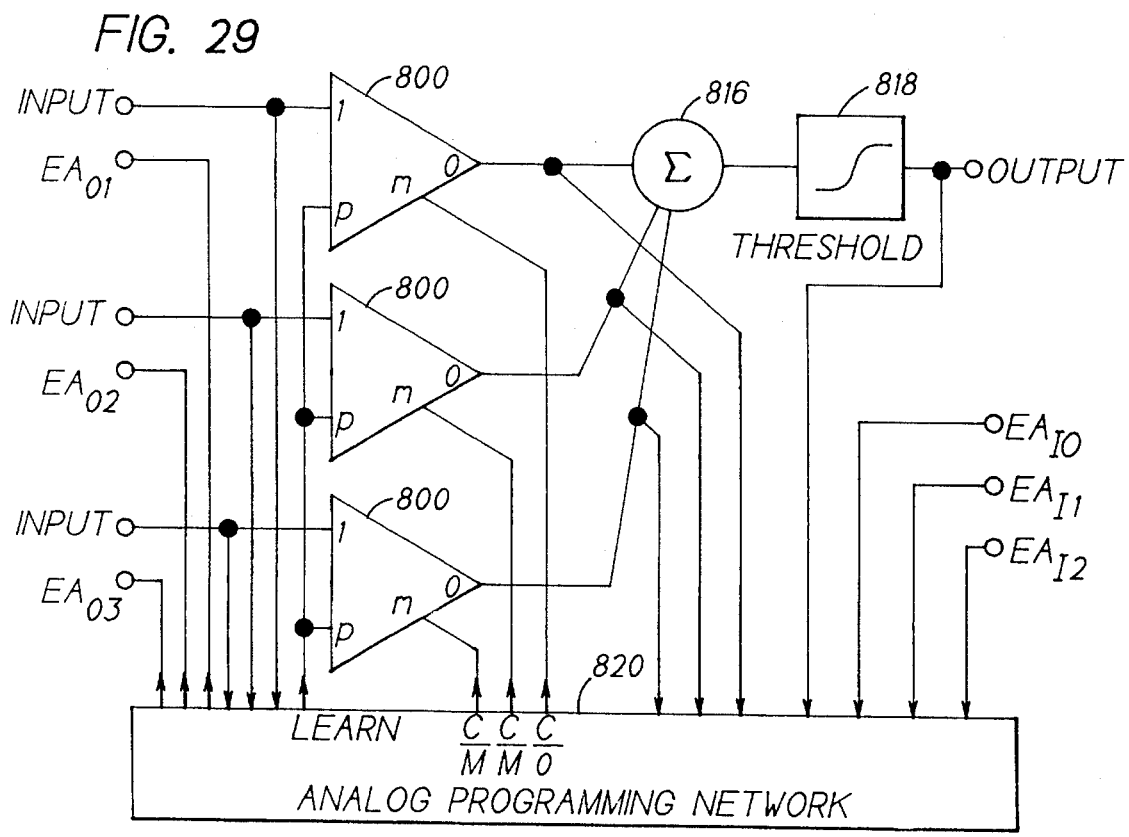
FIG. 29 illustrates one unit of an analog programmable neural network (APNN) constructed with VPAMs in accordance with FIG. 24, and further including an analog voltage programming network.

FIG. 29 illustrates the use of the VPAM 800 in constructing an artificial neural network. A plurality of VPAMs 800 are selectively trained by an analog programming network 820. The analog programming network 820 applies voltages to the M inputs of the VPAMs 800, and then asserts the LEARN signal line to cause the VPAMs 800 to convert and store a binary equivalent to the input M voltage, as described previously. The outputs of the VPAMs 800 are applied to the summation network 816 which has an output coupled to the threshold comparator 818.

The analog programming network 820 can be constructed with a back propagation circuit that utilizes the error signals ($EA_{IN}$ inputs on the right of the FIGURE) in conjunction with other signals from within the network to derive correction for the VPAMs as well as $EA_{On}$ signals that are output to previous layers of network. The programming network 820 can be realized with a number of suitable circuit embodiments.

FIG. 28 shows a neural network that is programmed by an external data processor. This technique allows a pre-learned set of weights to be rapidly loaded, and has a lower per network cost as compared to the embodiment of FIG. 29. However, because the desired learning algorithm (for example back propagation) must be propagated externally, this technique trades off a reduction in complexity and parts for an increase in learning time. Learning time is dramatically increased by the resident programming circuit depicted in FIG. 29.

Having described in detail the swapped network embodiments of the invention, a description is now made of further embodiments of synchronous data conversion circuitry.

An aspect of this invention is the use of an edge triggered sample and hold (ETSH) that stores the output of a previous conversion cell so that the previous cell can initiate a next conversion. This technique can be considered to be a variation of a pipelining technique, as depicted in FIG. 8 of the above-referenced U.S. Pat. No. 5,202,687.

Figure 30A:
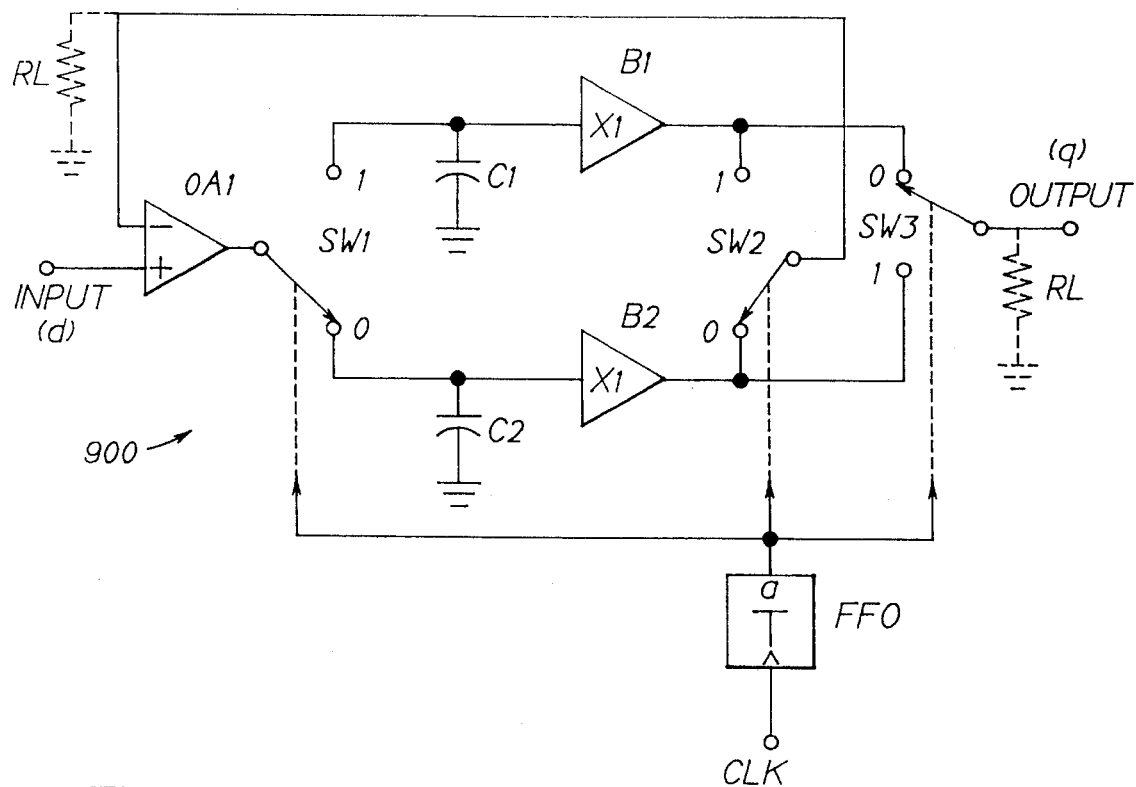
FIG. 30A is a block diagram of an edge triggered sample and hold (ETSH) circuit.
Figure 30B:
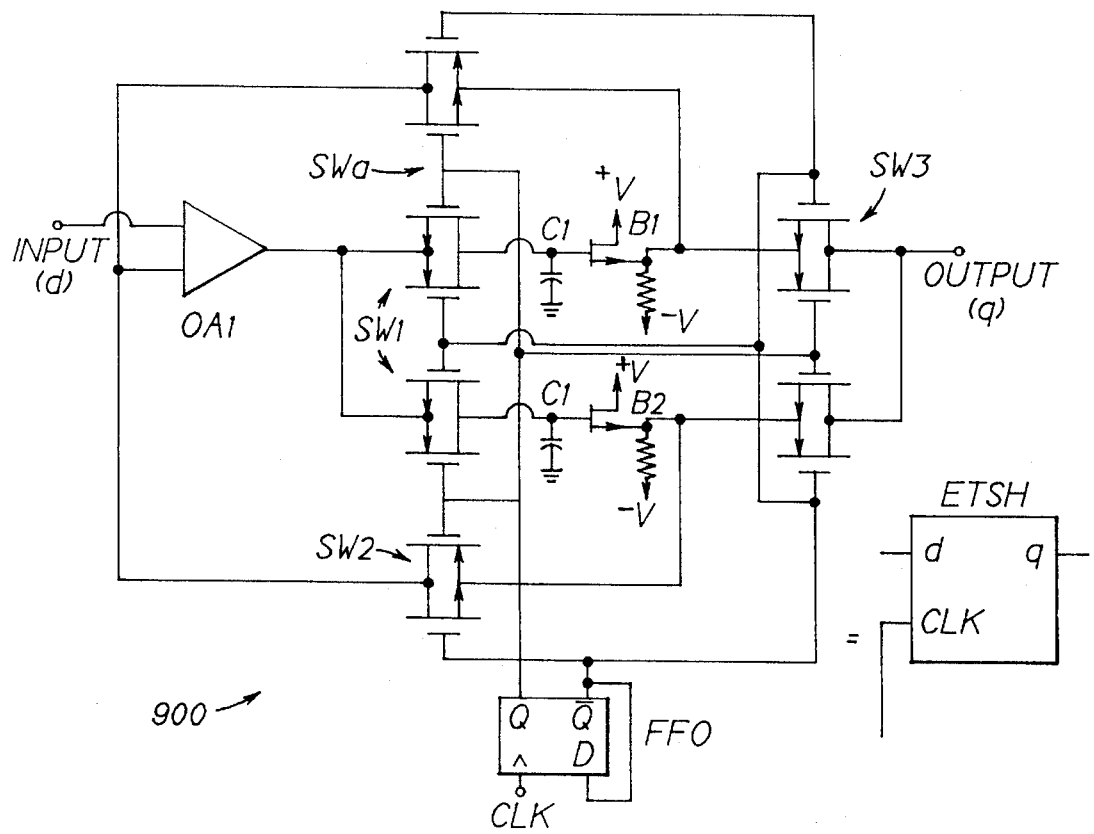
FIG. 30B is a schematic diagram of the ETSH circuit of FIG. 30A, the figure also depicting a schematic representation for the ETSH.

FIG. 30A is a block diagram of the presently preferred ETSH 900, and FIG. 30B is a schematic diagram of same. In operation, B1, C1 and B2, C2 form two separate storage nodes. SW1, SW2 and OA1 perform the loading of a storage node with a signal appearing at the input. SW3 operates to read a selected one of the storage nodes. The toggle flip-flop FF0 synchronizes the operation of the ETSH 900 such that one storage node is read while the other is loaded. The schematic representation of the ETSH 900 that is shown in FIG. 30*b* is similar to that of a D flip-flop. However, the "D" input and "Q" output are both expressed in lower case ("d" and "q") to signify that the circuit element inputs and outputs an analog signal.

Features of the ETSH 900 include the following. First, the accuracy and speed are dependent primarily on the opamp OA1. Furthermore, in that OA1 is always connected to the input, it will track a time-varying input signal. Second, B1 and B2 can be simple JFET followers. However, if MOSFETs are employed instead then the storage capacitors C1 and C2 may not be needed, in that the input capacitance of the MOSFET may be sufficient. Third, C1 and C2 are actively driven, thereby reducing sampling time. Fourth, buffer errors are nullified by feedback through SW2 to OA1. Fifth, for high accuracy requirements OA1 may be replaced by a chopper stabilized opamp, although operating speed is reduced.

Figure 31:
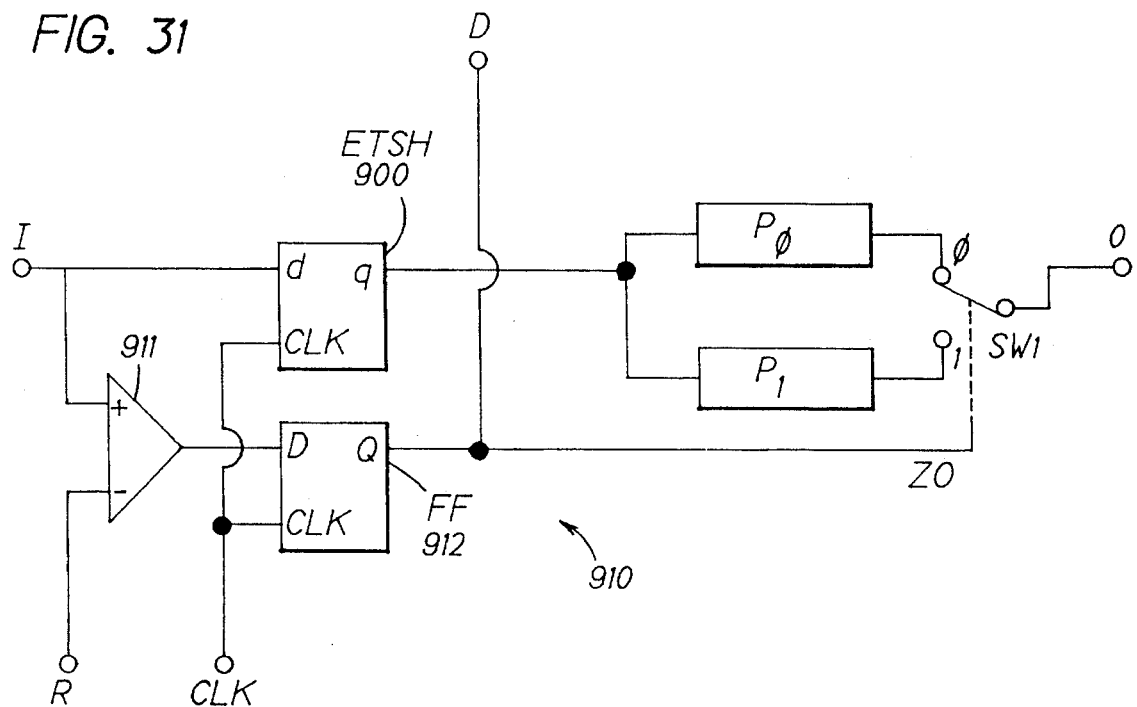
FIG. 31 is a block diagram of a synchronous analog to digital converter that employs the ETSH circuit of FIGS. 30A and 30B.

FIG. 31 shows the general form of a synchronous ADC 910, which may be employed for analog to digital conversion, compression analog to digital conversion, or other circuits for extracting a digital representation of an analog signal. The synchronous ADC 910 employs the ETSH circuit 900 of FIGS. 30A and 30B. In general, the contents of the analog processing blocks $P_0$ and $P_1$ determine the functionality of the ADC 910.

A description of the operation of the synchronous ADC cell 910 of FIG. 31 is as follows. Following a rising edge of the clock signal applied to the CLK input, the ETSH 900 swaps its internal S/H circuits; the S/H that was sampling is now holding and outputting information to the analog processes P0 and P1. The analog processes P0 and P1 have at least one analog input and an analog output. The S/H that was holding then begins to sample the input I. Setting time is provided to allow the comparator to settle, thus performing these operations in parallel. The rising edge of the output of comparator 911 is presented to the input of flip-flop 912, which selects the desired analog process to present its output. Thus, the analog process can start without having to wait for the switch SW1 to close.

In greater detail, on the rising edge of the clock (CLK) the following occurs:

1) sampling for conversion N+1;

2) comparison for N+1;

3) analog process for conversion N; and 4) selection for output of conversion N.

In that all four processes occur simultaneously and in parallel, the longest settling time of the above dictates the sampling frequency.

Should the analog input signal be close to the threshold (R) of comparator 911, the ADC 910 may become unstable. However, the synchronous ADC of this invention overcomes the instability problems that plague many converter implementations of the prior art. That is, should the comparator begin to toggle due to instability, the flip-flop 912 with either select 0 or 1 when it samples. In a BINARY ADC constructed with a plurality of the cells 910, if a 1 is selected by the flip-flop 912, then all subsequent stages will go to zero, and if a zero is selected then all subsequent stages will saturate and produce a logic high at their outputs. That is:

01111 ... or 10000 ...

In that these two outputs differ by only 1 LSB, a perfectly desirable result is achieved. That is, an unstable comparator will not disrupt subsequent stages as will occur in many systems of the prior art, including those found in U.S. Pat. Nos. 4,611,196, 4,684,924, 4,769,628, 4,994,808, and 4,978, 959. For example, in U.S. Pat. No. 4,611,196 an unstable comparator will alternately connect and disconnect a capacitor between a reference ladder and ground. This action will cause transients along the reference ladder which further reduces the stability of the converter, as well as the accuracy.

Figure 32:
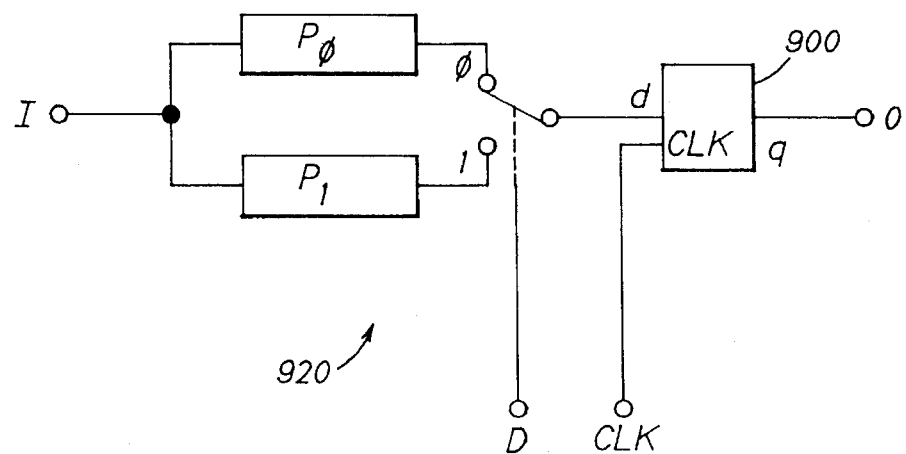
FIG. 32 is a block diagram of a reverse converter cell that employs the ETSH circuit of FIGS. 30A and 30B.

FIG. 32 illustrates a reverse converter cell 920 that includes the ETSH 900. This cell can perform a synchronous digital to analog conversion function, or any function where digital data (D) is applied to a discrete analog signal. As in FIG. 31, the contents of the analog processing blocks $P_0$ and $P_1$ determine the functionality of the reverse converter cell 920.

Figure 33:
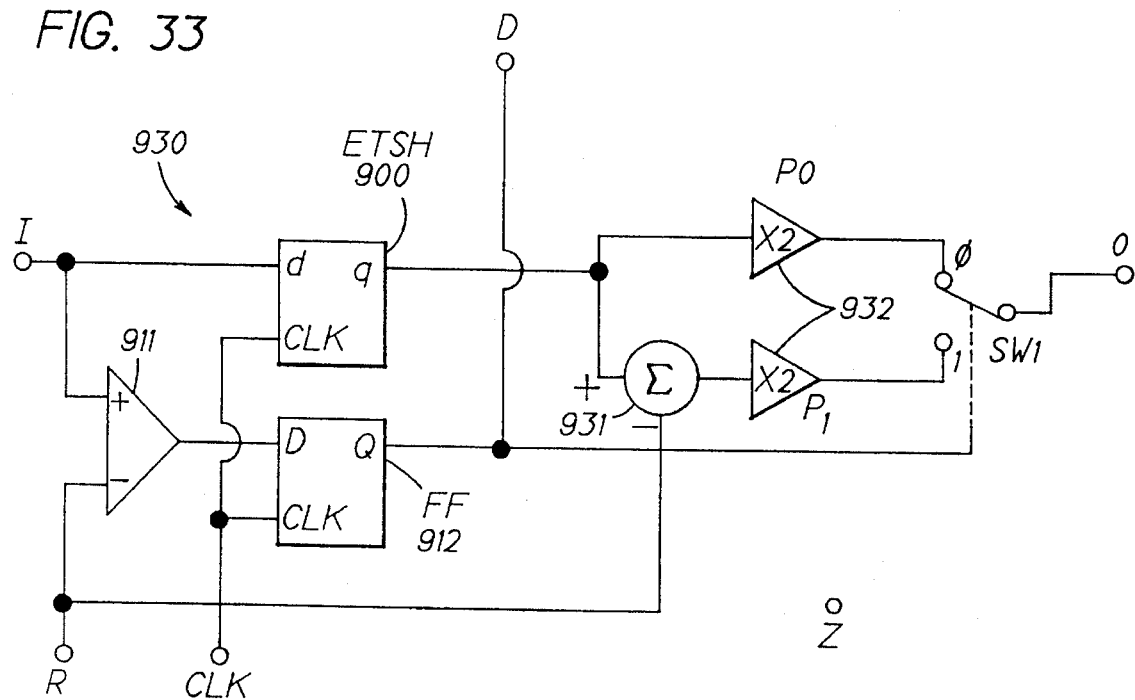
FIG. 33 is a block diagram of a synchronous, binary ADC cell that employs the ETSH circuit of FIGS. 30A and 30B.

FIG. 33 illustrates a synchronous, binary analog to digital converter (ADC) cell 930 that includes the ETSH 900. The cell 930 passes a sampled signal (multiplied by two) to a subsequent cell if the signal is less than the reference R, otherwise, the reference R is subtracted by element 931, and the result is multiplied by two by element 932 as it is passed to the subsequent stage. If speed is not critical, a simplification may be achieved by removing ×2 amplifiers 932 and placing one ×2 amplifier at the output of SW1.

Alternatively, both ×2 amplifiers can be removed and the input reference (R) can be appropriately scaled for each cell, such as by the use of a ladder network.

Figure 34:
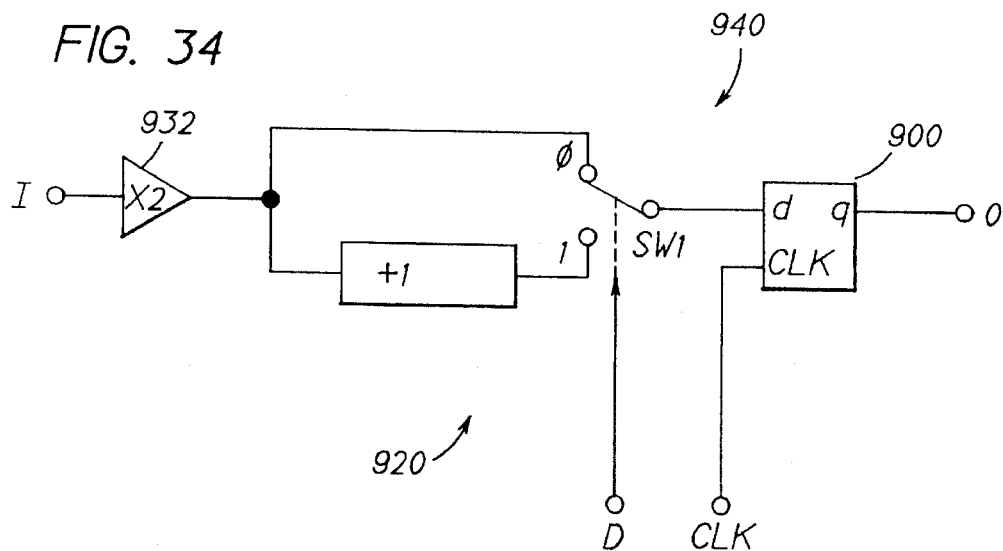
FIG. 34 is a block diagram of a synchronous, binary DAC cell that employs the ETSH circuit of FIGS. 30A and 30B.

FIG. 34 is a block diagram of a synchronous, binary digital to analog converter (DAC) cell 940 that performs the opposite function of the synchronous ADC cell 930 of FIG. 33. SW1 is controlled to select either the input voltage ×2, or the input voltage times 2+$V_{UNITY}$, for application to the input of the ETSH 900.

Figure 35:
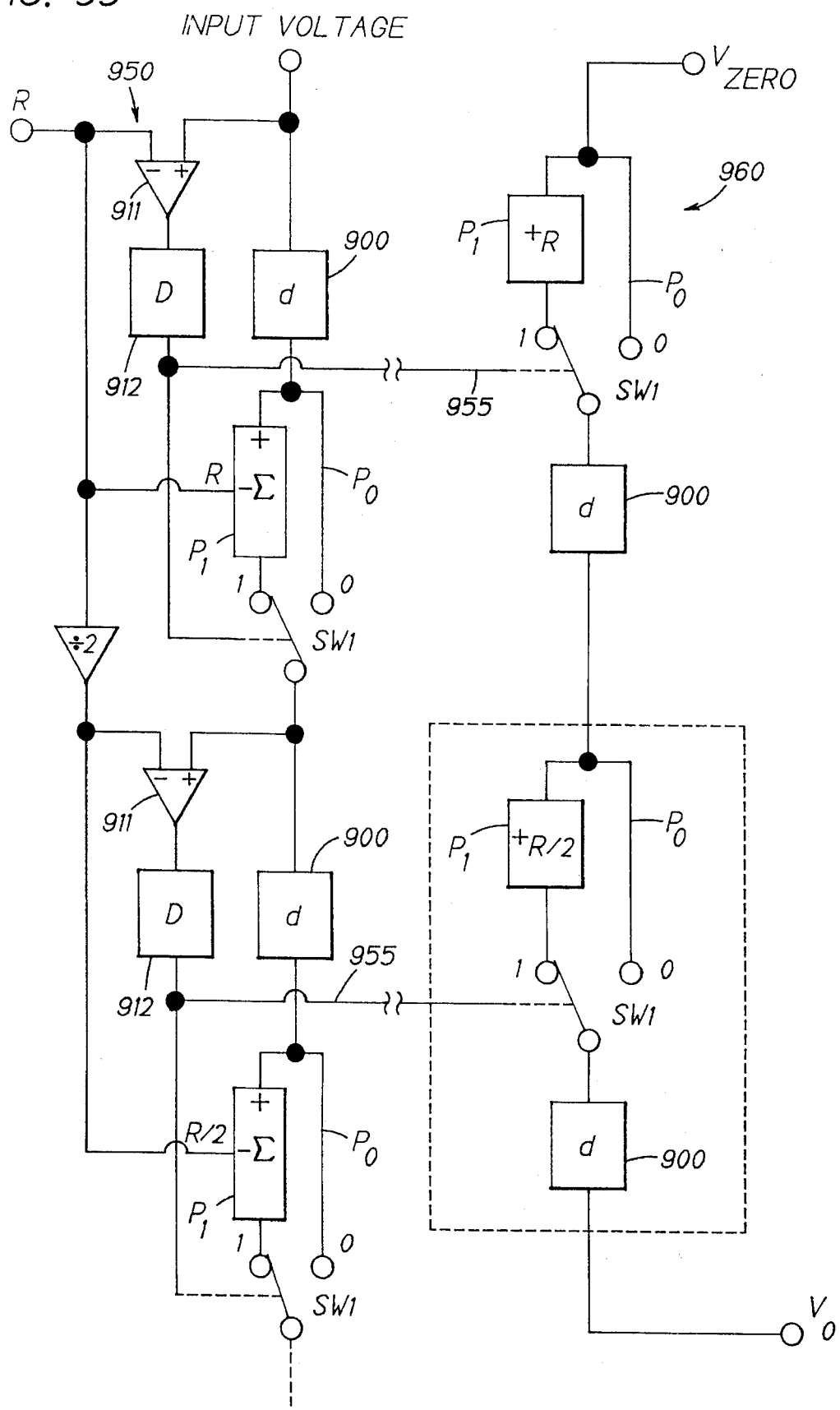
FIG. 35 is a block diagram of a synchronous, two-bit binary ADC that employs the ETSH circuit of FIGS. 30A and 30B, and that feed a synchronous, two-bit binary DAC that also employs the ETSH circuit of FIGS. 30A and 30B.

FIG. 35 depicts a two bit ADC 950 that is constructed with the cells 910 of FIG. 31, wherein the output bits of the ADC 950 (where $P_1$ is a subtraction) are transmitted to a two bit DAC 960 comprising modified cells 940 of FIG. 34. It should be noted that intermediate flip flops to align the data, as shown in FIG. 8 of U.S. Pat. No. 5,202,587, have been omitted. This is because the ADC 950 transmits the data in a skewed, time delayed fashion, and the DAC 960 employs the skewed data to convert. That is, the first bit (MSB) is converted and transmitted by the ADC 950 on the first clock while the residual is passed to the next stage. On the next clock, the (MSB-1) bit is converted and transmitted, and the residual is passed to the next stage (etc.). In like manner, the DAC 960 receives the first bit (MSB) on first clock of the ADC 950, and converts same on its own associated first clock. It is noted that the ADC clock and the DAC clock are preferably made equal in frequency, but need not be equal in phase. On the second DAC clock, the result of the first conversion, and the second conversion of the ADC 950, are combined and are expressed as $V_0$. On each clock cycle, a new conversion is initiated by the MSB stages without interfering with previous conversions. That is, the ADC 950 and DAC 960 operate in a manner that is consistent with pipelined operations.

It is further noted that the interconnections 955 can be any suitable transmission line medium, and that the ADC 950 can be located at a location remote from the DAC 960.

Figure 36:
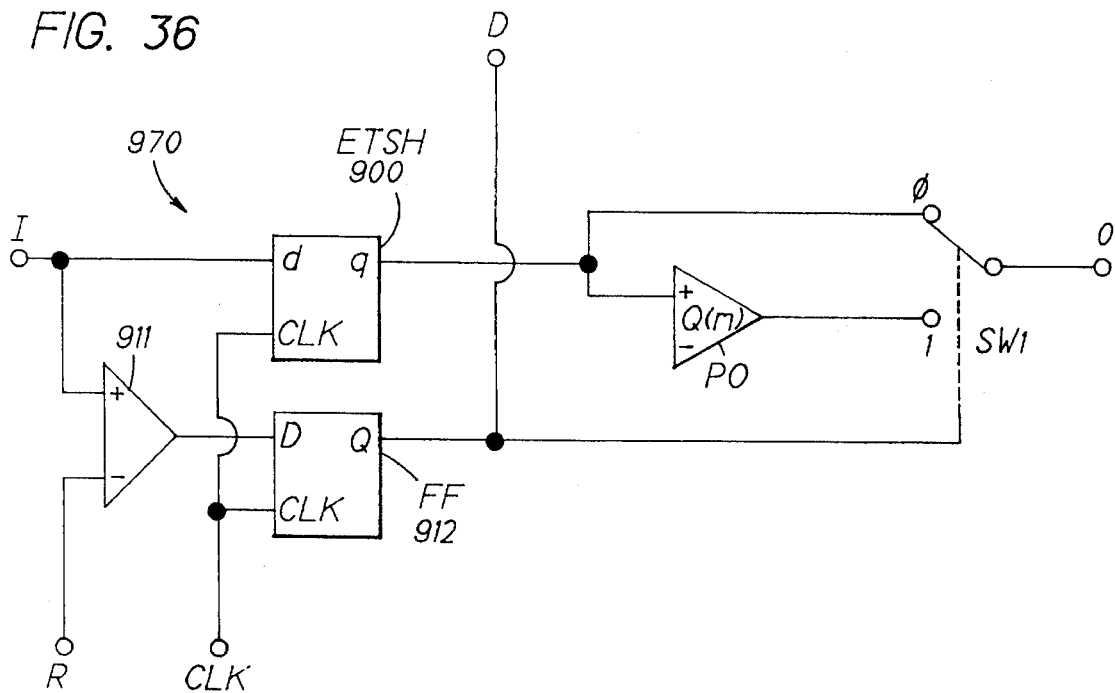
FIG. 36 is a block diagram of a synchronous logarithmic dividing (LD) cell that employs the ETSH circuit of FIGS. 30A and 30B.
Figure 37:
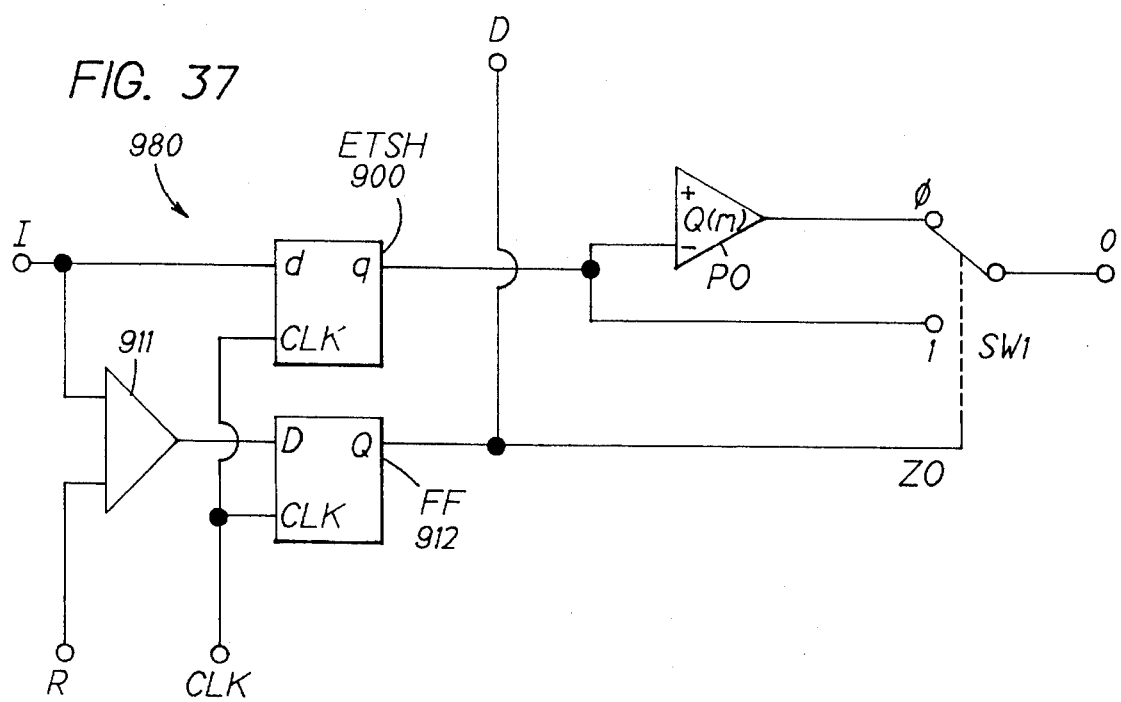
FIG. 37 is a block diagram of a synchronous logarithmic multiplying (LM) cell that employs the ETSH circuit of FIGS. 30A and 30B.

FIG. 36 depicts a synchronous logarithmic compression or dividing (LD) cell 970, while FIG. 37 depicts a synchronous logarithmic multiplying (LM) cell 980. The LD and LM cells are further (synchronous) embodiments of the LD and LM cell structures depicted in FIGS. 9A–9C of U.S. Pat. No. 5,202,687, and can be employed to construct a synchronous ADC in accordance with the embodiments shown in FIGS. 9D–9F of U.S. Pat. No. 5,202,687.

It should be noted that a logarithmic DAC function can be synthesized using a plurality of the cells 920 shown in FIG. 32. Furthermore, the synchronous ADC cells can be used in a CYCLIC manner, and require no circuitry other than a switch to select the input voltage, a clock, and a shift register to accumulate the converted bits. A cyclic compression converter can be realized in the similar manner using a divide by two compression cell, and replacing the shift register with a counter.

Figure 38:
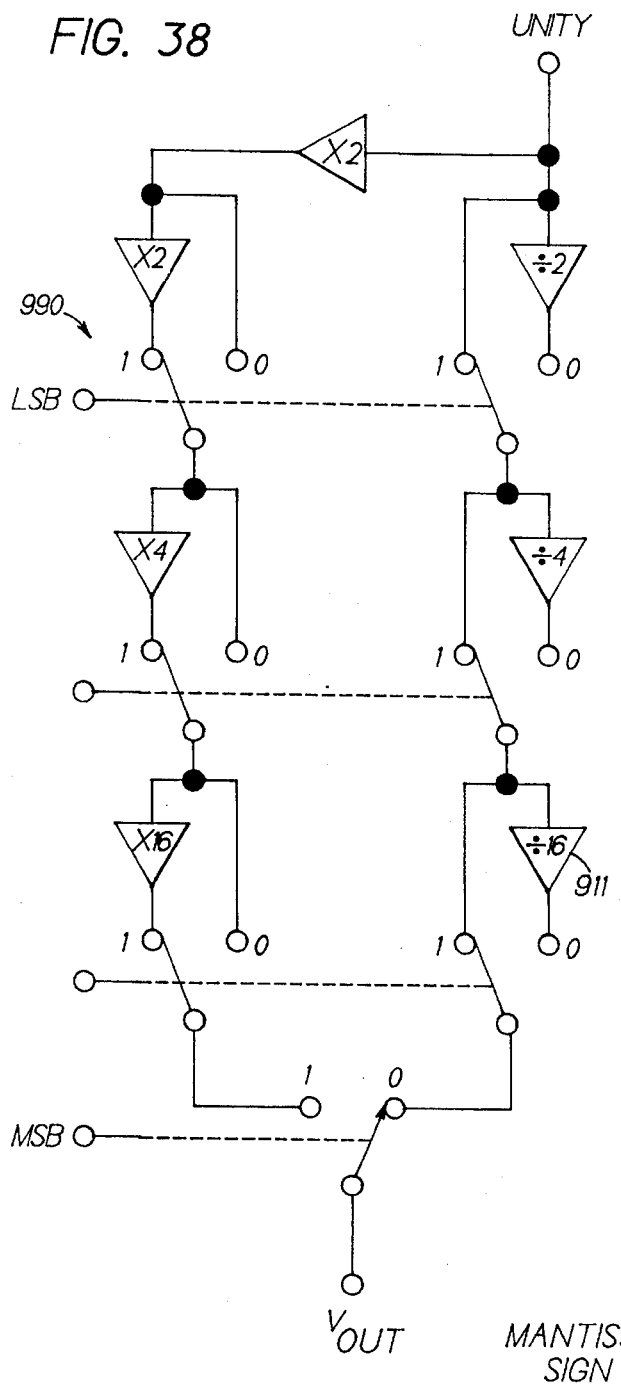
FIG. 38 is a block diagram of a four-bit logarithmic DAC.

FIG. 38 illustrates one embodiment of a 4-bit asynchronous, logarithmic DAC 990. UNITY is defined as a voltage that represents "1" in a given system. BASE is defined as 2× UNITY. The logarithmic DAC 990 produces an output voltage that is a $\log_2$ function of the UNITY input voltage, as depicted in the following Table.

TABLE

| DIGITAL INPUT | ANALOG OUTPUT |
|---|---|
| 0000 | UNITY × $2^{-7}$ |
| 0001 | UNITY × $2^{-6}$ |
| 0010 | UNITY × $2^{-5}$ |

TABLE-continued

| DIGITAL INPUT | ANALOG OUTPUT |
|---|---|
| . | . |
| . | . |
| 0111 | UNITY × $2^0$ |
| 1000 | UNITY × $2^1$ |
| . | . |
| 1111 | UNITY × $2^8$ |

If the UNITY voltage input has a constant (DC) magnitude, then the circuit functions as a $\log_2(n)$ DAC. If the UNITY voltage input is instead connected to a variable signal source, then the circuit functions in a manner analogous to a digitally controlled amplifier/attenuator. It should be realized that each of the expanding divide and expanding multiply cells of FIG. 38 can be replaced with the synchronous reverse converter cell shown in FIG. 32 to realize a synchronous logarithmic DAC.

Figure 39:
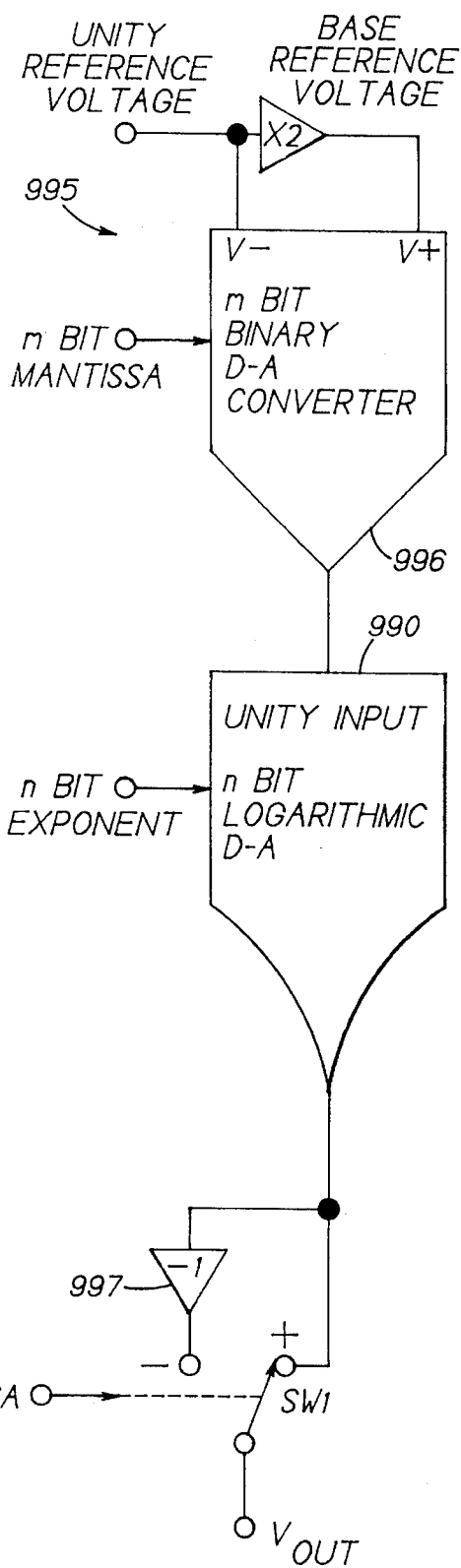
FIG. 39 is a block diagram of a floating point DAC that includes the logarithmic DAC of FIG. 38.

FIG. 39 is a block diagram of a floating point DAC 995 that employs the logarithmic DAC 990 (asynchronous or synchronous) to convert an n-bit exponent input. An m-bit (between 0 and 1) mantissa input is applied to a non-logarithmic DAC 996, which has UNITY and BASE (2×UNITY) voltages coupled thereto to set the conversion range. By example, if n-bit DAC 990 is synchronous, then DAC 996 can be constructed to be an m-bit synchronous DAC having the cells of FIG. 32, as demonstrated in FIG. 34. The output of DAC 996, which is an analog voltage having a magnitude the reflects the value of the mantissa, is applied to the UNITY input terminal of the logarithmic DAC 990. The sign of the resultant output of the logarithmic DAC 990 is selected by a mantissa sign bit, in conjunction with a switch SW1 and an analog inverter 997. The output $V_{OUT}$ has a magnitude and polarity that is a direct expression of the floating point digital input (m-bit mantissa, n-bit exponent, and sign).

It should be realized that a number of the various embodiments of network swappers that are disclosed herein, as well as the various embodiments of the ETSH, ADC and DAC cells, are amenable to fabrication upon a monolithic substrate as the Programmable Converter Array (PCA) that is illustrated in FIG. 15 of U.S. Pat. No. 5,202,687. As such, various configurations and combinations of ADCs, DACs, programmable amplifiers, programmable attenuators, programmable potentiometers, programmable reactometers and the like can be implemented by selectively providing fuseable link and/or integrated circuit mask interconnections.

Although the invention has been particularly shown and described with respect to a number of embodiments thereof, it will be understood by those skilled in the art that changes in form and detail may be made therein without departing from the scope and spirit of the invention.

What is claimed is:

1. A programmable analog multiplier, comprising:

an input port for inputting a voltage to be multiplied;

memory means comprising means for storing an n-bit voltage multiplier value; and an output port for outputting a product of a multiplication of said voltage by said voltage multiplier value; wherein said memory means is further comprised of n network stages and has an input port coupled to an input voltage attenuator path, each of said n network stages comprising a first reference input port; a second reference input port; at least one network having first and second terminals; and switching means responsive to an associated bit of said n-bit voltage multiplier value for varying a connectivity of said first and second terminals with respect to said first and second reference input ports; wherein each of said n networks is comprised of a resistance that is binarily weighted with respect to resistances of others of said n networks, and wherein said first and second reference input ports of each of said n stages, other than a most significant stage, are coupled to a preceding network stage.

2. A programmable analog multiplier as set forth in claim 1 wherein said n-bit voltage multiplier value is generated by inputting a multiplier voltage to said n network cells, and employing said n network cells to convert said multiplier voltage to said n-bit voltage multiplier value.

3. A programmable analog multiplier as set forth in claim 1 wherein said n-bit voltage multiplier value is generated by inputting said n-bit voltage multiplier value from an external circuit.

4. A system for processing an input voltage signal, comprising:

a plurality of programmable analog multipliers each of which comprises an input port for inputting a voltage signal to be multiplied; memory means comprising means for storing an n-bit voltage multiplier value; and an output port for outputting a product of a multiplication of said voltage signal by said voltage multiplier value; wherein said memory means is further comprised of n network stages and has an input port coupled to an input voltage attenuator path, each of said n network stages comprising a first reference input port; a second reference input port; at least one network having first and second terminals; and switching means responsive to an associated bit of said n-bit voltage multiplier value for varying a connectivity of said first and second terminals with respect to said first and second reference input ports; wherein each of said n networks is comprised of a resistance that is binarily weighted with respect to resistances of others of said n networks, and wherein said first and second reference input ports of each of said n stages, other than a most significant stage, are coupled to a preceding network stage; and wherein each of said plurality of said programmable analog multipliers have said output port coupled to a summation node, and further comprising a threshold comparator coupled to an output of said summation node.

\* \* \* \* \*